(12) United States Patent
Kim et al.

(10) Patent No.: US 11,830,965 B2
(45) Date of Patent: Nov. 28, 2023

(54) DISPLAY DEVICE

(71) Applicant: Samsung Display Co., LTD., Yongin-si (KR)

(72) Inventors: Hyo Joon Kim, Suwon-si (KR); Jung Hyun Kwon, Yongin-si (KR); Seon Tae Yoon, Hwaseong-si (KR); Yun Ha Ryu, Hwaseong-si (KR); Hye Seung Lee, Seoul (KR); Ki Soo Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 255 days.

(21) Appl. No.: 17/194,448

(22) Filed: Mar. 8, 2021

(65) Prior Publication Data
US 2022/0005985 A1    Jan. 6, 2022

(30) Foreign Application Priority Data

Jul. 3, 2020 (KR) .................. 10-2020-0082217

(51) Int. Cl.
  *H01L 33/50* (2010.01)
  *H10K 50/86* (2023.01)
  *H10K 59/38* (2023.01)

(52) U.S. Cl.
  CPC ......... *H01L 33/508* (2013.01); *H10K 50/865* (2023.02); *H10K 59/38* (2023.02)

(58) Field of Classification Search
  CPC ..... H01L 33/508; H01L 27/322; H01L 27/12; H01L 27/3218; H01L 27/3244;
  (Continued)

(56) References Cited

U.S. PATENT DOCUMENTS

2009/0023085 A1   1/2009  Tsuchimura
2016/0041430 A1   2/2016  Lee et al.
(Continued)

FOREIGN PATENT DOCUMENTS

EP    3543774    9/2019
EP    3671853    6/2020
(Continued)

OTHER PUBLICATIONS

Sadeghi Sadra et al., "Stokes-Shift-Engineered Indium Phosphide Quantum Dots for Efficient Luminescent Solar Concentrators", Applied Materials & Interfaces, (2018), vol. 10, pp. 12975-12982.
(Continued)

*Primary Examiner* — Matthew Mikels
*Assistant Examiner* — Jose M Diaz
(74) *Attorney, Agent, or Firm* — CANTOR COLBURN LLP

(57) ABSTRACT

A display device includes a first light emitting element which overlaps a first light emitting region, and emits first color light, a first wavelength conversion pattern which overlaps the first light emitting element, and wavelength-converts the first color light into a second color light, and a first color filter which overlaps the first wavelength conversion pattern, and includes a first light absorbing colorant and a colorant of the second color, where the colorant of the second color blocks transmission of the first color light and transmits the second color light, where the colorant of the second color transmits light in a first overlapping wavelength range in which a first emission spectrum of the first wavelength conversion pattern overlaps a first light absorption spectrum of the first wavelength conversion pattern, and where the first light absorbing colorant absorbs the light in the first overlapping wavelength range.

26 Claims, 38 Drawing Sheets

(58) Field of Classification Search
CPC ............. H01L 27/3216; H01L 51/5284; H01L 51/5281; H01L 51/5262; G02B 5/201; G02B 5/22

See application file for complete search history.

(56) References Cited

U.S. PATENT DOCUMENTS

| | | |
|---|---|---|
| 2018/0197921 A1 | 7/2018 | Kim et al. |
| 2019/0293990 A1* | 9/2019 | Kwon ................... H01L 27/322 |
| 2020/0103709 A1 | 4/2020 | Madigan et al. |

FOREIGN PATENT DOCUMENTS

| | | |
|---|---|---|
| GB | 2404276 | 1/2005 |
| JP | 2012119331 | 6/2012 |
| KR | 1020150076652 | 7/2015 |
| KR | 1020180064616 | 6/2018 |
| KR | 1020180068416 | 6/2018 |
| KR | 1020180079572 | 7/2018 |
| KR | 1020190043189 | 4/2019 |
| KR | 1020190069285 | 6/2019 |

OTHER PUBLICATIONS

Extended European Search Report-European Application No. 21178421.0 dated Dec. 12, 2021.

\* cited by examiner

FIG. 1
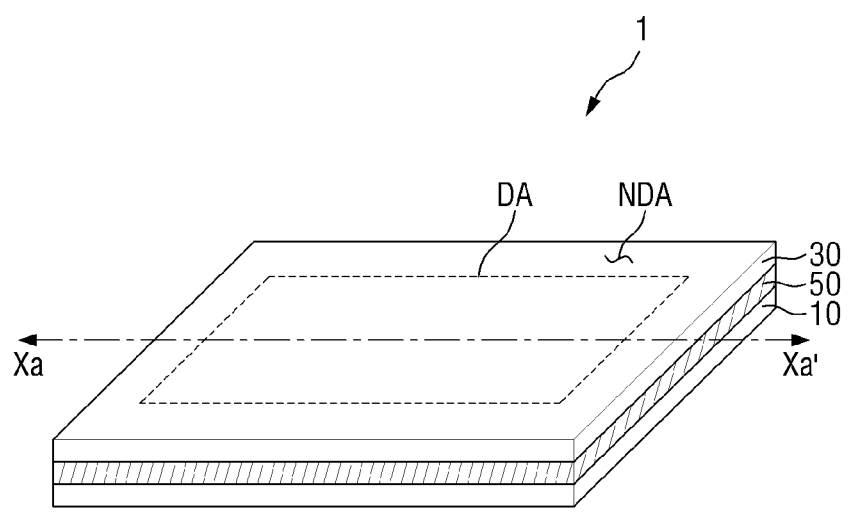
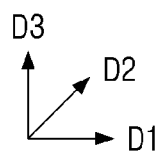

DISPLAY DEVICE

This application claims priority to Korean Patent Application No. 10-2020-0082217, filed on Jul. 3, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

Display devices are becoming increasingly important with a development of multimedia. Accordingly, various display devices such as liquid crystal display devices and organic light emitting diode display devices are being developed.

Of the display devices, self-light emitting display devices include a self-light emitting element such as an organic light emitting diode. The self-light emitting element may include two electrodes facing each other and a light emitting layer interposed between the two electrodes. When the self-light emitting element is the organic light emitting diode, electrons and holes provided from the two electrodes may be recombined in the light emitting layer to generate excitons. As the generated excitons change from an excited state to a ground state, light may be emitted.

Since the self-light emitting display devices do not need a light source such as a backlight unit, they may consume low power, be made lightweight and thin, and have a wide viewing angle, high luminance and contrast and fast response speed. Due to these high-quality characteristics, the self-light emitting display devices are drawing attention as next-generation display devices.

As one way to make each pixel of a display device uniquely display one primary color, a color conversion pattern or a wavelength conversion pattern may be placed in each pixel on a light path extending from a light source to a viewer.

SUMMARY

Features of the invention provide a display device having improved display quality.

However, features of the invention are not restricted to the one set forth herein. The above and other features of the invention will become more apparent to one of ordinary skill in the art to which the disclosure pertains by referencing the detailed description of the disclosure given below.

An embodiment of a display device includes a base which includes a first light emitting region, a first light emitting element which is disposed on the base, overlaps the first light emitting region, and emits light of a first color, a first wavelength conversion pattern which is disposed on the first light emitting element, overlaps the first light emitting element, and wavelength-converts the light of the first color into light of a second color, and a first color filter which is disposed on the first wavelength conversion pattern, overlaps the first wavelength conversion pattern, and includes a first light absorbing colorant and a colorant of the second color, where the colorant of the second color blocks transmission of the light of the first color and transmits the light of the second color, where the colorant of the second color transmits light in a first overlapping wavelength range in which a first emission spectrum of the first wavelength conversion pattern overlaps a first light absorption spectrum of the first wavelength conversion pattern, and, where the first light absorbing colorant absorbs the light in the first overlapping wavelength range.

An embodiment of a display device includes a base which includes a first light emitting region, a first light emitting element which is disposed on the base, overlaps the first light emitting region, and emits light of a first color, a first wavelength conversion pattern which is disposed on the first light emitting element, overlaps the first light emitting element, and comprises a first wavelength shifter wavelength-converting the light of the first color into light of a second color, a first color filter which is disposed on the first wavelength conversion pattern, overlaps the first wavelength conversion pattern and comprises a colorant of the second color blocking transmission of the light of the first color and transmitting the light of the second color, and a first light absorbing layer which is disposed on the first wavelength conversion pattern, overlaps the first color filter, and comprises a first light absorbing colorant, where the colorant of the second color transmits light in a first overlapping wavelength range in which a first emission spectrum of the first wavelength conversion pattern overlaps a first light absorption spectrum of the first wavelength conversion pattern, and where the first light absorbing colorant absorbs the light in the first overlapping wavelength range.

BRIEF DESCRIPTION OF THE DRAWINGS

These and/or other embodiments, features and advantages will become apparent and more readily appreciated from the following description of the embodiments, taken in conjunction with the accompanying drawings in which:

FIG. 1 is a perspective view of an embodiment of a display device;

DETAILED DESCRIPTION

Figure 2:
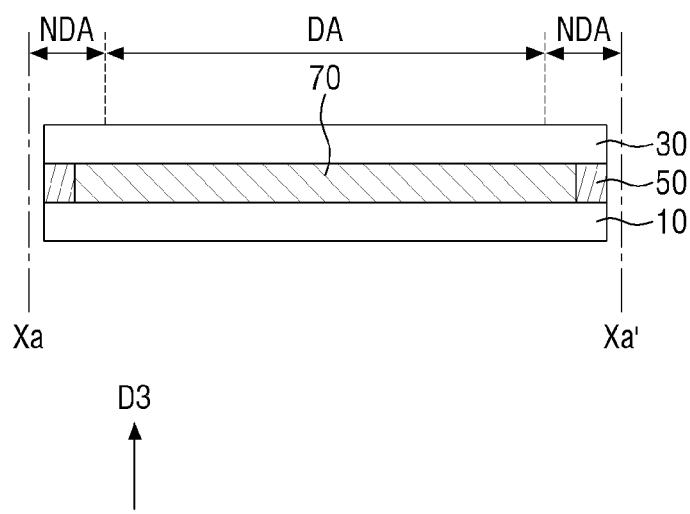
FIG. 2 is a schematic cross-sectional view of the display device, taken along line Xa-Xa' of FIG. 1.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "on", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments are described herein with reference to plan and cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Thus, the regions illustrated in the drawing figures are schematic in nature and their shapes are not intended to illustrate the actual shape of a region of a device and are not intended to limit the scope of the invention.

Hereinafter, embodiments of the invention will be described with reference to the attached drawings.

FIG. 1 is a schematic perspective view of an embodiment of a display device 1. FIG. 2 is a schematic cross-sectional view of the display device 1 in the embodiment, taken along line Xa-Xa' of FIG. 1.

Referring to FIGS. 1 and 2, the display device 1 may be applied to various electronic devices including small and medium-sized electronic devices such as tablet personal computers ("PCs"), smartphones, car navigation units, cameras, center information displays ("CIDs") provided in cars, wristwatch-type electronic devices, personal digital assistants ("PDAs"), portable multimedia players ("PMPs") and game machines and medium and large-sized electronic devices such as televisions, external billboards, monitors, PCs, and notebook computers. However, these are just examples, and it is obvious that the display device 1 may also be employed in other electronic devices without departing from the concept of the invention.

In some embodiments, the display device 1 may be quadrangular (e.g., rectangular) in a plan view. The display device 1 may include two first sides extending in a first direction D1 and two second sides extending in a second direction D2 intersecting the first direction D1. Corners at which the first and second sides of the display device 1 meet may be right-angled. However, the invention is not limited thereto, and the corners may also be curved. In some embodiments, lengths of the first sides may be different from lengths of the second sides, but the invention is not limited thereto. The planar shape of the display device 1 is not limited to the above embodiment and may also be various other shapes such as a circular shape.

The display device 1 may include a display area DA which displays an image and a non-display area NDA which does not display an image. In some embodiments, the non-display area NDA may be disposed around the display area DA and may surround the display area DA.

Unless otherwise defined, the terms "on," "upper," "above," "top," and "upper surface" used herein denote a direction in which an arrow in a third direction D3 intersecting the first direction D1 and the second direction D2 points in the drawings, and the terms "under," "lower," "below;" "bottom," and "lower surface" used herein denote a direction opposite to the direction in which the arrow in the third direction D3 points in the drawings.

As for the schematic stacked structure of the display device 1, in some embodiments, the display device 1 includes a display substrate 10 and a color conversion substrate 30 facing the display substrate 10 and may further include a sealing member 50 bonding the display substrate 10 and the color conversion substrate 30 and a filler 70 filling a space between the display substrate 10 and the color conversion substrate 30.

The display substrate 10 may include elements and circuits (e.g., pixel circuits such as switching elements) for displaying an image, a pixel defining layer defining a light emitting region and a non-light emitting region in the display area DA, and a self-light emitting element. In an embodiment, the self-light emitting element may include at least one of an organic light emitting diode, a quantum dot light emitting diode, an inorganic material-based micro light emitting diode (e.g., a micro "LED"), and an inorganic material-based nano LED. For ease of description, the self-light emitting element will be described below as an organic light emitting diode.

The color conversion substrate 30 may be disposed on the display substrate 10 and may face the display substrate 10. In some embodiments, the color conversion substrate 30 may include a color conversion pattern that converts the color of incident light. In some embodiments, the color conversion pattern may include at least any one of a color filter and a wavelength conversion pattern.

The sealing member 50 may be disposed between the display substrate 10 and the color conversion substrate 30 in the non-display area NDA. The sealing member 50 may be disposed in the non-display area NDA along edges of the display substrate 10 and the color conversion substrate 30 to surround the display area DA in a plan view. The display substrate 10 and the color conversion substrate 30 may be bonded to each other by the sealing member 50.

In some embodiments, the sealing member 50 may include an organic material. In an embodiment, the sealing member 50 may include, but not limited to, epoxy resin, for example.

The filler 70 may be disposed in the space between the display substrate 10 and the color conversion substrate 30 and surrounded by the sealing member 50. The filler 70 may fill the space between the display substrate 10 and the color conversion substrate 30.

In some embodiments, the filler 70 may include a material capable of transmitting light. In some embodiments, the filler 70 may include an organic material. In an embodiment, the filler 70 may include a silicon-based organic material or an epoxy-based organic material, for example, but the invention is not limited thereto. In an embodiment, the filler 70 may be omitted.

However, the invention is not limited to the above description. In an embodiment, the color conversion pattern may be disposed directly on the display substrate 10 or may be included in the display substrate 10. In this case, the sealing member 50 and the filler 70 described above may be omitted. A case where the display device 1 includes the display substrate 10 and the color conversion substrate 30 will be described below as an example, but the invention is not limited thereto.

Figure 3:
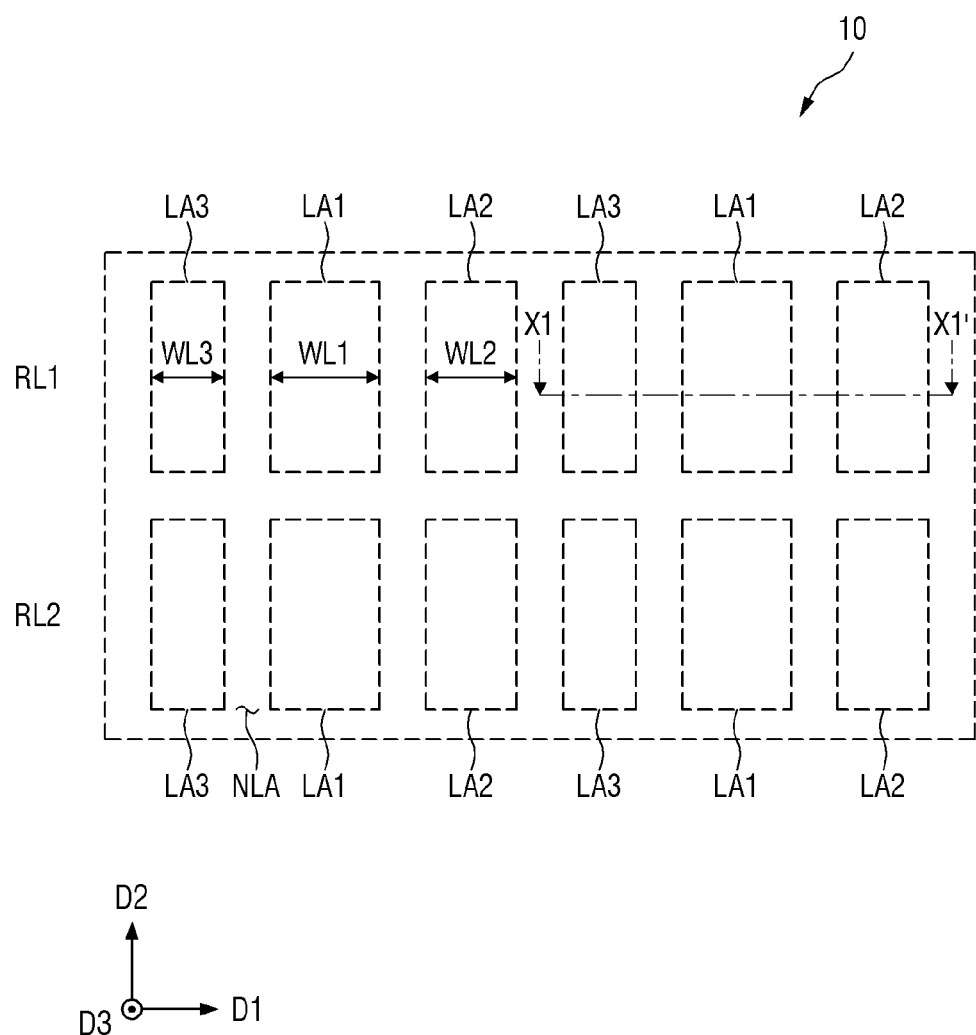
FIG. 3 is a schematic plan view of a display substrate in a display area of the display device illustrated in FIGS. 1 and 2.
Figure 4:
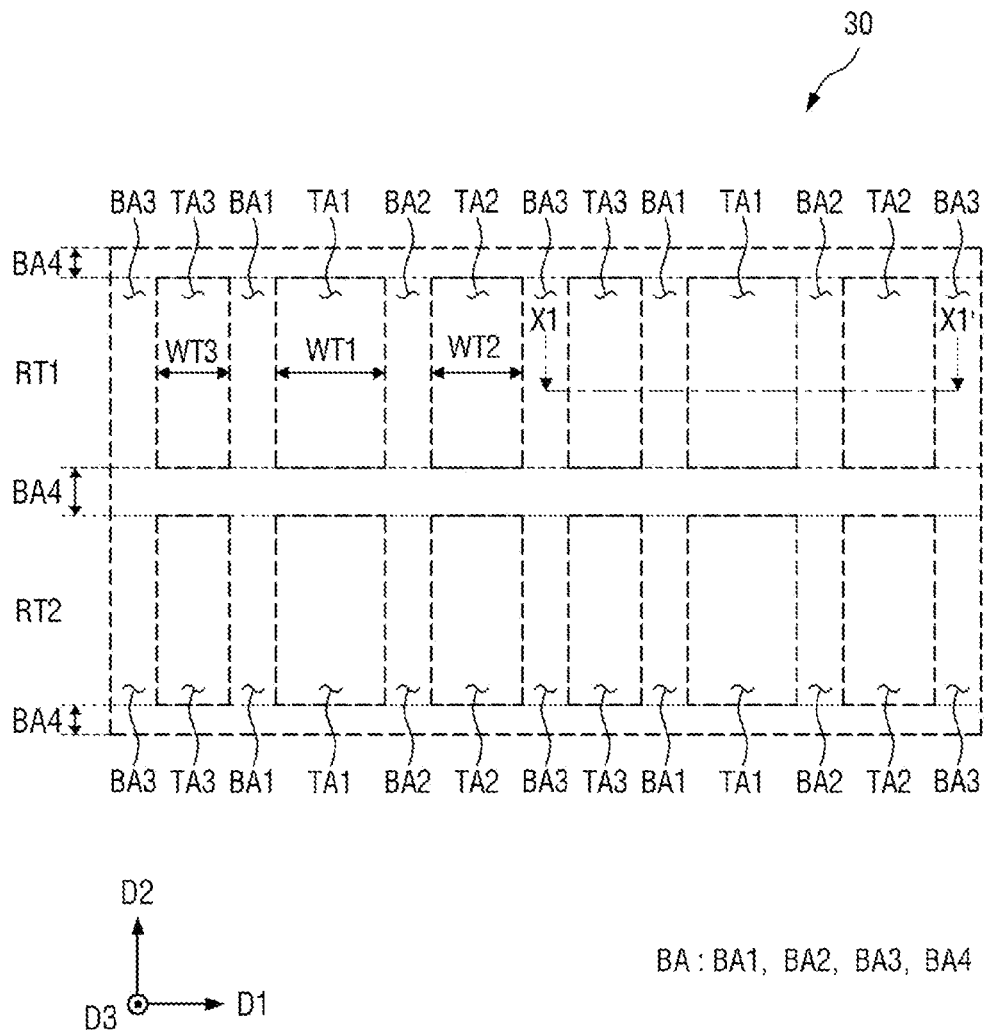
FIG. 4 is a schematic plan view of a color conversion substrate in the display area of the display device illustrated in FIGS. 1 and 2.

FIG. 3 is a schematic plan view of the display substrate 10 in the display area DA of the display device 1 illustrated in FIGS. 1 and 2. FIG. 4 is a schematic plan view of the color conversion substrate 30 in the display area DA of the display device 1 illustrated in FIGS. 1 and 2.

Referring to FIGS. 3 and 4 in addition to FIGS. 1 and 2, a plurality of light emitting regions LA1 through LA3 and a non-light emitting region NLA may be defined in the display substrate 10 in the display area DA. Each of the light emitting regions LA1 through LA3 may be a region where light generated by a light emitting element of the display substrate 10 is emitted out of the display substrate 10, and the non-light emitting region NLA may be a region where light is not emitted out of the display substrate 10.

In some embodiments, light provided from the display substrate 10 in each of the light emitting regions LA1 through LA3 to the color conversion substrate 30 may be light of a first color. In some embodiments, the light of the first color may be blue light and may have a peak wavelength in the range of about 440 nanometers (nm) to about 480 nm. The peak wavelength may refer to a wavelength at which intensity is maximum in a wavelength region.

In some embodiments, a first light emitting region LA1, a second light emitting region LA2, and a third light emitting region LA3 may be sequentially and repeatedly disposed along the first direction D1 in a first row RL1 of the display substrate 10 in the display area DA. In addition, the first light emitting region LA1, the second light emitting region LA2, and the third light emitting region LA3 may be sequentially and repeatedly disposed along the first direction D1 in a second row RL2 adjacent to the first row RL1 along the second direction D2.

In some embodiments, a first width WL1 of the first light emitting region LA1 measured along the first direction D1 may be greater than a second width WL2 of the second light emitting region LA2 and a third width WL3 of the third light emitting region LA3 measured along the first direction D1. In some embodiments, the second width WL2 of the second light emitting region LA2 and the third width WL3 of the third light emitting region LA3 may be different from each other. In an embodiment, the second width WL2 of the second light emitting region LA2 may be greater than the third width WL3 of the third light emitting region LA3, for example. In addition, in some embodiments, the area of the first light emitting region LA1 may be larger than the area of the second light emitting region LA2 and the area of the third light emitting region LA3. The area of the second light emitting region LA2 may be larger than the area of the third light emitting region LA3 or may be smaller than the area of the third light emitting region LA3. However, the invention is not limited to the above embodiment. In an embodiment, the first width WL1 of the first light emitting region LA1 measured along the first direction D1 may be substantially equal to the second width WL2 of the second light emitting region LA2 and the third width WL3 of the third light emitting region LA3 measured along the first direction D1. In an embodiment, the area of the first light emitting region LA1, the area of the second light emitting region LA2, and the area of the third light emitting region LA3 may be substantially equal.

A plurality of light transmitting regions TA1 through TA3 and a light blocking region BA may be defined in the color conversion substrate 30 in the display area DA. Each of the light transmitting regions TA1 through TA3 may be a region where light emitted from the display substrate 10 is transmitted through the color conversion substrate 30 and provided to the outside of the display device 1. The light blocking region BA may be a region through which light emitted from the display substrate 10 is not transmitted.

In some embodiments, a first light transmitting region TA1, a second light transmitting region TA2 and a third light transmitting region TA3 may be sequentially and repeatedly disposed along the first direction D1 in a first row RT1 of the color conversion substrate 30 in the display area DA. The first light transmitting region TA1 may correspond to the first light emitting region LA1 or may overlap the first light emitting region LA1. Similarly, the second light transmitting region TA2 may correspond to or overlap the second light emitting region LA2, and the third light transmitting region TA3 may correspond to or overlap the third light emitting region LA3.

In some embodiments, light of the first color provided by the display substrate 10 may be emitted out of the display device 1 through the first light transmitting region TA1, the second light transmitting region TA2, and the third light transmitting region TA3. When light emitted out of the display device 1 in the first light transmitting region TA1 is referred to as first output light, light emitted out of the display device 1 in the second light transmitting region TA2 is referred to as second output light, and light emitted out of the display device 1 in the third light transmitting region TA3 is referred to as third output light, the first output light may be light of the first color, the second output light may be light of a second color different from the first color, and the third output light may be light of a third color different from the first color and the second color. In some embodiments, the light of the first color may be blue light having a peak wavelength in the range of about 440 nm to about 480 nm as described above, and the light of the second color may be red light having a peak wavelength in the range of about 610 nm to about 650 nm. In addition, the light of the third color may be green light having a peak wavelength in the range of about 530 nm to about 570 nm. However, the invention is not limited thereto. The light of the second color may also be green light, and the light of the third color may also be red light.

The first light transmitting region TA1, the second light transmitting region TA2 and the third light transmitting region TA3 may also be sequentially and repeatedly disposed along the first direction D1 in a second row RT2 adjacent to the first row RT1 along the second direction D2.

Similarly to the first light emitting region LA1, the second light emitting region LA2 and the third light emitting region LA3, in some embodiments, a first width WT1 of the first light transmitting region TA1 measured along the first direction D1 may be greater than a second width WT2 of the second light transmitting region TA2 and a third width WT3 of the third light transmitting region TA3 measured along the first direction D1. In some embodiments, the second width WT2 of the second light transmitting region TA2 and the third width WT3 of the third light transmitting region TA3 may be different from each other. In an embodiment, the second width WT2 of the second light transmitting region TA2 may be greater than the third width WT3 of the third light transmitting region TA3 or may be smaller than the third width WT3 of the third light transmitting region TA3, for example. In addition, in some embodiments, the area of the first light transmitting region TA1 may be larger than the area of the second light transmitting region TA2 and the area of the third light transmitting region TA3 or may be larger or smaller than the area of the second light transmitting region TA2 and the area of the third light transmitting region TA3.

However, the invention is not limited to the above embodiment. In an embodiment, the first width WT1 of the first light transmitting region TA1 measured along the first direction D1 may be substantially equal to the second width WT2 of the second light transmitting region TA2 and the third width WT3 of the third light transmitting region TA3 measured along the first direction D1. In an embodiment, the area of the first light transmitting region TA1 may be substantially equal to the area of the second light transmitting region TA2 and the area of the third light transmitting region TA3.

The light blocking region BA may be disposed around the light transmitting regions TA1 through TA3 of the color conversion substrate 30 in the display area DA. In some embodiments, the light blocking region BA may be divided into a first light blocking region BA1, a second light blocking region BA2, a third light blocking region BA3, and a fourth light blocking region BA4.

The first light blocking region BA1 may be disposed between the third light transmitting region TA3 and the first light transmitting region TA1 along the first direction D1, the second light blocking region BA2 may be disposed between the first light transmitting region TA1 and the second light transmitting region TA2 along the first direction D1, and the third light blocking region BA3 may be disposed between the second light transmitting region TA2 and the third light transmitting region TA3 along the first direction D1.

The fourth light blocking region BA4 may be disposed between the first row RT1 and the second row RT2 adjacent to each other along the second direction D2.

The structure of the display device 1 will now be described in more detail.

Figure 5:
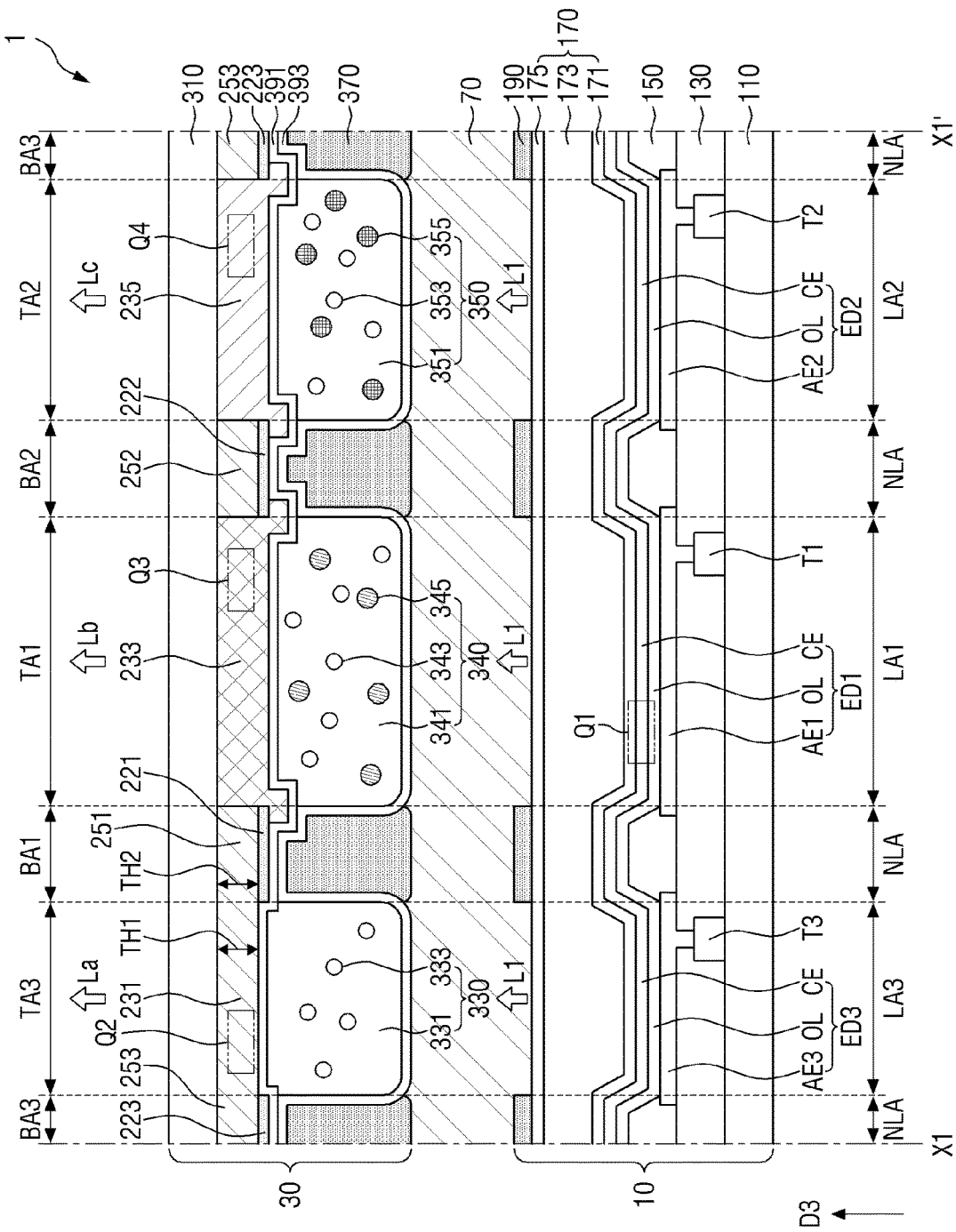
FIG. 5 is a cross-sectional view of an embodiment of the display device, taken along line X1-X1' of FIGS. 3 and 4.
Figure 6:
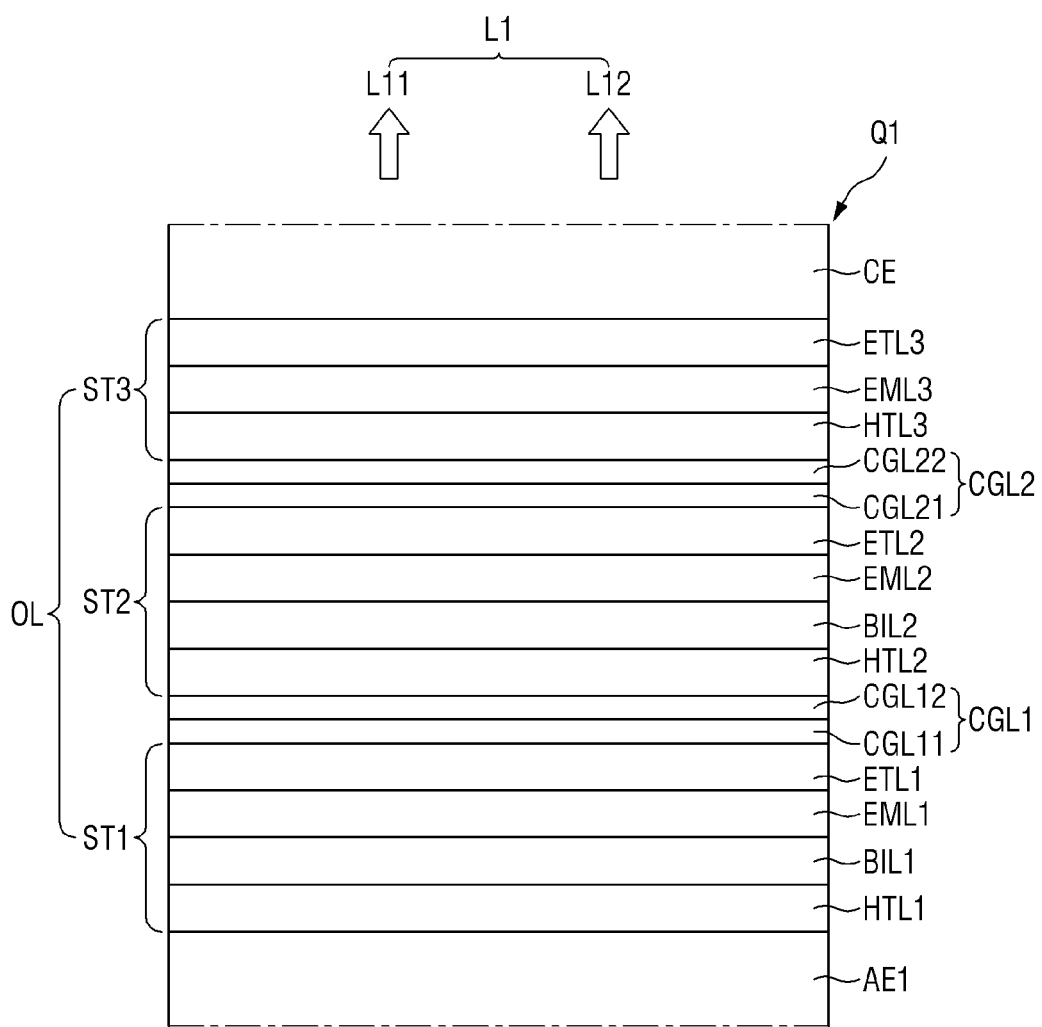
FIG. 6 is an enlarged cross-sectional view of part Q1 of FIG. 5.
Figure 7:
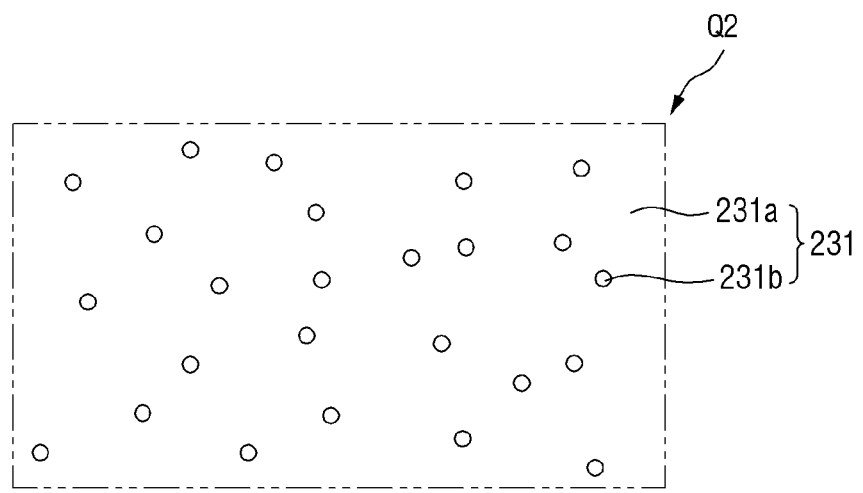
FIG. 7 is an enlarged cross-sectional view of part Q2 of FIG. 5.
Figure 8:
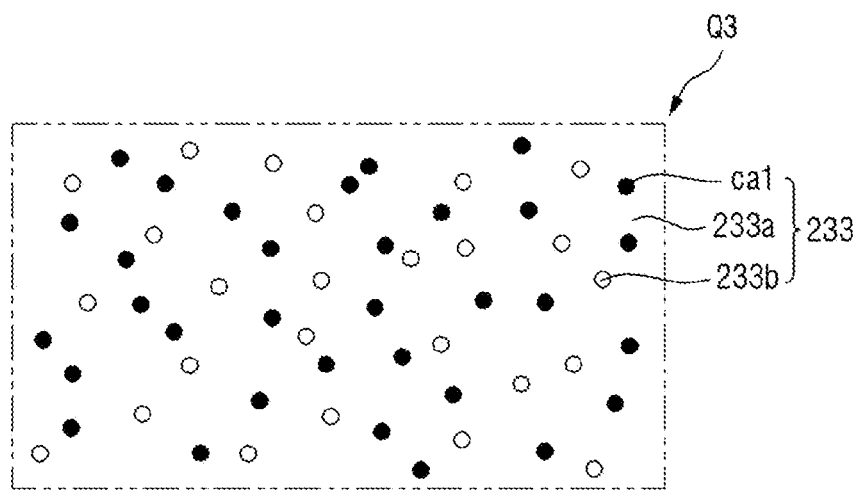
FIG. 8 is an enlarged cross-sectional view of part Q3 of FIG. 5.
Figure 9:
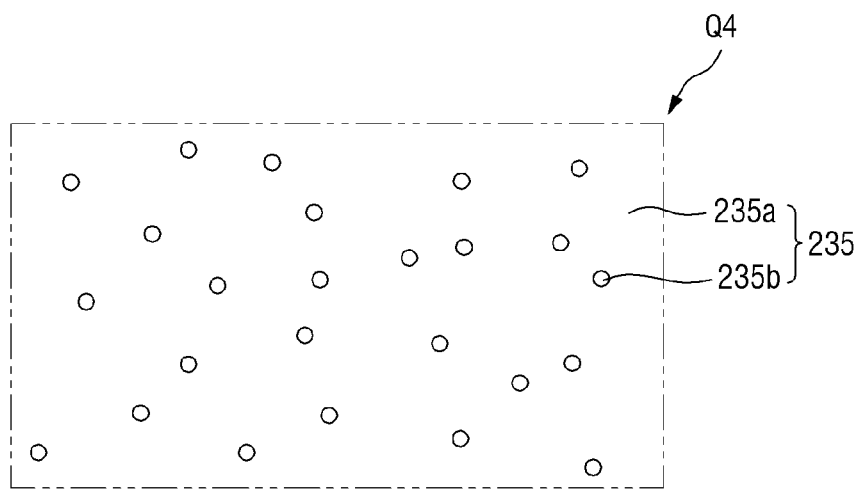
FIG. 9 is an enlarged cross-sectional view of part Q4 of FIG. 5.

FIG. 5 is a cross-sectional view of an embodiment of the display device 1, taken along line X1-X1' of FIGS. 3 and 4. FIG. 6 is an enlarged cross-sectional view of part Q1 of FIG. 5. FIG. 7 is an enlarged cross-sectional view of part Q2 of FIG. 5. FIG. 8 is an enlarged cross-sectional view of part Q3 of FIG. 5. FIG. 9 is an enlarged cross-sectional view of part Q4 of FIG. 5. For reference, the position of line X1-X1' of FIG. 3 is the same as the position of line X1-X1' of FIG. 4.

Referring to FIGS. 5 through 9 in addition to FIGS. 3 and 4, the display device 1 may include the display substrate 10 and the color conversion substrate 30 as described above and may further include the filler 70 disposed between the display substrate 10 and the color conversion substrate 30.

The display substrate 10 will now be described in more detail.

A first base 110 may include a light transmitting material. In some embodiments, the first base 110 may be a glass substrate or a plastic substrate. When the first base 110 is a plastic substrate, it may have flexibility. In some embodiments, the first base 110 may further include a separate layer disposed on the glass substrate or the plastic substrate, for example, a buffer layer or an insulating layer.

In some embodiments, the light emitting regions LA1 through LA3 and the non-light emitting region NLA may be defined in the first base 110 as described above with reference to FIGS. 3 and 4.

As illustrated in FIG. 5, switching elements T1 through T3 may be disposed on the first base 110. In some embodiments, a first switching element T1 may be disposed in the first light emitting region LAL a second switching element T2 may be disposed in the second light emitting region LA2, and a third switching element T3 may be disposed in the third light emitting region LA3. However, the invention is not limited thereto. In an embodiment, at least any one of the first switching element T1, the second switching element T2, and the third switching element T3 may be disposed in the non-light emitting region NLA.

In some embodiments, each of the first switching element T1, the second switching element T2, and the third switching element T3 may be a thin-film transistor including polysilicon or a thin-film transistor including an oxide semiconductor.

Although not illustrated in the drawing, a plurality of signal lines (e.g., gate lines, data lines, and power lines) for transmitting signals to each switching element may be further disposed on the first base 110.

An insulating layer 130 may be disposed on the first switching element T1, the second switching element T2, and the third switching element T3. In some embodiments, the insulating layer 130 may be a planarization layer. In some embodiments, the insulating layer 130 may include an organic layer. In an embodiment, the insulating layer 130 may include acrylic resin, epoxy resin, imide resin, or ester resin, for example. In some embodiments, the insulating layer 130 may include a positive photosensitive material or a negative photosensitive material.

As illustrated in FIG. 5, a first anode AE1, a second anode AE2, and a third anode AE3 may be disposed on the insulating layer 130. The first anode AE1 may overlap the first light emitting region LAL and at least a portion of the first anode AE1 may extend to the non-light emitting region NLA. The second anode AE2 may overlap the second light emitting region LA2, and at least a portion of the second anode AE2 may extend to the non-light emitting region NLA. The third anode AE3 may overlap the third light emitting region LA3, and at least a portion of the third anode AE3 may extend to the non-light emitting region NLA. The first anode AE1 may penetrate the insulating layer 130 and may be connected to the first switching element T1, the second anode AE2 may penetrate the insulating layer 130 and may be connected to the second switching element T2, and the third anode AE3 may penetrate the insulating layer 130 and may be connected to the third switching element T3.

In some embodiments, the first anode AE1, the second anode AE2, and the third anode AE3 may be different from each other in width or area. In an embodiment, a width of the first anode AE1 may be greater than a width of the second anode AE2 and a width of the third anode AE3, and the width of the third anode AE3 may be smaller than the width of the second anode AE2, for example. In an alternative embodiment, the area of the first anode AE1 may be larger than the area of the second anode AE2 and the area of the third anode AE3, and the area of the third anode AE3 may be smaller than the area of the second anode AE2. However, the invention is not limited to the above embodiment. In an embodiment, the first anode AE1, the second anode AE2, and the third anode AE3 may be substantially the same in width or area.

The first anode AE1, the second anode AE2, and the third anode AE3 may be reflective electrodes. In this case, each of the first anode AE1, the second anode AE2, and the third anode AE3 may be a metal layer including a metal such as Ag, Mg, Al, Pt, Pd, Au, Ni, Nd, Ir, or Cr. In an embodiment, each of the first anode AE1, the second anode AE2, and the third anode AE3 may further include a metal oxide layer stacked on the metal layer. In an embodiment, each of the first anode AE1, the second anode AE2, and the third anode AE3 may have a multilayer structure such as a two-layer structure of indium tin oxide ("ITO")/Ag, Ag/ITO, ITO/Mg or ITO/MgF or a three-layer structure of ITO/Ag/ITO.

A pixel defining layer 150 may be disposed on the first anode AE1, the second anode AE2, and the third anode AE3. An opening exposing the first anode AE1, an opening exposing the second anode AE2 and an opening exposing the third anode AE3 may be defined in the pixel defining layer 150 and may define the first light emitting region LA1, the second light emitting region LA2, the third light emitting region LA3 and the non-light emitting region NLA. That is, a region of the first anode AE1 which is exposed without being covered by the pixel defining layer 150 may be the first light emitting region LA1. Similarly, a region of the second anode AE2 which is exposed without being covered by the pixel defining layer 150 may be the second light emitting region LA2, and a region of the third anode AE3 which is exposed without being covered by the pixel defining layer 150 may be the third light emitting region LA3. In addition, a region where the pixel defining layer 150 is disposed may be the non-light emitting region NLA.

In some embodiments, the pixel defining layer 150 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene ("BCB").

In some embodiments, the pixel defining layer 150 may overlap a color pattern 250 (refer to FIG. 10) and a light blocking member 220 (refer to FIG. 11) to be described later. In an embodiment, as illustrated in FIG. 5, the pixel defining layer 150 may overlap a first light blocking member 221, a second light blocking member 222, and a third light blocking member 223, for example. In addition, the pixel defining layer 150 may overlap a first color pattern 251, a second color pattern 252, and a third color pattern 253.

The pixel defining layer 150 may overlap a color mixing preventing member 370 to be described later.

As illustrated in FIG. 5, a light emitting layer OL may be disposed on the first anode AE1, the second anode AE2, and the third anode AE3.

In some embodiments, the light emitting layer OL may be in the shape of a continuous layer disposed over the light emitting regions LA1 through LA3 and the non-light emitting region NLA. The light emitting layer OL will be described in more detail later.

As illustrated in FIG. 5, a cathode CE may be disposed on the light emitting layer OL.

In some embodiments, the cathode CE may have translucency or transparency. When the cathode CE has translucency, the cathode CE may include Ag, Mg, Cu, Al, Pt, Pd, Au, Ni, Nd, Ir, Cr, Li, Ca, LiF/Ca, LiF/Al, Mo, Ti, or a compound or combination of the same (e.g., a combination of Ag and Mg). In addition, when a thickness of the cathode CE is tens to hundreds of angstroms, the cathode CE may have translucency.

When the cathode CE has transparency, the cathode CE may include a transparent conductive oxide ("TCO"). In an embodiment, the cathode CE may include tungsten oxide ($WxOy$), titanium oxide ($TiO_2$), ITO, indium zinc oxide ("IZO"), zinc oxide (ZnO), indium tin zinc oxide ("ITZO"), or magnesium oxide (MgO), for example.

The first anode AE1, the light emitting layer OL and the cathode CE may constitute a first light emitting element ED1, the second anode AE2, the light emitting layer OL and the cathode CE may constitute a second light emitting element ED2, and the third anode AE3, the light emitting layer OL and the cathode CE may constitute a third light emitting element ED3. Each of the first light emitting element ED1, the second light emitting element ED2, and the third light emitting element ED3 may emit output light L1, and the output light L1 may be provided to the color conversion substrate 30.

As illustrated in FIG. 6, the output light L1 finally emitted from the light emitting layer OL may be a combination of a first light component L11 and a second light component L12. Each of the first light component L11 and the second light component L12 in the output light L1 may have a peak wavelength of about 440 nm to less than about 480 nm. That is, the output light L1 may be blue light.

In some embodiments, the light emitting layer OL may have a structure in which a plurality of light emitting layers overlap, for example, may have a tandem structure. In an embodiment, the light emitting layer OL may include a first stack ST1 including a first light emitting layer EML1, a second stack ST2 disposed on the first stack ST1 and including a second light emitting layer EML2, a third stack ST3 disposed on the second stack ST2 and including a third light emitting layer EML3, a first charge generation layer CGL1 disposed between the first stack ST1 and the second stack ST2, and a second charge generation layer CGL2 disposed between the second stack ST2 and the third stack ST3, for example. The first stack ST1, the second stack ST2, and the third stack ST3 may overlap each other.

The first light emitting layer EML1, the second light emitting layer EML2, and the third light emitting layer EML3 may overlap each other.

In some embodiments, the first light emitting layer EML1, the second light emitting layer EML2 and the third light emitting layer EML3 may all emit light of the first color, for example, blue light. In an embodiment, each of the first light emitting layer EML1, the second light emitting layer EML2 and the third light emitting layer EML3 may be a blue light emitting layer and may include an organic material, for example.

In some embodiments, at least any one of the first light emitting layer EML1, the second light emitting layer EML2 and the third light emitting layer EML3 may emit first blue light having a first peak wavelength, and at least another one of the first light emitting layer EML1, the second light emitting layer EML2 and the third light emitting layer EML3 may emit second blue light having a second peak wavelength different from the first peak wavelength. In an embodiment, any one of the first light emitting layer EML1, the second light emitting layer EML2 and the third light emitting layer EML3 may emit the first blue light having the first peak wavelength, and the other two of the first light emitting layer EML1, the second light emitting layer EML2 and the third light emitting layer EML3 may emit the second blue light having the second peak wavelength, for example. That is, the output light L1 finally emitted from the light emitting layer OL may be a combination of the first light component L11 and the second light component L12, the first light component L11 may be the first blue light having the first peak wavelength, and the second light component L12 may be the second blue light having the second peak wavelength.

In some embodiments, any one of the first peak wavelength and the second peak wavelength may be in the range of about 440 nm to less than about 460 nm. The other one of the first peak wavelength and the second peak wavelength may be in the range of about 460 nm to about 480 nm. However, the range of the first peak wavelength and the range of the second peak wavelength are not limited to this example. In an embodiment, the range of the first peak wavelength and the range of the second peak wavelength may all include about 460 nm, for example. In some embodiments, any one of the first blue light and the second blue light may be light of a deep blue color, and the other one of the first blue light and the second blue light may be light of a sky blue color.

According to some embodiments, the output light L1 emitted from the light emitting layer OL is blue light and includes a long wavelength component and a short wavelength component. Therefore, the light emitting layer OL may finally emit blue light having a broader emission peak as the output light L1, thereby improving color visibility at a side viewing angle compared with a conventional light emitting element that emits blue light having a sharp emission peak.

In some embodiments, each of the first light emitting layer EML1, the second light emitting layer EML2 and the third light emitting layer EML3 may include a host and a dopant. The host is not particularly limited as long as it is a commonly used material. In an embodiment, tris(8-hydroxyquinolino)aluminum (Alq3), 4,4'-bis(N-carbazolyl)-1,1'-biphenyl ("CBP"), poly(n-vinylcabazole) ("PVK"), 9,10-di(naphthalene-2-yl)anthracene ("ADN"), 4,4',4"-tris(carbazol-9-yl)-triphenylamine ("TCTA"), 1,3,5-tris(N-phenylbenzimidazole-2-yl)benzene (TPBi), 3-tert-butyl-9,10-di(naphth-2-yl)anthracene ("TBADN"), distyrylarylene ("DSA"), 4,4'-bis(9-carbazolyl)-2,2'-dimethyl-biphenyl ("CDBP"), or 2-methyl-9,10-bis(naphthalen-2-yl)anthracene) ("MADN") may be used, for example.

In an embodiment, each of the first light emitting layer EML1, the second light emitting layer EML2 and the third light emitting layer EML3 which emit blue light may include, for example, a fluorescent material including any one of Spiro-DPVBi, spiro-6P, distyryl-benzene ("DSB"), distyryl-arylene ("DSA"), a polyfluorene ("PFO")-based polymer, and a poly (p-phenylene vinylene) ("PPV")-based polymer. In an alternative embodiment, a phosphorescent material including an organometallic complex such as (4,6-F2ppy)2Irpic may be included.

As described above, at least one of the first light emitting layer EML1, the second light emitting layer EML2 and the third light emitting layer EML3 and at least another one of the first light emitting layer EML1, the second light emitting layer EML2 and the third light emitting layer EML3 emit blue light in different wavelength ranges. To emit blue light in different wavelength ranges, the first light emitting layer EML1, the second light emitting layer EML2 and the third light emitting layer EML3 may include the same material as one another, and a method of adjusting a resonance distance may be used. In an alternative embodiment, to emit blue light in different wavelength ranges, at least one of the first light emitting layer EML1, the second light emitting layer EML2 and the third light emitting layer EML3 and at least another one of the first light emitting layer EML1, the second light emitting layer EML2 and the third light emitting layer EML3 may include different materials from one another.

However, the invention is not limited thereto. The first light emitting layer EML1, the second light emitting layer EML2 and the third light emitting layer EML3 may all emit blue light having a peak wavelength of about 440 nm to about 480 nm and may include the same material as one another.

In an alternative embodiment, in an embodiment, at least any one of the first light emitting layer EML1, the second light emitting layer EML2 and the third light emitting layer EML3 may emit the first blue light having the first peak wavelength, another one of the first light emitting layer EML1, the second light emitting layer EML2 and the third light emitting layer EML3 may emit the second blue light having the second peak wavelength different from the first peak wavelength, and the other one of the first light emitting layer EML1, the second light emitting layer EML2 and the third light emitting layer EML3 may emit third blue light having a third peak wavelength different from the first peak wavelength and the second peak wavelength. In some embodiments, any one of the first peak wavelength, the second peak wavelength and the third peak wavelength may be in the range of about 440 nm to less than about 460 nm. In an embodiment, another one of the first peak wavelength, the second peak wavelength and the third peak wavelength may be in the range of about 460 nm to less than about 470 nm, and the other one of the first peak wavelength, the second peak wavelength and the third peak wavelength may be in the range of about 470 nm to about 480 nm.

According to some embodiments, the output light L1 emitted from the light emitting layer OL is blue light and includes a long wavelength component, a medium wavelength component and a short wavelength component. Therefore, the light emitting layer OL may finally emit blue light having a broader emission peak as the output light L1 and improve color visibility at a side viewing angle.

According to the above-described embodiments, light efficiency may be increased, and the life of the display device may be extended as compared with a conventional light emitting element that does not employ a tandem structure, that is, a structure in which a plurality of light emitting layers is stacked.

The first charge generation layer CGL1 may be disposed between the first stack ST1 and the second stack ST2. The first charge generation layer CGL1 may inject electric charges into each light emitting layer. The first charge generation layer CGL1 may control the charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11 and may be disposed between the n-type charge generation layer CGL11 and the second stack ST2.

The first charge generation layer CGL1 may have a structure in which the n-type charge generation layer CGL11 and the p-type charge generation layer CGL12 are in contact with each other. The n-type charge generation layer CGL11 is disposed closer to the anode AE1 (AE2 of FIG. 5, AE3 of FIG. 5) than to the cathode CE. The p-type charge generation layer CGL12 is disposed closer to the cathode CE than to the anode AE1 (AE2 of FIG. 5, AE3 of FIG. 5). The n-type charge generation layer CGL11 supplies electrons to the first light emitting layer EML1 adjacent to the anode AE1 (AE2 of FIG. 5, AE3 of FIG. 5), and the p-type charge generation layer CGL12 supplies holes to the second light emitting layer EML2 included in the second stack ST2. Since the first charge generation layer CGL1 is disposed between the first stack ST1 and the second stack ST2 to provide electric charges to each light emitting layer, luminous efficiency may be improved, and a driving voltage may be lowered.

The first stack ST1 may be disposed on the first anode AE1, the second anode AE2 (refer to FIG. 5) and the third anode AE3 (refer to FIG. 5) and may further include a first hole transport layer HTL1, a first electron blocking layer BIL1 and a first electron transport layer ETL1.

The first hole transport layer HTL1 may be disposed on the first anode AE1, the second anode AE2 (refer to FIG. 5), and the third anode AE3 (refer to FIG. 5). The first hole transport layer HTL1 may facilitate the transportation of holes and may include a hole transport material. In an embodiment, the hole transport material may include, but is not limited to, a carbazole derivative such as N-phenylcarbazole or polyvinylcarbazole, a fluorene derivative, a triphenylamine derivative such as N,N'-bis(3-methylphenyl)-N,N'-diphenyl-[1,1-biphenyl]-4,4'-diamine ("TPD") or 4,4',4"-tris(N-carbazolyl)triphenylamine ("TCTA"), N,N'-di(1-naphthyl)-N,N'-diphenylbenzidine) ("NPB"), or 4,4'-Cyclohexylidene bis[N,N-bis(4-methylphenyl) benzenamine] ("TAPC"). In some embodiments, the first hole transport layer HTL1 may include a single layer. In an alternative embodiment, in some embodiments, the first hole transport layer HTL1 may include a plurality of layers. When the first hole transport layer HTL1 includes a plurality of layers, the layers may include different materials from each other.

The first electron blocking layer BIL1 may be disposed on the first hole transport layer HTL1 and may be disposed between the first hole transport layer HTL1 and the first light emitting layer EML1. The first electron blocking layer BIL1 may include a hole transport material and a metal or a metal compound in order to prevent electrons generated by the first light emitting layer EML1 from entering the first hole transport layer HTL1. In some embodiments, the first hole transport layer HTL1 and the first electron blocking layer BIL1 described above may be provided as a single layer in which their respective materials are mixed. However, the invention is not limited thereto. In some embodiments, the first electron blocking layer BIL1 may be omitted.

The first electron transport layer ETL1 may be disposed on the first light emitting layer EML1 and may be disposed between the first charge generation layer CGL1 and the first light emitting layer EML1. In some embodiments, the first electron transport layer ETL1 may include an electron transport material such as tris-(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline ("BCP"), 4,7-diphenyl-1,10-phenanthroline (Bphen), 3-(4-biphenyl)-4-phenyl-5-tert-butylphenyl-1,2,4-triazole ("TAZ"), 4-(naphthalen-1-yl)-3,5-diphenyl-4H-1,2,4-triazole ("NTAZ"), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis (benzoquinolin-10-olate) (Bebq2), ADN, or a combination of the same. However, the invention is not limited to the type of the electron transport material. In some embodiments, the first electron transport layer ETL1 may consist of a single layer. In an alternative embodiment, in some embodiments, the first electron transport layer ETL1 may consist of a plurality of layers. When the first electron transport layer ETL1 consist of a plurality of layers, the layers may include different materials from each other. The second stack ST2 may be disposed on the first charge generation layer CGL1 and may further include a second hole transport layer HTL2, a second electron blocking layer BIL2 and a second electron transport layer ETL2.

The second hole transport layer HTL2 may be disposed on the first charge generation layer CGL1. The second hole transport layer HTL2 may include the same material as that of the first hole transport layer HTL1 or may include one or more materials of the materials included in the first hole transport layer HTL1. The second hole transport layer HTL2 may include a single layer or a plurality of layers. When the second hole transport layer HTL2 includes a plurality of layers, the layers may include different materials from each other.

The second electron blocking layer BIL2 may be disposed on the second hole transport layer HTL2 and may be disposed between the second hole transport layer HTL2 and the second light emitting layer EML2. The second electron blocking layer BIL2 may have the same material and structure as those of the first electron blocking layer BIL1 or may include one or more materials of the materials included in the first electron blocking layer BIL1. In some embodiments, the second electron blocking layer BIL2 may be omitted.

The second electron transport layer ETL2 may be disposed on the second light emitting layer EML2 and may be disposed between the second charge generation layer CGL2 and the second light emitting layer EML2. The second electron transport layer ETL2 may have the same material and structure as those of the first electron transport layer ETL1 or may include one or more materials of the materials included in the first electron transport layer ETL1. The second electron transport layer ETL2 may consist of a single layer or a plurality of layers. When the second electron transport layer ETL2 consists of a plurality of layers, the layers may include different materials from each other.

The second charge generation layer CGL2 may be disposed on the second stack ST2 and may be disposed between the second stack ST2 and the third stack ST3.

The second charge generation layer CGL2 may have the same structure as the first charge generation layer CGL1 described above. In an embodiment, the second charge generation layer CGL2 may include an n-type charge generation layer CGL21 disposed closer to the second stack ST2 than to the cathode CE and a p-type charge generation layer CGL22 disposed closer to the cathode CE than to the second stack ST2, for example. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may include different materials from each other or the same material as each other.

The third stack ST3 may be disposed on the second charge generation layer CGL2 and may further include a third hole transport layer HTL3 and a third electron transport layer ETL3.

The third hole transport layer HTL3 may be disposed on the second charge generation layer CGL2. The third hole transport layer HTL3 may include the same material as that of the first hole transport layer HTL1 or may include one or more materials of the materials included in the first hole transport layer HTL1. The third hole transport layer HTL3 may include a single layer or a plurality of layers. When the third hole transport layer HTL3 includes a plurality of layers, the layers may include different materials from each other.

The third electron transport layer ETL3 may be disposed on the third light emitting layer EML3 and may be disposed between the cathode CE and the third light emitting layer EML3. The third electron transport layer ETL3 may have the same material and structure as those of the first electron transport layer ETL1 or may include one or more materials of the materials included in the first electron transport layer ETL1. The third electron transport layer ETL3 may include a single layer or a plurality of layers. When the third electron transport layer ETL3 includes a plurality of layers, the layers may include different materials from each other.

Although not illustrated in the drawing, a hole injection layer may be further disposed at least any one of between the first stack ST1 and the first anode AE1, between the second anode AE2 (refer to FIG. 5) and the third anode AE3 (refer to FIG. 5), between the second stack ST2 and the first charge generation layer CGL1, and between the third stack ST3 and the second charge generation layer CGL2. The hole injection layer may facilitate the injection of holes into the first light emitting layer EML1, the second light emitting layer EML2 and the third light emitting layer EML3. In some embodiments, the hole injection layer may include, but not limited to, any one or more of cuper phthalocyanine (CuPc), poly (3,4-ethylenedioxythiphene) ("PEDOT"), polyaniline ("PANI"), and N,N-dinaphthyl-N,N'-diphenyl benzidine ("NPD"). In some embodiments, the hole injection layer may be disposed between the first stack ST1 and the first anode AE1, between the second anode AE2 (refer to FIG. 5) and the third anode AE3 (refer to FIG. 5), between the second stack ST2 and the first charge generation layer CGL1, and between the third stack ST3 and the second charge generation layer CGL2.

Although not illustrated in the drawing, an electron injection layer may be further disposed at least any one of between the third electron transport layer ETL3 and the cathode CE, between the second charge generation layer CGL2 and the second stack ST2, and between the first charge generation layer CGL1 and the first stack ST1. The electron injection layer may facilitate the injection of electrons and may use tris(8-hydroxyquinolino)aluminum) (Alq3), PBD, TAZ, Spiro-PBD, BAlq, or SAlq, but the invention is not limited thereto. In an embodiment, the electron injection layer may be a metal halide compound and may be any one or more of, e.g., $MgF_2$, LiF, NaF, KF, RbF, CsF, FrF, LiI, NaI, KI, RbI, CsI, FrI, and $CaF_2$, but the invention is not limited thereto. In an alternative embodiment, the electron injection layer may include a lanthanum material such as Yb, Sm, or Eu. In an alternative embodiment, the electron injection layer may include both a metal halide material and a lanthanum material such as RbI:Yb or KI:Yb. When the electron injection layer includes both a metal halide material and a lanthanum material, the electron injection layer may be provided by co-deposition of the metal halide material and the lanthanum material. In some embodiments, the electron injection layer may be disposed between the third electron transport layer ETL3 and the cathode CE, between the second charge generation layer CGL2 and the second stack ST2 and between the first charge generation layer CGL1 and the first stack ST1.

The structure of the light emitting layer OL may also be modified from the above structure. In an embodiment, the light emitting layer OL may include only two stacks or may include four or more stacks, for example.

As illustrated in FIGS. 5 through 9, a thin-film encapsulation layer 170 may be disposed on the cathode CE. The thin-film encapsulation layer 170 is disposed in all of the first light emitting region LA1, the second light emitting region LA2, the third light emitting region LA3, and the non-light emitting region NLA. In some embodiments, the thin-film encapsulation layer 170 directly covers the cathode CE. In some embodiments, a capping layer (not illustrated) covering the cathode CE may be further disposed between the thin-film encapsulation layer 170 and the cathode CE. In this case, the thin-film encapsulation layer 170 may directly cover the capping layer.

In some embodiments, the thin-film encapsulation layer 170 may include a first encapsulating inorganic layer 171, an encapsulating organic layer 173, and a second encapsulating inorganic layer 175 sequentially stacked on the cathode CE.

In some embodiments, each of the first encapsulating inorganic layer 171 and the second encapsulating inorganic layer 175 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

In some embodiments, the encapsulating organic layer 173 may include acrylic resin methacrylic resin, poly isoprene, vinyl resin, epoxy resin, urethane resin, cellulose resin, or perylene resin.

The stacked structure of the thin-film encapsulation layer 170 is not limited to the above embodiment and may be variously changed.

A panel light blocking member 190 may be disposed on the thin-film encapsulation layer 170. The panel light Hocking member 190 may be disposed on the thin-film encapsulation layer 170 and may overlap the non-light emitting region NLA. The panel light blocking member 190 may prevent light from intruding between adjacent light emitting regions and thus causing color mixing, thereby further improving a color gamut.

In some embodiments, the panel light blocking member 190 may be disposed in the non-light emitting region NLA to surround each of the light emitting regions LA1 through LA3 in a plan view.

The panel light blocking member 190 may include an organic light blocking material and may be provided by coating and exposing the organic light blocking material.

In an embodiment, the panel light blocking member 190 may be omitted.

The color conversion substrate 30 will now be described with reference to FIGS. 10 through 13 in addition to FIGS. 5 through 9.

Figure 10:
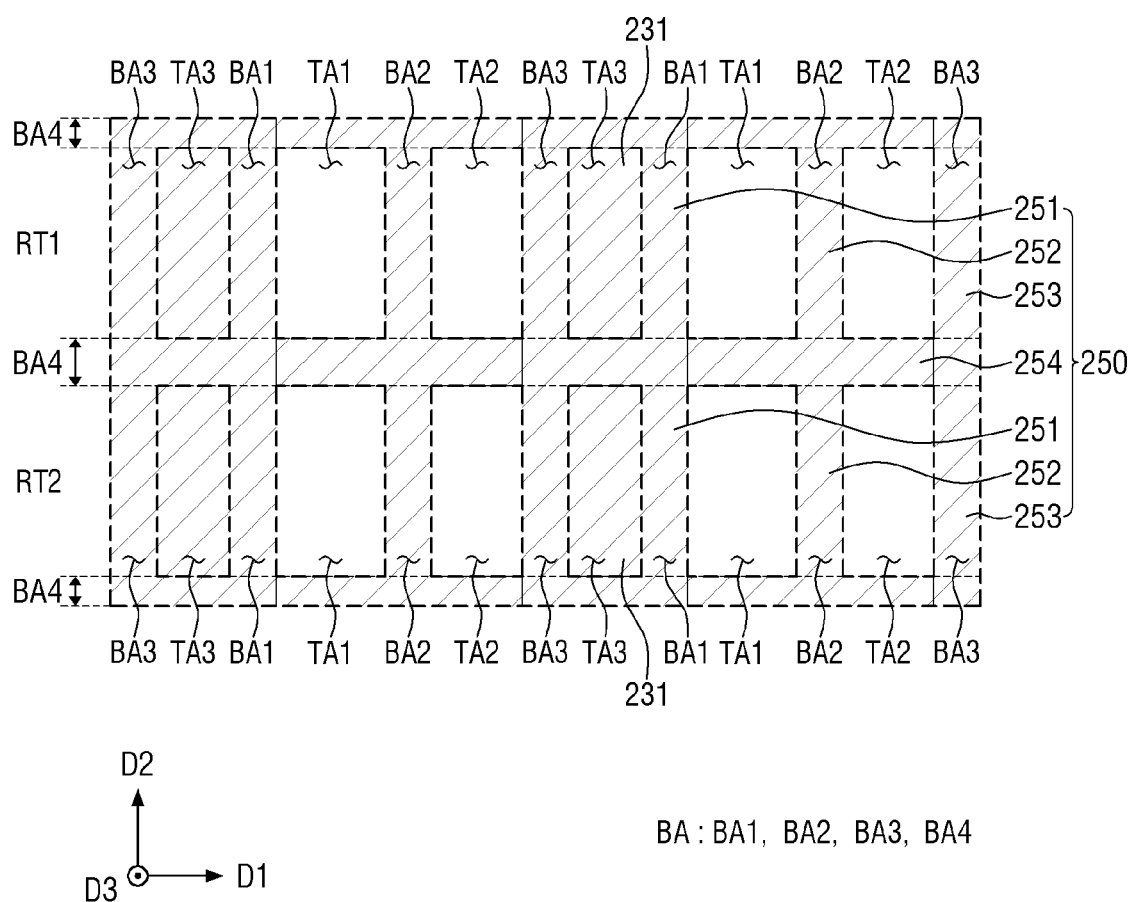
FIG. 10 is a plan view illustrating an embodiment of the schematic arrangement of a third color filter and a color pattern in the color conversion substrate of the display device.
Figure 11:
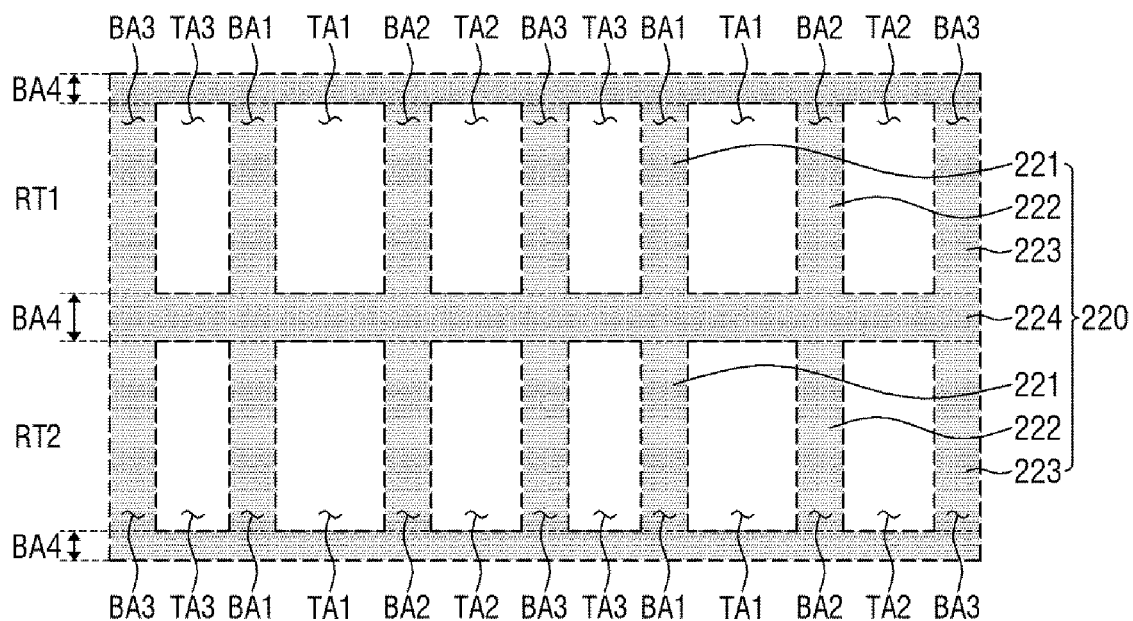
FIG. 11 is a plan view illustrating an embodiment of the schematic arrangement of a light blocking member in the color conversion substrate of the display device.
Figure 12:
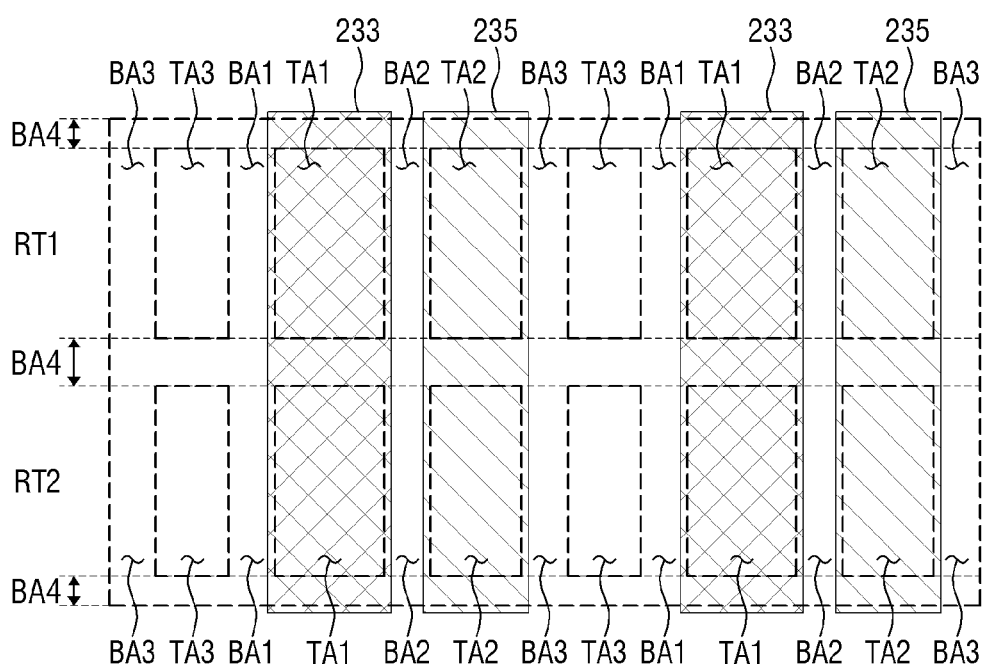
FIG. 12 is a plan view illustrating an embodiment of the schematic arrangement of a first color filter and a second color filter in the color conversion substrate of the display device.
Figure 13:
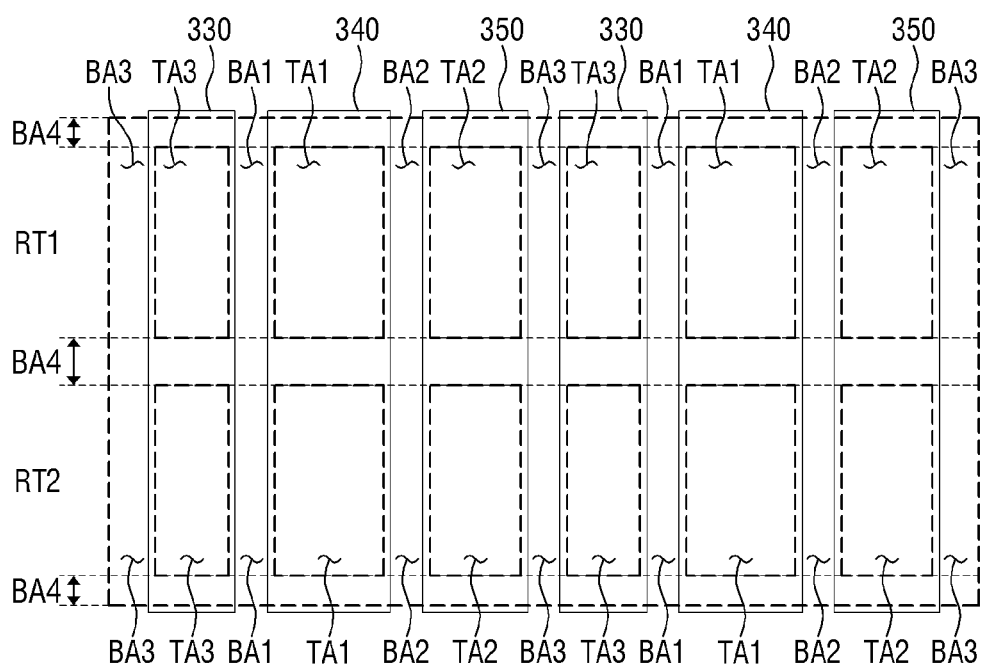
FIG. 13 is a plan view illustrating an embodiment of the schematic arrangement of a first wavelength conversion pattern, a second wavelength conversion pattern, and a light transmission pattern in the color conversion substrate of the display device.

FIG. 10 is a plan view illustrating an embodiment of the schematic arrangement of a third color filter 231 and the color pattern 250 in the color conversion substrate 30 of the display device 1. FIG. 11 is a plan view illustrating an embodiment of the schematic arrangement of the light blocking member 220 in the color conversion substrate 30 of the display device 1. FIG. 12 is a plan view illustrating the schematic arrangement of a first color filter 233 and a second color filter 235 in the color conversion substrate 30 of the display device 1. FIG. 13 is a plan view illustrating an embodiment of the schematic arrangement of a first wavelength conversion pattern 340, a second wavelength conversion pattern 350, and a light transmission pattern 330 in the color conversion substrate 30 of the display device 1.

Referring to FIGS. 5 through 13, a second base 310 illustrated in FIG. 5 may include a light transmitting material. In some embodiments, the second base 310 may include a glass substrate or a plastic substrate. In some embodiments, the second base 310 may further include a separate layer disposed on the glass substrate or the plastic substrate, for example, an insulating layer such as an inorganic layer.

In some embodiments, the light transmitting regions TA1 through TA3 and the light blocking region BA may be defined in the second base 310 as described above with reference to FIG. 4.

As illustrated in FIGS. 5 and 10, the third color filter 231 and the color pattern 250 may be disposed on a surface of the second base 310 which faces the display substrate 10.

The third color filter 231 may be disposed on the surface of the second base 310 and may overlap the third light transmitting region TA3 or the third light emitting region LA3. In some embodiments, the third color filter 231 disposed in the first row RT1 and the third color filter 231 disposed in the second row RT2 may be spaced apart from each other along the second direction D2. In some embodiments, a fourth color pattern 254 to be described later may be disposed between the first row RT1 and the second row RT2. In some embodiments, the fourth color pattern 254 may be connected to the third color filter 231 disposed in the first row RT1 and the third color filter 231 disposed in the second row RT2.

The third color filter 231 may transmit only light of the first color (e.g., blue light) and block or absorb light of the second color (e.g., red light) and light of the third color (e.g., green light). In some embodiments, the third color filter 231 may include a base resin 231a and a colorant 231b of the first color in the base resin 231a as illustrated in FIG. 7.

In some embodiments, the base resin 231a may be an organic material and may be a photocurable resin.

The colorant 231b of the first color may absorb light of the second color and light of the third color. In some embodiments, the colorant 231b of the first color may be uniformly dispersed in the base resin 231a.

In some embodiments, the third color filter 231 may be a blue color filter, and the colorant 231b of the first color may be a blue colorant such as a blue dye or a blue pigment. As used herein, the term 'colorant' is a concept encompassing both a dye and a pigment.

The color pattern 250 may absorb a portion of light introduced from the outside of the display device 1 into the color conversion substrate 30, thereby reducing reflected light due to external light. In the display device 1, a considerable part of external light is reflected, causing distortion of the color gamut of the color conversion substrate 30. However, in the illustrated embodiment, since the color pattern 250 is disposed on the second base 310, the amount of reflected external light may be reduced, and color distortion due to external light may be reduced.

In some embodiments, the color pattern 250 may include a blue colorant such as a blue dye or a blue pigment. In some embodiments, the color pattern 250 may include the same material as that of the third color filter 231 and may be provided at the same time as the third color filter 231. That is, the third color filter 231 and the color pattern 250 may be provided simultaneously by coating a photocurable composition, which includes a blue colorant as a colorant of the third color and a base resin, on the surface of the second base 310 and exposing and developing the photocurable composition.

In some embodiments, a thickness TH2 of the color pattern 250 measured along the third direction D3 may be substantially equal to a thickness TH1 of the third color filter TH1.

When the color pattern 250 includes a colorant of the third color (e.g., a blue colorant), external light or reflected light transmitted through the color pattern 250 has a blue wavelength band. The color sensibility of user's eyes varies according to the color of light. More specifically, light of the blue wavelength band may be perceived less sensitively by the user than light of a green wavelength band and light of a red wavelength band. Therefore, since the color pattern 250 includes a blue colorant, the user may perceive reflected light relatively less sensitively.

The color pattern 250 may be disposed on the surface of the second base 310 and may overlap the light blocking region BA or the non-light emitting region NLA. In some embodiments, the color pattern 250 may directly contact the surface of the second base 310. In an alternative embodiment, when a separate buffer layer is disposed on the surface of the second base 310 to prevent introduction of impurities, the color pattern 250 may directly contact the buffer layer.

As illustrated in FIG. 10, in some embodiments, the color pattern 250 may be disposed over the entire light blocking region BA. In some embodiments, the color pattern 250 may include a first color pattern 251 overlapping the first light blocking region BA1, a second color pattern 252 overlapping the second light blocking region BA2, a third color pattern 253 overlapping the third light blocking region BA3, and the fourth color pattern 254 overlapping the fourth light blocking region BA4. In some embodiments, the fourth color pattern 254 may be connected to the first color pattern 251, the second color pattern 252 and the third color pattern 253.

In addition, the color pattern 250 may be connected to the third color filter 231.

As illustrated in FIGS. 5 and 11, the light blocking member 220 may be disposed on the surface of the second base 310 which faces the display substrate 10. The light blocking member 220 may overlap the light blocking region BA to block transmission of light. In some embodiments, the light blocking member 220 may be disposed in a substantially lattice shape in a plan view as illustrated in FIG. 11.

In some embodiments, the light blocking member 220 may include an organic light blocking material and may be provided by coating and exposing the organic light blocking material. In some embodiments, the light blocking member 220 may include a dye or pigment having light blocking properties and may be a black matrix.

As described above, external light may cause distortion of the color gamut of a color conversion panel. However, when the light blocking member 220 is disposed on the second base 310 in the illustrated embodiment, at least a portion of the external light is absorbed by the light blocking member 220. Therefore, color distortion due to reflection of the external light may be reduced. In some embodiments, the light blocking member 220 may prevent color mixing due to intrusion of light between adjacent light transmitting regions, thereby further improving the color gamut.

As illustrated in FIG. 11, in some embodiments, the light blocking member 220 may include a first light blocking member 221 overlapping the first light blocking region BA1, a second light blocking member 222 overlapping the second light blocking region BA2, a third light blocking member 223 overlapping the third light blocking region BA3, and a fourth light blocking member 224 overlapping the fourth light blocking region BA4. In some embodiments, the first light blocking member 221, the second light blocking member 222, and the third light blocking member 223 may be connected to the fourth light blocking member 224.

The light blocking member 220 may be disposed on the color pattern 250. In some embodiments, the first light blocking member 221 may be disposed on the first color pattern 251, the second light blocking member 222 may be disposed on the second color pattern 252, the third light blocking member 223 may be disposed on the third color pattern 253, and the fourth light blocking member 224 may be disposed on the fourth color pattern 254.

Since the color pattern 250 is disposed between the light blocking member 220 and the second base 310, the light blocking member 220 may not contact the second base 310 in some embodiments.

As illustrated in FIGS. 5 and 12, the first color filter 233 and the second color filter 235 may be disposed on the surface of the second base 310 which faces the display substrate 10.

The first color filter 233 may overlap the first light transmitting region TA1 or the first light emitting region LA1, and the second color filter 235 may overlap the second light transmitting region TA2 or the second light emitting region LA2.

As illustrated in FIG. 5, in some embodiments, a side of the first color filter 233 may overlap the first light blocking region BA1 and may be disposed on the first color pattern 251 and the first light blocking member 221. The other side of the first color filter 233 may overlap the second light blocking region BA2 and may be disposed on the second color pattern 252 and the second light blocking member 222.

As illustrated in FIG. 5, in some embodiments, a side of the second color filter 235 may overlap the second light blocking region BA2 and may be disposed on the second color pattern 252 and the second light blocking member 222. In addition, in some embodiments, the other side of the second color filter 235 may overlap the third light blocking region BA3 and may be disposed on the third color pattern 253 and the third light blocking member 223.

As illustrated in FIG. 12, in some embodiments, each of the first color filter 233 and the second color filter 235 may be shaped like a stripe extending along the second direction D2 and may cross the fourth light blocking region BA4 between the first row RT1 and the second row RT2. Therefore, the first color filter 233 and the second color filter 235 may be disposed on the fourth light blocking member 224 in the fourth light blocking region BA4, and each of the first color filter 233 and the second color filter 235 may cover the fourth color pattern 254 and the fourth light blocking member 224 along the second direction D2 in the fourth light blocking region BA4. However, the invention is not limited thereto. In an embodiment, at least any one of the first color filter 233 and the second color filter 235 may be shaped like an island pattern spaced apart from another island pattern along the second direction D2.

In some embodiments, the first color filter 233 may block or absorb light of the first color (e.g., blue light). That is, the first color filter 233 may function as a blue light blocking filter that blocks blue light. In some embodiments, the first color filter 233 may transmit only light of the second color (e.g., red light) and block or absorb light of the first color (e.g., blue light) and light of the third color (e.g., green light).

In some embodiments, the first color filter 233 may include a base resin 233a and a colorant 233b of the second color disposed in the base resin 233a as illustrated in FIG. 8.

In some embodiments, the base resin 233a may be an organic material and may be a photocurable resin. In some embodiments, the base resin 233a may be an organic material having light transmitting properties.

The colorant 233b of the second color may absorb or block light of the first color and light of the third color and transmit light of the second color. In some embodiments, the colorant 233b of the second color may be uniformly dispersed in the base resin 233a.

In some embodiments, the first color filter 233 may be a red color filter, and the colorant 233b of the second color may be a red colorant such as a red dye or a red pigment.

The first color filter 233 may further include a first light absorbing colorant ca1. The first light absorbing colorant ca1 may be uniformly dispersed in the base resin 233a. The first light absorbing colorant ca1 may absorb or block a short wavelength component of light of the second color (e.g., red light) transmitted through the colorant 233b of the second color. In an alternative embodiment, the first light absorbing colorant ca1 may block or absorb a combination of a short wavelength component of light of the second color and light of the third color, for example, yellow light which is a combination of a short wavelength component of red light and green light, for example. In an embodiment, the first light absorbing colorant ca1 may be a yellow light absorbing colorant that absorbs yellow light, for example.

In some embodiments, the first light absorbing colorant ca1 may be a magenta colorant such as a magenta dye or a magenta pigment. In an embodiment, when the magenta colorant applied to the first light absorbing colorant ca1 is a magenta pigment, color index (C.I.) pigment red 122, C.I. pigment red 202, C.I. pigment red 209, C.I. pigment red 264, C.I. pigment red 269, C.I. pigment violet 19, C.I. pigment violet 23, or the like may be applied as the magenta pigment among compounds classified as pigments in the C.I. (issued by the Society of Dyers and Colourists), for example.

The first light absorbing colorant ca1 may absorb or block a short wavelength component of red light which is not blocked by the colorant 233b of the second color among external light, thereby preventing or reducing the emission of light from the first wavelength conversion pattern 340 due to the external light. This will be described in more detail later.

The second color filter 235 may block or absorb light of the first color (e.g., blue light). That is, the second color filter 235 may also function as a blue light blocking filter. In some embodiments, the second color filter 235 may transmit only light of the third color (e.g., green light) and block or absorb light of the first color (e.g., blue light) and light of the second color (e.g., red light).

In some embodiments, the second color filter 235 may include a base resin 235a and a colorant 235b of the third color disposed in the base resin 235a as illustrated in FIG. 9.

In some embodiments, the base resin 235a may be an organic material and may be a photocurable resin.

The colorant 235b of the third color may absorb or block light of the first color and light of the second color and transmit light of the third color. In some embodiments, the colorant 235b of the third color may be uniformly dispersed in the base resin 235a.

In some embodiments, the second color filter 235 may be a green color filter, and the colorant 235b of the third color may be a green colorant such as a green dye or a green pigment.

As illustrated in FIG. 5, a first capping layer 391 may be disposed on the surface of the second base 310 to cover the light blocking member 220 (refer to FIG. 11), the color pattern 250, the third color filter 231, the first color filter 233, and the second color filter 235. In some embodiments, the first capping layer 391 may directly contact the first color filter 233, the second color filter 235, and the third color filter 231.

The first capping layer 391 may further contact the light blocking member 220. In an embodiment, as illustrated in FIG. 5, the first light blocking member 221 may directly contact the first capping layer 391 in the first light blocking region BA1, for example. In addition, the second light blocking member 222 may contact the first capping layer 391 in the second light blocking region BA2, and the third light blocking member 223 may contact the first capping layer 391 in the third light blocking region BA3.

The first capping layer 391 may prevent impurities such as moisture or air from being introduced from the outside and damaging or contaminating the light blocking member 220, the color pattern 250, the first color filter 233, the second color filter 235, and the third color filter 231. In addition, the first capping layer 391 may prevent the colorants included in the first color filter 233, the second color filter 235 and the third color filter 231 from being diffused to the first wavelength conversion pattern 340, the second wavelength conversion pattern 350, etc. In some embodiments, the first capping layer 391 may include an inorganic material. In an embodiment, the first capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride, for example.

As illustrated in FIG. 5, the light transmission pattern 330, the first wavelength conversion pattern 340, and the second wavelength conversion pattern 350 may be disposed on the first capping layer 391.

In some embodiments, the light transmission pattern 330, the first wavelength conversion pattern 340, and the second wavelength conversion pattern 350 may be provided by coating a photosensitive material and exposing and developing the photosensitive material. However, the invention is not limited thereto, and the light transmission pattern 330, the first wavelength conversion pattern 340 and the second wavelength conversion pattern 350 may also be provided by an inkjet method.

The light transmission pattern 330 may be disposed on the first capping layer 391 and may overlap the third light transmitting region TA3 or the third light emitting region LA3. In some embodiments, as illustrated in FIG. 13, the light transmission pattern 330 may be shaped like a stripe extending along the second direction D2 and may cross the fourth light blocking region BA4 between the first row RT1 and the second row RT2. However, the invention is not limited thereto. In some embodiments, the light transmission pattern 330 may have a structure in which a part overlapping the third light transmitting region TA3 in the first row RT1 and a part overlapping the third light transmitting region TA3 in the second row RT2 are spaced apart from each other, for example, may be shaped like island patterns.

The light transmission pattern 330 may transmit incident light. The output light L1 provided by the third light emitting element ED3 may be blue light as described above. The output light L1 which is blue light is transmitted through the light transmission pattern 330 and the third color filter 231 and then emitted to the outside of the display device 1. That is, first light La emitted from the third light transmitting region TA3 may be blue light.

In some embodiments, the light transmission pattern 330 may include a first base resin 331 and may further include a first scatterer 333 dispersed in the first base resin 331.

The first base resin 331 may include a material having high light transmittance. In some embodiments, the first base resin 331 may include an organic material. In an embodiment, the first base resin 331 ma include an organic material such as epoxy resin, acrylic resin, cardo resin, or imide resin, for example.

The first scatterer 333 may have a refractive index different from that of the first base resin 331 and may form an optical interface with the first base resin 331. In an embodiment, the first scatterer 333 may be light scattering particles, for example. The first scatterer 333 is not particularly limited as long as it is a material that may scatter at least a portion of transmitted light. In an embodiment, the first scatterer 333 may be metal oxide particles or organic particles, for example. In an embodiment, the metal oxide may be, for example, titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The material of the organic particles may be, for example, acrylic resin or urethane resin. The first scatterer 333 may scatter incident light in random directions regardless of the incident direction of the incident light without substantially changing the wavelength of the light transmitted through the light transmission pattern 330.

As described above, the light transmission pattern 330 may directly contact the first capping layer 391 in the third light transmitting region TA3.

The first wavelength conversion pattern 340 may be disposed on the first capping layer 391 and may overlap the first light transmitting region TA1 or the first light emitting region LA1. In some embodiments, as illustrated in FIG. 13, the first wavelength conversion pattern 340 may be shaped like a stripe extending along the second direction D2 and may cross the fourth light blocking region BA4 between the first row RT1 and the second row RT2. However, the invention is not limited thereto. In some embodiments, the first wavelength conversion pattern 340 may have a structure in which a part disposed in the first row RT1 and a part disposed in the second row RT2 are spaced apart from each other, for example, may be shaped like island patterns.

The first wavelength conversion pattern 340 may convert or shift a peak wavelength of incident light into another predetermined peak wavelength and output light having the predetermined peak wavelength. In some embodiments, the first wavelength conversion pattern 340 may convert the output light L1 provided by the first light emitting element ED1 into red light having a peak wavelength in the range of about 610 nm to about 650 nm and output the red light. An emission spectrum and light absorption spectrum of the first wavelength conversion pattern 340 will be described in more detail later.

In some embodiments, the first wavelength conversion pattern 340 may include a second base resin 341 and a first wavelength shifter 345 dispersed in the second base resin 341 and may further include a second scatterer 343 dispersed in the second base resin 341.

The second base resin 341 may include a material having high light transmittance. In some embodiments, the second base resin 341 may include an organic material. In some embodiments, the second base resin 341 may include the same material as that of the first base resin 331 or may include at least one of the materials exemplified as the constituent materials of the first base resin 331.

The first wavelength shifter 345 may convert or shift a peak wavelength of incident light to another predetermined peak wavelength. In some embodiments, the first wavelength shifter 345 may convert the output light L1 of the first color, which is blue light provided by the first light emitting element ED1, into red light having a single peak wavelength in the range of about 610 nm to about 650 nm and output the red light.

Examples of the first wavelength shifter 345 may include quantum dots, quantum rods, and phosphors. In an embodiment, the quantum dots may be particulate materials that emit light of a predetermined color when electrons transit from a conduction band to a valence band, for example.

The quantum dots may be semiconductor nanocrystalline materials. The quantum dots may have a predetermined band gap according to their composition and size. Thus, the quantum dots may absorb light and then emit light having a unique wavelength. Examples of semiconductor nanocrystals of the quantum dots include group IV nanocrystals, group II-VI compound nanocrystals, group III-V compound nanocrystals, group IV-VI nanocrystals, and combinations of the same.

In an embodiment, the group II-VI compounds may include binary compounds including one of CdSe, CdTe, ZnS, ZnSe, ZnTe, ZnO, HgS, HgSe, HgTe, MgSe, MgS and combinations of the same, ternary compounds including InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and combinations of the same, and quaternary compounds including HgZnTeS, CdZnSeS, CdZnSeTe, CdZnSTe, CdHgSeS, CdHgSeTe, CdHgSTe, HgZnSeS, HgZnSeTe, HgZnSTe and combinations of the same.

In an embodiment, the group III-V compounds may include binary compounds including one of GaN, GaP, GaAs, GaSb, AlN, AlP, AlAs, AlSb, InN, InP, InAs, InSb and combinations of the same, ternary compounds including one of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and combinations of the same, and quaternary compounds including one of GaAlNAs, GaAl-NSb, GaAlPAs, GaAlPSb, GaInNP, GaInNAs, GaInNSb, GaInPAs, GaInPSb, InAlNP, InAlNAs, InAlNSb, InAlPAs, InAlPSb and combinations of the same.

In an embodiment, the group IV-VI compounds may include binary compounds including one of SnS, SnSe, SnTe, PbS, PbSe, PbTe and mixtures of the same, ternary compounds including one of SnSeS, SnSeTe, SnSTe, PbSeS, PbSeTe, PbSTe, SnPbS, SnPbSe, SnPbTe and mixtures of the same, and quaternary compounds including one of SnPbSSe, SnPbSeTe, SnPbSTe and combinations of the same. In an embodiment, the group IV elements may include one of silicon (Si), germanium (Ge), and a combination of the same. The group IV compounds may be binary compounds including one of silicon carbide (SiC), silicon germanium (SiGe), and a combination of the same.

Here, the binary, ternary or quaternary compounds may be in the particles at a uniform concentration or may be in the same particles at partially different concentrations. In addition, they may have a core/shell structure in which one quantum dot surrounds another quantum dot. An interface between the core and the shell may have a concentration gradient in which the concentration of an element in the shell is reduced toward the center.

In some embodiments, the quantum dots may have a core-shell structure including a core including the above-described nanocrystal and a shell surrounding the core. The shell of each quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of an element in the shell is reduced toward the center. The shell of each quantum dot may be, for example, a metal or non-metal oxide, a semiconductor compound, or a combination of the same.

In an embodiment, the metal or non-metal oxide may be, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ or NiO or a ternary compound such as $MgAl_2O_4$, $CoFe_2O_4$, $NiFe_2O_4$ or $CoMn_2O_4$.

In an embodiment, the semiconductor compound may be, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

In an embodiment, light emitted from the first wavelength shifter 345 may have a full width of half maximum ("FWHM") of an emission wavelength spectrum of about 45 nm or less, about 40 nm or less, or about 30 nm or less. Therefore, the color purity and color reproducibility of the display device 1 may be further improved. In addition, the light emitted from the first wavelength shifter 345 may be radiated in various directions regardless of the incident direction of incident light. Therefore, the lateral visibility of the second color displayed in the second light transmitting region TA2 may be improved.

A portion of the output light L1 provided by the first light emitting element ED1 may be transmitted through the first wavelength conversion pattern 340 without being converted into red light by the first wavelength shifter 345. Of the output light L1, a component incident on the first color filter 233 without being converted by the first wavelength conversion pattern 340 may be blocked by the first color filter 233. Red light into which the output light L1 has been converted by the first wavelength conversion pattern 340 may be transmitted through the first color filter 233 and emitted to the outside. That is, second light Lb emitted from the first light transmitting region TA1 may be red light.

The second scatterer 343 may have a refractive index different from that of the second base resin 341 and may form an optical interface with the second base resin 341. In an embodiment, the second scatterer 343 may be light scattering particles, for example. Other details of the second scatterer 343 are substantially the same or similar to those of the first scatterer 333, and thus a description thereof is omitted.

The second wavelength conversion pattern 350 may be disposed on the first capping layer 391 and may overlap the second light transmitting region TA2 or the second light emitting region LA2. In some embodiments, as illustrated in FIG. 13, the second wavelength conversion pattern 350 may be shaped like a stripe extending along the second direction D2 and may cross the fourth light blocking region BA4 between the first row RT1 and the second row RT2. However, the invention is not limited thereto. In some embodiments, the second wavelength conversion pattern 350 may have a structure in which a part disposed in the first row RT1 and a part disposed in the second row RT2 are spaced apart from each other, for example, may be shaped like island patterns.

The second wavelength conversion pattern 350 may convert or shift a peak wavelength of incident light into another predetermined peak wavelength and output light having the predetermined peak wavelength. In some embodiments, the second wavelength conversion pattern 350 may convert the output light L1 provided by the second light emitting element ED2 into green light in the range of about 510 nm to about 550 nm and output the green light. An emission spectrum and light absorption spectrum of the second wavelength conversion pattern 350 will be described in more detail later.

In some embodiments, the second wavelength conversion pattern 350 may include a third base resin 351 and a second wavelength shifter 355 dispersed in the third base resin 351 and may further include a third scatterer 353 dispersed in the third base resin 351.

The third base resin 351 may include a material having high light transmittance. In some embodiments, the third base resin 351 may include an organic material. In some embodiments, the third base resin 351 may include the same material as that of the first base resin 331 or may include at least one of the materials exemplified as the constituent materials of the first base resin 331.

The second wavelength shifter 355 may convert or shift a peak wavelength of incident light to another predetermined peak wavelength. In some embodiments, the second wavelength shifter 355 may convert blue light having a peak wavelength in the range of about 440 nm to about 480 nm into green light having a peak wavelength in the range of about 510 nm to about 550 nm.

Examples of the second wavelength shifter 355 may include quantum dots, quantum rods, and phosphors. The second wavelength shifter 355 is substantially the same or similar to the first wavelength shifter 345 described above, and thus a more detailed description thereof is omitted.

In some embodiments, both the first wavelength shifter 345 and the second wavelength shifter 355 may include quantum dots. In this case, the particle size of quantum dots constituting the first wavelength shifter 345 may be greater than that of quantum dots constituting the second wavelength shifter 355.

The third scatterer 353 may have a refractive index different from that of the third base resin 351 and may form an optical interface with the third base resin 351. In an embodiment, the third scatterer 353 may be light scattering particles. Other details of the third scatterer 353 are substantially the same or similar to those of the second scatterer 343, and thus a description thereof is omitted, for example.

In an embodiment, the output light L1 emitted from the second light emitting element ED2 may be provided to the second wavelength conversion pattern 350, and the second wavelength shifter 355 may convert the output light L1 provided by the second light emitting element ED2 into green light having a peak wavelength in the range of about 510 nm to about 550 nm and emit the green light.

A portion of the output light L1 which is blue light may be transmitted through the second wavelength conversion pattern 350 without being converted into green light by the second wavelength shifter 355 and may be blocked by the second color filter 235. Green light into which the output light L1 has been converted by the second wavelength conversion pattern 350 may be transmitted through the second color filter 235 and emitted to the outside. Accordingly, third light Lc emitted out of the display device 1 through the second light transmitting region TA2 may be green light.

A second capping layer 393 may be disposed on the light transmission pattern 330, the first wavelength conversion pattern 340, and the second wavelength conversion pattern 350. The second capping layer 393 may cover the light transmission pattern 330, the first wavelength conversion pattern 340, and the second wavelength conversion pattern 350. The second capping layer 393 may contact the first capping layer 391 and seal the light transmission pattern 330, the first wavelength conversion pattern 340 and the second wavelength conversion pattern 350. Accordingly, it is possible to prevent impurities such as moisture or air from being introduced from the outside and damaging or contaminating the light transmission pattern 330, the first wavelength conversion pattern 340 and the second wavelength conversion pattern 350. In some embodiments, the second capping layer 393 may include an inorganic material. In some embodiments, the second capping layer 393 may include the same material as that of the first capping layer 391 or may include at least one of the materials mentioned in the description of the first capping layer 391. When both the first capping layer 391 and the second capping layer 393 include an inorganic material, a part where the first capping layer 391 and the second capping layer 393 directly contact each other may form an inorganic-inorganic bond and may effectively block introduction of moisture or air from the outside.

As illustrated in FIG. 5, the color mixing preventing member 370 may be disposed on the second capping layer 393. The color mixing preventing member 370 may be disposed in the light blocking region BA to block transmission of light. More specifically, the color mixing preventing member 370 may be disposed between the light transmission pattern 330 and the first wavelength conversion pattern 340 and between the first wavelength conversion pattern 340 and the second wavelength conversion pattern 350 to prevent color mixing between neighboring light transmitting regions. In some embodiments, the color mixing preventing member 370 may be shaped like a stripe extending along the second direction D2 (refer to FIG. 11) and may prevent color mixing between light transmitting regions neighboring each other along the first direction D1 (refer to FIG. 11).

In some embodiments, the color mixing preventing member 370 may include an organic light blocking material and may be provided by coating and exposing the organic light blocking material. In an embodiment, the color mixing preventing member 370 may include a dye or pigment having light blocking properties and may be a black matrix, for example.

The filler 70 may be disposed in the space between the color conversion substrate 30 and the display substrate 10 as described above. In some embodiments, the filler 70 may be disposed between the second capping layer 393 and the thin-film encapsulation layer 170 and between the color mixing preventing member 370 and the thin-film encapsulation layer 170 as illustrated in FIG. 5. In some embodiments, the filler 70 may directly contact the second capping layer 393 and the color mixing preventing member 370.

Figure 14:
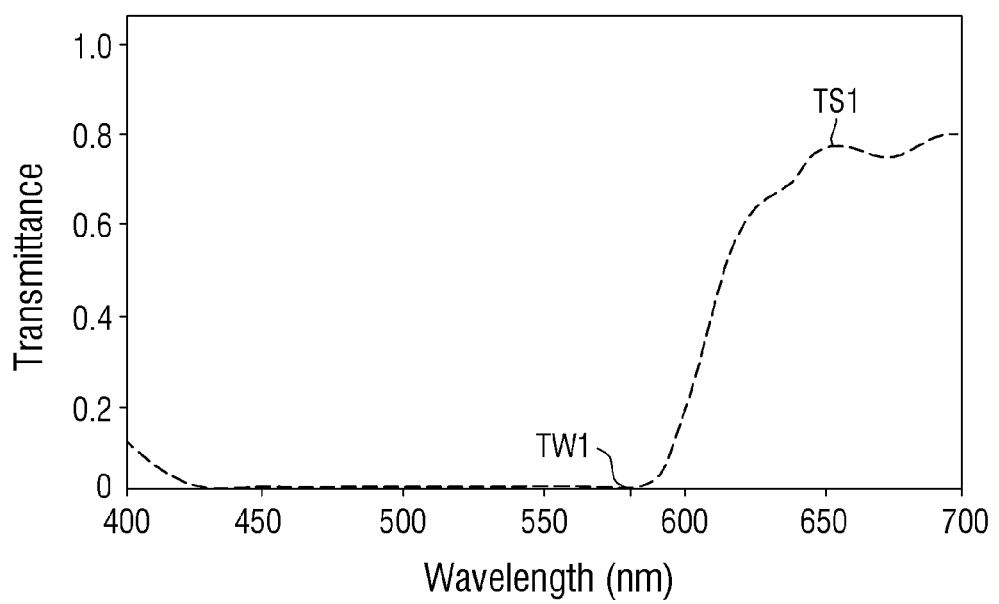
FIG. 14 illustrates a light transmission spectrum of a colorant of a second color included in the first color filter illustrated in FIG. 5.
Figure 15:
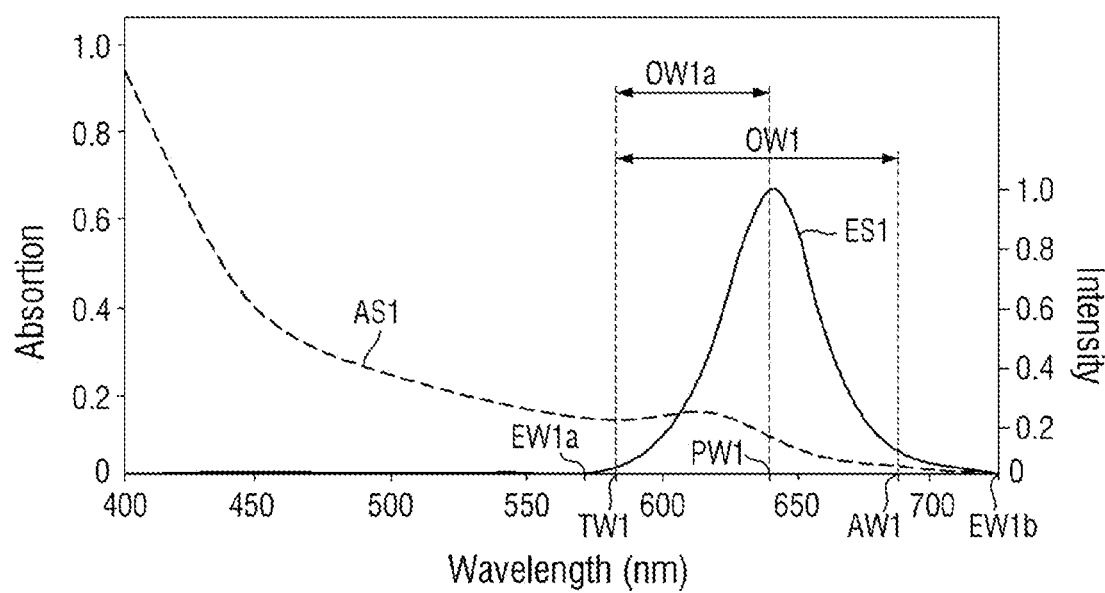
FIG. 15 illustrates an absorption spectrum and an emission spectrum of the first wavelength conversion pattern illustrated in FIG. 5.
Figure 16:
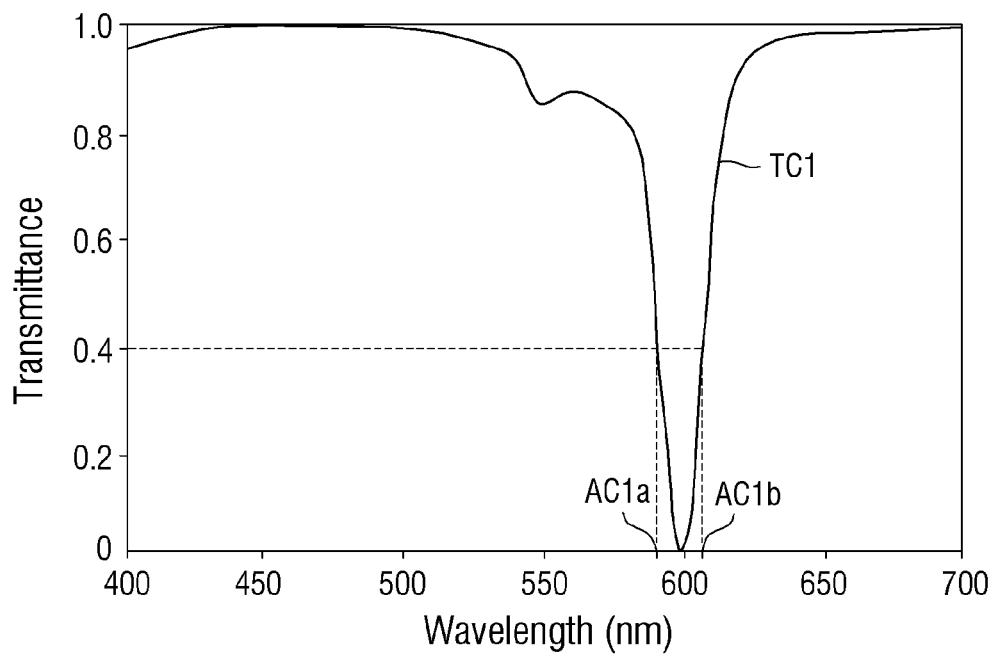
FIG. 16 illustrates an embodiment of light absorption spectrum of a first light absorbing colorant included in the first color filter illustrated in FIG. 5.
Figure 17:
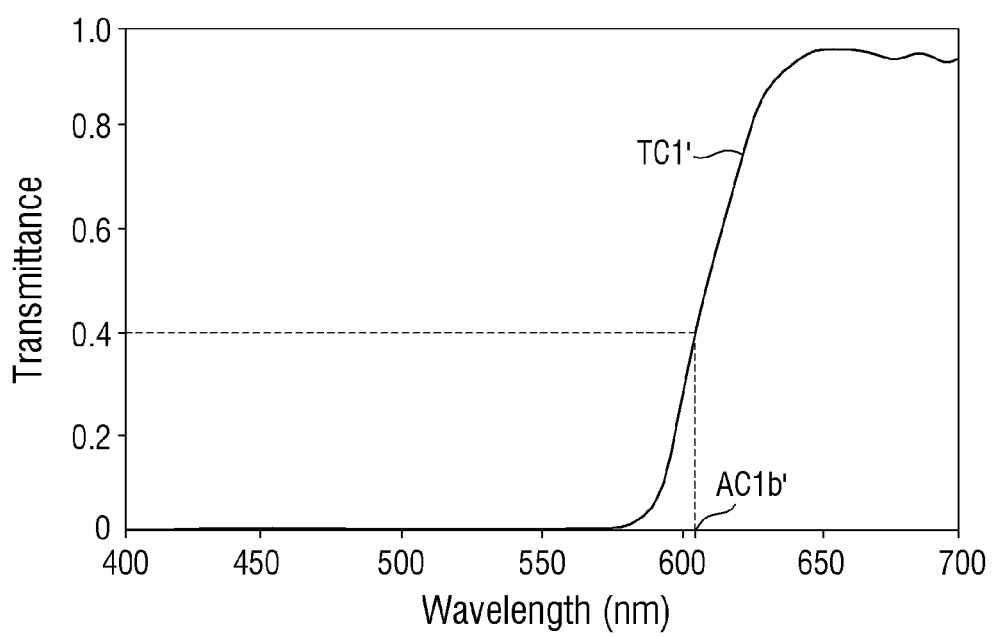
FIG. 17 illustrates an embodiment of light absorption spectrum of the first light absorbing colorant included in the first color filter illustrated in FIG. 5.

FIG. 14 illustrates a light transmission spectrum TS1 of the colorant 233*b* of the second color included in the first color filter 233 illustrated in FIG. 5. FIG. 15 illustrates an absorption spectrum AS1 and an emission spectrum ES1 of the first wavelength conversion pattern 340 illustrated in FIG. 5. FIG. 16 illustrates an embodiment of light absorption spectrum TC1 of the first light absorbing colorant ca1 included in the first color filter 233 illustrated in FIG. 5. FIG. 17 illustrates an embodiment of light absorption spectrum TC1' of the first light absorbing colorant ca1 included in the first color filter 233 illustrated in FIG. 5.

The following description will be given with reference to FIGS. 14 through 17 in addition to FIGS. 5 and 8.

The light transmission spectrum TS1 illustrated in FIG. 14 shows light transmitting characteristics or light absorbing characteristics of the colorant 233*b* of the second color included in the first color filter 233, more specifically, shows relative transmittance for each wavelength.

The colorant 233*b* of the second color may transmit light in a red wavelength band and absorb light in other wavelength bands. The colorant 233*b* of the second color may also transmit a component of a short wavelength region, for example, a component of a yellow light region among the light in the red wavelength band. In some embodiments, the colorant 233*b* of the second color may transmit light having a wavelength equal to or greater than a first absorption termination wavelength TW1 and absorb light having a wavelength less than the first absorption termination wavelength TW1. In some embodiments, the first absorption termination wavelength TW1 may be between about 550 nm and about 600 nm. In an embodiment, the first absorption termination wavelength TW1 may be about 570 nm to about 590 nm, for example.

In some embodiments, the colorant 233*b* of the second color absorbs light having a wavelength shorter than the first absorption termination wavelength TW1 but may transmit some light in the short wavelength region. In an embodiment, the colorant 233*b* of the second color may transmit light having a wavelength of less than about 430 nm, for example.

FIG. 15 illustrates the emission spectrum ES1 and the light absorption spectrum AS1 of the first wavelength conversion pattern 340 or the first wavelength shifter 345.

The light absorption spectrum AS1 shows light absorbing characteristics of the first wavelength conversion pattern 340 or the first wavelength shifter 345, more specifically, shows a relative light absorption rate for each wavelength. According to the light absorption spectrum AS1, the first wavelength conversion pattern 340 or the first wavelength shifter 345 may absorb light in a wavelength band shorter than a second absorption termination wavelength AW1 and convert the light into light having a relatively long wavelength.

The second absorption termination wavelength AW1 may be longer than the first absorption termination wavelength TW1 of the colorant 233b of the second color. That is, when external light is provided to the display device 1, light having a wavelength range between the first absorption termination wavelength TW1 of the colorant 233b of the second color and the second absorption termination wavelength AW1 of the first wavelength shifter 345 may be transmitted through the first color filter 233 and then provided to the first wavelength conversion pattern 340, and a portion of the light transmitted through the first color filter 233 may be absorbed by the first wavelength conversion pattern 340 or the first wavelength shifter 345. In addition, the first wavelength conversion pattern 340 or the first wavelength shifter 345 may convert the absorbed light into light having a relatively long wavelength, and the wavelength of the converted light may be a wavelength between a first emission initiation wavelength EW1a and a first emission termination wavelength EW1b of the emission spectrum ES1.

In other words, light in a first overlapping wavelength range OW1 in which the light absorption spectrum AS1 of the first wavelength conversion pattern 340 or the first wavelength shifter 345 overlaps the light transmission spectrum TS1 of the first color filter 233 may be transmitted through the first color filter 233 and absorbed by the first wavelength conversion pattern 340, and the absorbed light may be used for light emission of the first wavelength conversion pattern 340.

In an embodiment, as for light transmitted without being absorbed by the colorant 233b of the second color, that is, the light absorption spectrum AS1 in a range equal to or greater than the first absorption termination wavelength TW1, the light absorption spectrum AS1 may have maximum light absorbing characteristics in the range of about 590 nm to less than about 610 nm.

The emission spectrum ES1 shows emission characteristics of the first wavelength conversion pattern 340 or the first wavelength shifter 345, more specifically, shows relative light intensity for each wavelength. According to the emission spectrum ES1, the first wavelength conversion pattern 340 or the first wavelength shifter 345 may convert incident light into light having a longer wavelength than the incident light and emit the light having the longer wavelength. In some embodiments, the first wavelength conversion pattern 340 or the first wavelength shifter 345 may emit red light having a first peak wavelength PW1 which has the greatest intensity, and the first peak wavelength PW1 may be about 610 nm to about 650 nm as described above. In addition, the first wavelength conversion pattern 340 or the first wavelength shifter 345 may emit light between the first emission initiation wavelength EW1a and the first emission termination wavelength EW1b among light having wavelengths excluding the range of the first peak wavelength PW1. In some embodiments, the first emission initiation wavelength EW1a may be a wavelength in the range of about 550 nm to about 600 nm. In some embodiments, the first emission initiation wavelength EW1a may be a wavelength in the range of about 550 nm to less than the first absorption termination wavelength TW1. In some embodiments, the first emission termination wavelength EW1b may be equal to or greater than the second absorption termination wavelength AW1.

Of light in the first overlapping wavelength range OW1 in which the light absorption spectrum AS1 of the first wavelength shifter 345 overlaps the light transmission spectrum TS1 of the first color filter 233, light in a range less than the first peak wavelength PW1 of the emission spectrum ES1 may be referred to as light in a second overlapping wavelength range OW1a. The light in the second overlapping wavelength range OW1a may be converted into light having a relatively long wavelength by the first wavelength conversion pattern 340 or the first wavelength shifter 345, and the converted light may have the first peak wavelength PW1.

That is, of external light, light in the second overlapping wavelength range OW1a which is equal to or greater than the first absorption termination wavelength TW1 of the colorant 233b of the second color and less than the first peak wavelength PW1 of the first wavelength shifter 345 may be provided to the first wavelength conversion pattern 340 through the first color filter 233, and a portion of the light provided to the first wavelength conversion pattern 340 may be absorbed by the first wavelength conversion pattern 340. In addition, of the external light, the light absorbed by the first wavelength conversion pattern 340 may be wavelength-converted by the first wavelength shifter 345 into light having the first peak wavelength PW1 which has the greatest intensity and then may be emitted. That is, unintended light may be emitted from the first wavelength conversion pattern 340 due to the external light, which may be perceived by a user as reflection of the external light. Accordingly, display quality may be reduced.

In some embodiments, a wavelength range in which the light absorption spectrum AS1 has the maximum light absorbing characteristics in the range equal to or greater than the first absorption termination wavelength TW1 may be included in the second overlapping wavelength range OW1a.

In some embodiments, the second overlapping wavelength range OW1a may be from about 570 nm to less than about 650 nm or may be from about 590 nm to less than about 610 nm.

FIG. 16 illustrates the embodiment of light absorption spectrum TC1 of the first light absorbing colorant ca1 included in the first color filter 233, more specifically, illustrates the light absorption spectrum when the first light absorbing colorant ca1 is implemented as a dye.

In an embodiment, the first light absorbing colorant ca1 may absorb about 60 percent (%) or more of light between a first wavelength AC1a and a second wavelength AC1b, and a maximum absorption wavelength of the first light absorbing colorant ca1 may be included in a wavelength range between the first wavelength AC1a and the second wavelength AC1b.

In some embodiments, the wavelength range between the first wavelength AC1a and the second wavelength AC1b may be included in the second overlapping wavelength range OW1a or may be substantially the same as the second overlapping wavelength range OW1a.

In some embodiments, light in the wavelength range between the first wavelength AC1a and the second wavelength AC1b may be a short wavelength component of red light or may be yellow light.

The first light absorbing colorant ca1 may absorb light having a wavelength included in the second overlapping wavelength range OW1a among external light. Therefore, it is possible to prevent or suppress light emission of the first wavelength conversion pattern 340 due to the light in the second overlapping wavelength range OW1a among the external light. In some embodiments, the first wavelength AC1a may be about 590 nm, and the second wavelength AC1b may be about 610 nm. That is, in some embodiments, the first light absorbing colorant ca1 may absorb light having a wavelength of about 590 nm to less than about 610 nm.

FIG. 17 illustrates the embodiment of light absorption spectrum TC1' of the first light absorbing colorant ca1 included in the first color filter 233, more specifically, illustrates the light absorption spectrum when the first light absorbing colorant ca1 is implemented as a pigment.

In an embodiment, the first light absorbing colorant ca1 may absorb about 60% or more of light having a wavelength shorter than a third wavelength AC1b' and may absorb about 90% or more of light having a wavelength of about 570 nm or less. In some embodiments, the third wavelength AC1b' may be substantially the same as the first peak wavelength PW1. In some embodiments, the third wavelength AC1b' may be about 610 nm, and the first light absorbing colorant ca1 may absorb or block light having a wavelength of less than about 610 nm.

In some embodiments, the second overlapping wavelength range OW1a may be included in a wavelength range less than the third wavelength AC1b'.

The first light absorbing colorant ca1 may absorb light having a wavelength included in the second overlapping wavelength range OW1a among external light. Therefore, it is possible to prevent or suppress light emission of the first wavelength conversion pattern 340 due to the light in the second overlapping wavelength range OW1a among the external light.

In an embodiment, when the first light absorbing colorant ca1 includes a pigment, the first light absorbing colorant ca1 may also absorb a short wavelength component of light transmitted through the colorant 233b of the second color, for example, light of about 430 nm or less. Therefore, it is possible to prevent or suppress light emission of the first wavelength conversion pattern 340 due to the short wavelength component of the light transmitted through the colorant 233b of the second color.

In some embodiments, the first light absorbing colorant ca1 may be a magenta pigment or a magenta dye as described above.

Figure 18:
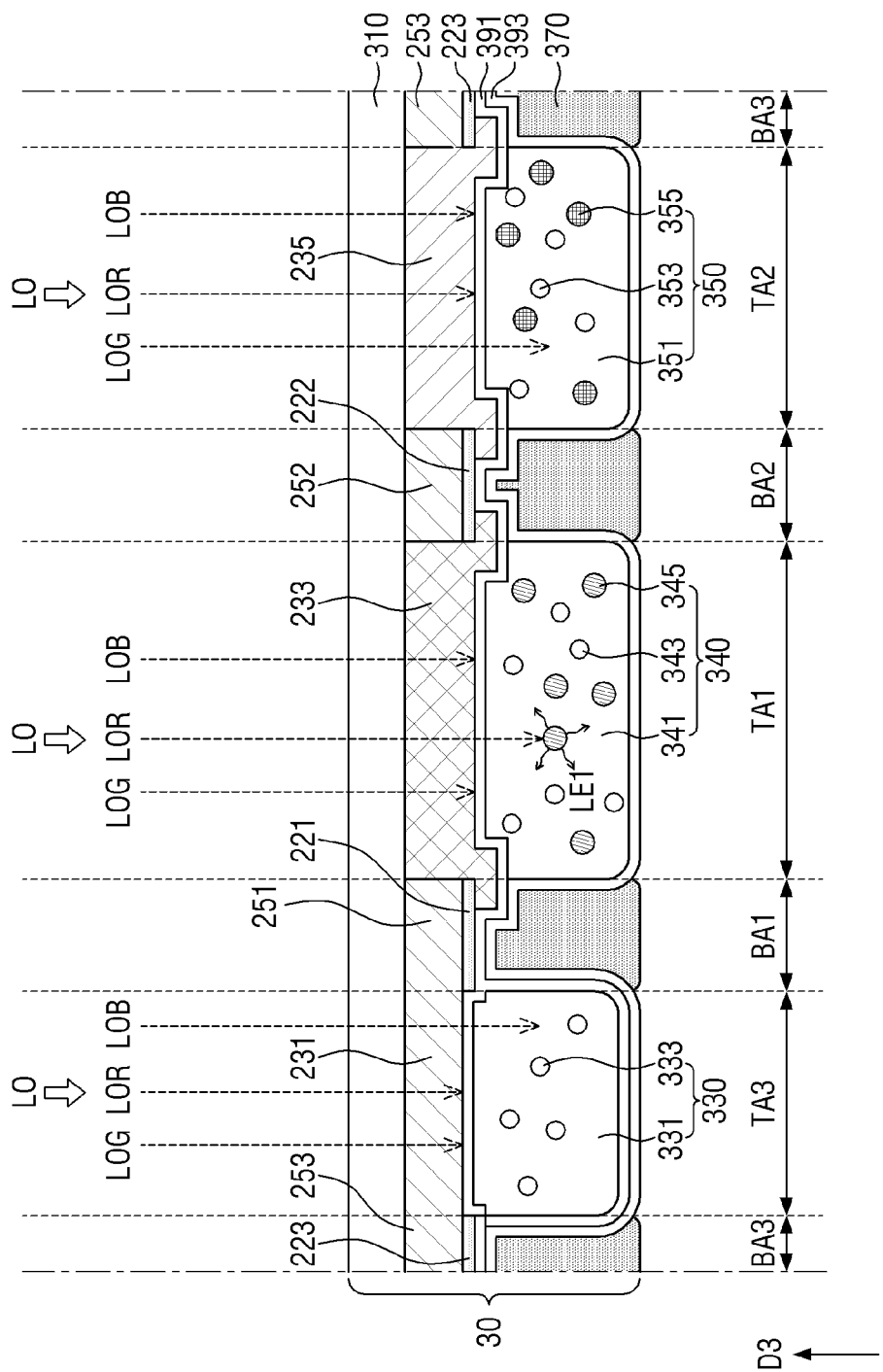
FIG. 18 is a view for explaining an embodiment of a function of the first light absorbing colorant in the display device.

FIG. 18 is a view for explaining an embodiment of a function of the first light absorbing colorant ca1 in the display device 1.

Referring to FIG. 18 in addition to FIGS. 14 through 17, external light LO may be provided to the color conversion substrate 30 as described above and may include a red light component LOR, a green light component LOG and a blue light component LOB.

Of the external light LO incident on the third light transmitting region TA3, the red light component LOR and the green light component LOG may be blocked by the third color filter 231. Of the external light LO incident on the third light transmitting region TA3, the blue light component LOB may pass through the third color filter 231 and enter the light transmission pattern 330.

Of the external light LO incident on the second light transmitting region TA2, the red light component LOR and the blue light component LOB may be blocked by the second color filter 235. Of the external light LO incident on the second light transmitting region TA2, the green light component LOG may pass through the second color filter 235 and enter the second wavelength conversion pattern 350.

Of the external light LO incident on the first light transmitting region TA1, the green light component LOG and the blue light component LOB may be blocked by the first color filter 233. Of the external light LO incident on the first light transmitting region TA1, the red light component LOR may pass through the first color filter 233 and enter the first wavelength conversion pattern 340.

As described above, a short wavelength band component of the red light component LOR or a yellow light region component of the red light component LOR may be transmitted through the first color filter 233 without being absorbed by the colorant 233b (refer to FIG. 8) of the second color. In addition, a portion of the red light component LOR provided to the first wavelength conversion pattern 340 without being absorbed by the colorant 233b (refer to FIG. 8) of the second color may be absorbed by the first wavelength conversion pattern 340 or the first wavelength shifter 345 and converted into light having a relatively long wavelength.

Of the red light component LOR incident on the first wavelength shifter 345, a wavelength component shorter than the first peak wavelength PW1 of the first wavelength shifter 345 may be wavelength-converted by the first wavelength shifter 345. Accordingly, unwanted light LE1 may be generated and emitted to the outside through the first light transmitting region TA1. When the unwanted light LE1 has the first peak wavelength PW1, the unwanted light LE1 may be easily perceived by a user. Therefore, the user may see not only reflected light of external light but also the light LE1 emitted to the outside through the first light transmitting region TA1. Consequently, display quality perceived by the user may be reduced due to reflection of the external light. Furthermore, the light LE1 emitted to the outside through the first light transmitting region TA1 is mixed with light emitted from other light transmitting regions to display an image. Therefore, the color quality of the displayed image may be reduced due to the color mixing.

In the illustrated embodiment, the first color filter 233 includes the first light absorbing colorant ca1 (refer to FIG. 8) in addition to the colorant 233b (refer to FIG. 8) of the second color. As described above, the first light absorbing colorant ca1 (refer to FIG. 8) may absorb or block light having a wavelength belonging to a wavelength band absorbed by the first wavelength conversion pattern 340 and shorter than the first peak wavelength PW1 of the first wavelength shifter 345 among light transmitted through the colorant 233b (refer to FIG. 8) of the second color. In particular, the first light absorbing colorant ca1 (refer to FIG. 8) may absorb or block light in a wavelength band absorbed to the maximum by the first wavelength conversion pattern 340 among the light transmitted through the colorant 233b (refer to FIG. 8) of the second color. Accordingly, it is possible to prevent or suppress generation of the unwanted light LE1 in the first wavelength shifter 345 due to external light, consequently improving the display quality of the display device 1.

Furthermore, of light into which the output light L1 (refer to FIG. 5) provided by the first light emitting element ED1 (refer to FIG. 5) has been converted by the first wavelength shifter 345, light having the first peak wavelength PW1 or greater may be provided to the outside without being absorbed by the colorant 233b (refer to FIG. 8) of the second color and the first light absorbing colorant ca1 (refer to FIG. 8) of the first color filter 233. Therefore, even when the first color filter 233 further includes the first light absorbing colorant ca1 (refer to FIG. 8), an image of desired quality may be displayed.

Figure 19:
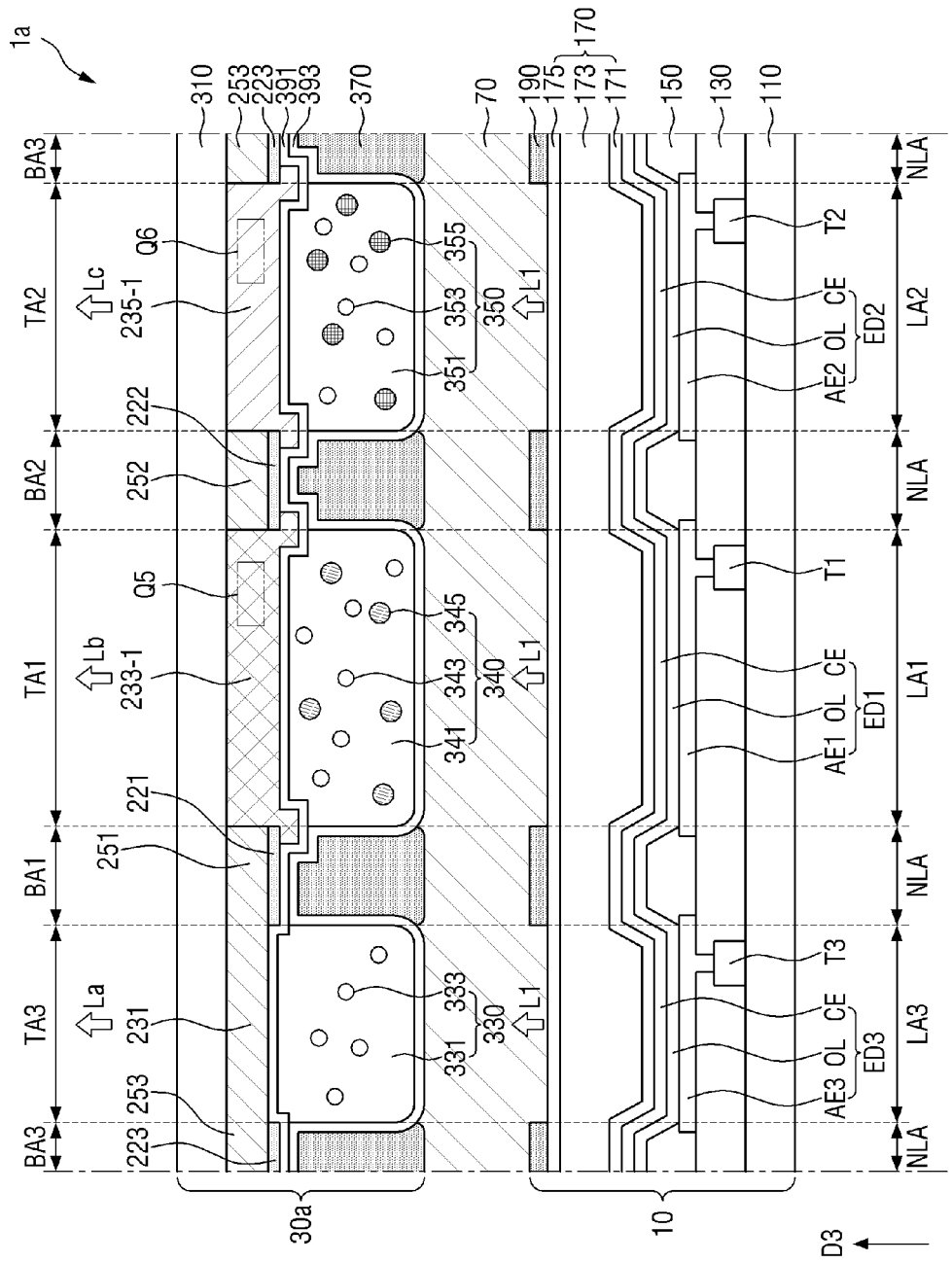
FIG. 19 is a cross-sectional view of an embodiment of a display device, taken along line X1-X1' of FIGS. 3 and 4.
Figure 20:
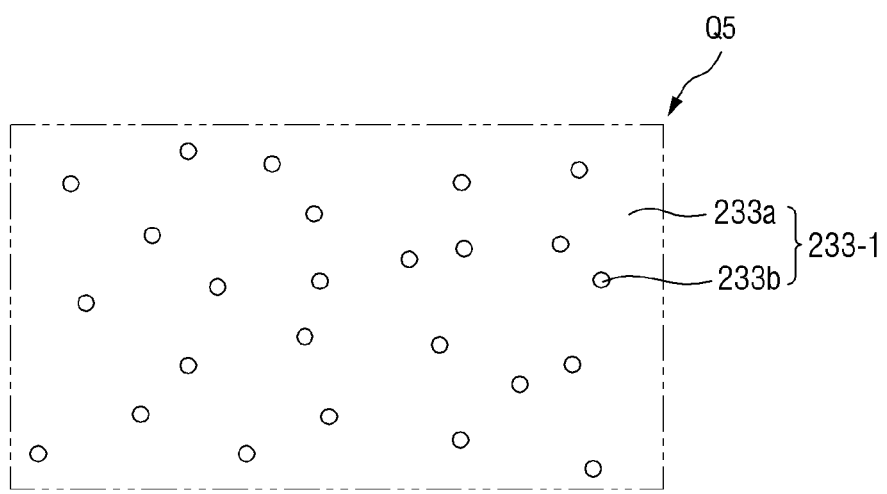
FIG. 20 is an enlarged cross-sectional view of part Q5 of FIG. 19.
Figure 21:
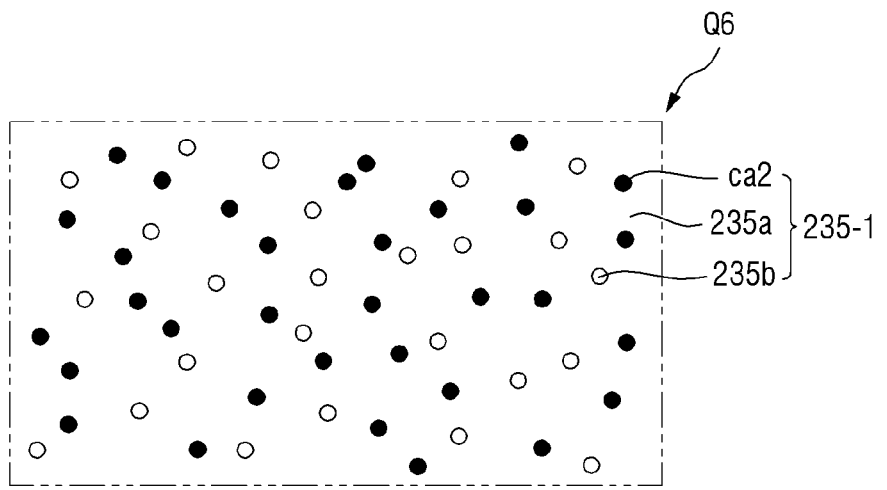
FIG. 21 is an enlarged cross-sectional view of part Q6 of FIG. 19.

FIG. 19 is a cross-sectional view of an embodiment of a display device 1a, taken along line X1-X1' of FIGS. 3 and 4. FIG. 20 is an enlarged cross-sectional view of part Q5 of FIG. 19. FIG. 21 is an enlarged cross-sectional view of part Q6 of FIG. 19.

Referring to FIGS. 19 through 21, the display device 1a in the illustrated embodiment includes a display substrate 10, a color conversion substrate 30a, and a filler 70. The display device 1a is substantially the same or similar to the embodiment of FIGS. 5 through 13 except for the configuration of the color conversion substrate 30a, in particular, except that the color conversion substrate 30a includes a first color filter 233-1 and a second color filter 235-1. Therefore, a redundant description will be omitted, and differences will be mainly described.

The first color filter 233-1 may transmit only light of the second color (e.g., red light) and block or absorb light of the first color (e.g., blue light) and light of the third color (e.g., green light). That is, in some embodiments, the first color filter 233-1 may be a red color filter.

In some embodiments, the first color filter 233-1 may include a base resin 233a and a colorant 233b of the second color disposed in the base resin 233a as illustrated in FIG. 20 and may not include a first light absorbing colorant ca1 (refer to FIG. 8) unlike the first color filter 233 (refer to FIG. 8) illustrated in FIG. 8.

The base resin 233a and the colorant 233b of the second color are the same as those described above in FIGS. 5 through 13, and thus a detailed description thereof is omitted.

The second color filter 235-1 may block or absorb light of the first color (e.g., blue light). That is, the second color filter 235-1 may also function as a blue light blocking filter. In some embodiments, the second color filter 235-1 may transmit only light of the third color (e.g., green light) and block or absorb light of the first color (e.g., blue light) and light of the second color (e.g., red light). That is, in some embodiments, the second color filter 235-1 may be a green color filter.

In some embodiments, the second color filter 235-1 may include a base resin 235a and a colorant 235b of the third color and a second light absorbing colorant ca2 disposed in the base resin 235a as illustrated in FIG. 21.

The base resin 235a and the colorant 235b of the third color are the same as those described above in FIGS. 5 through 13, and thus a detailed description thereof is omitted.

The second light absorbing colorant ca2 may be uniformly dispersed in the base resin 235a. The second light absorbing colorant ca2 may absorb or block a short wavelength component of light of the third color (e.g., green light) transmitted through the colorant 235b of the third color. In an alternative embodiment, the second light absorbing colorant ca2 may block or absorb a combination of a short wavelength component of light of the third color and light of the first color, for example, cyan light which is a combination of a short wavelength component of green light and blue light. In an embodiment, the second light absorbing colorant ca2 may be a cyan light absorbing colorant that absorbs cyan light, for example.

In some embodiments, the second light absorbing colorant ca2 may be a yellow colorant such as a yellow dye or a yellow pigment. In an embodiment, when the yellow colorant applied to the second light absorbing colorant ca2 is a yellow pigment, C.I. pigment yellow 138, C.I. pigment yellow 139, C.I. pigment yellow 150, C.I. pigment yellow 185, or the like may be applied as the yellow pigment among compounds classified as pigments in the C.I. (issued by the Society of Dyers and Colourists), for example.

The second light absorbing colorant ca2 may absorb or block a short wavelength component of green light which is not blocked by the colorant 235b of the third color among external light, thereby preventing or reducing the emission of light from a second wavelength conversion pattern 350 due to the external light. This will be described in more detail later.

Other elements of the color conversion substrate 30a are substantially the same as those described above in FIGS. 5 through 13, and thus a detailed description thereof is omitted.

Figure 22:
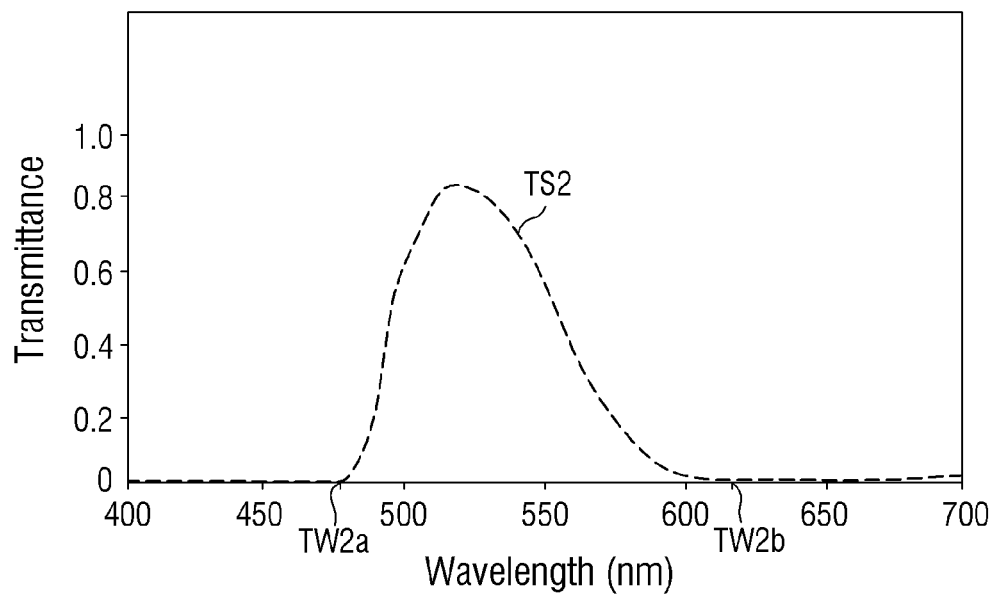
FIG. 22 illustrates a light transmission spectrum of a colorant of a third color included in a second color filter illustrated in FIG. 19.
Figure 23:
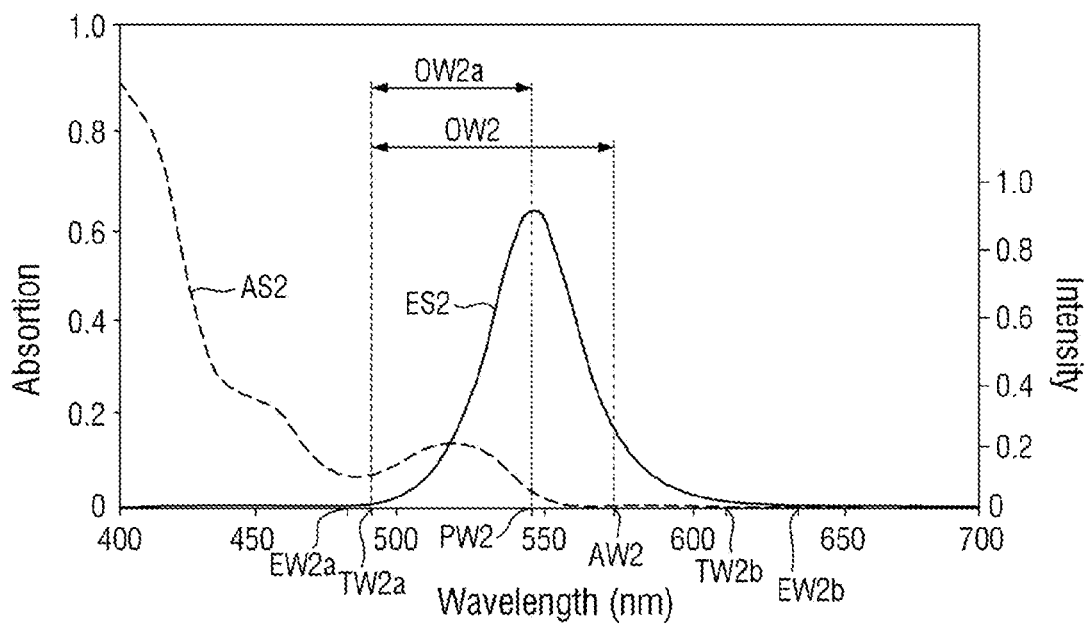
FIG. 23 illustrates an absorption spectrum and an emission spectrum of a second wavelength conversion pattern illustrated in FIG. 19.
Figure 24:
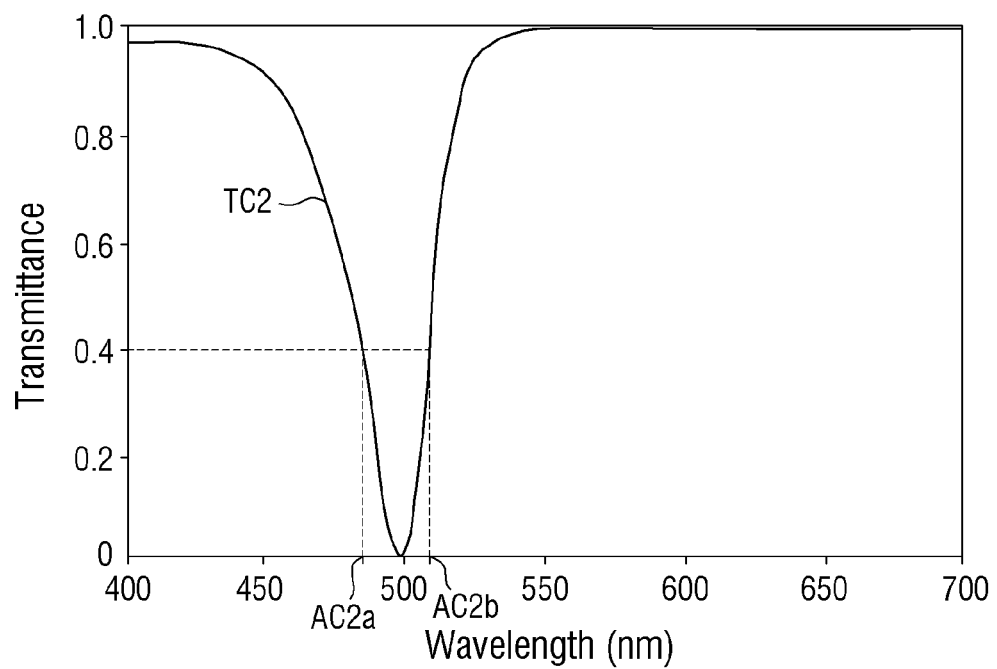
FIG. 24 illustrates an embodiment of light absorption spectrum of a second light absorbing colorant included in the second color filter illustrated in FIG. 19.
Figure 25:
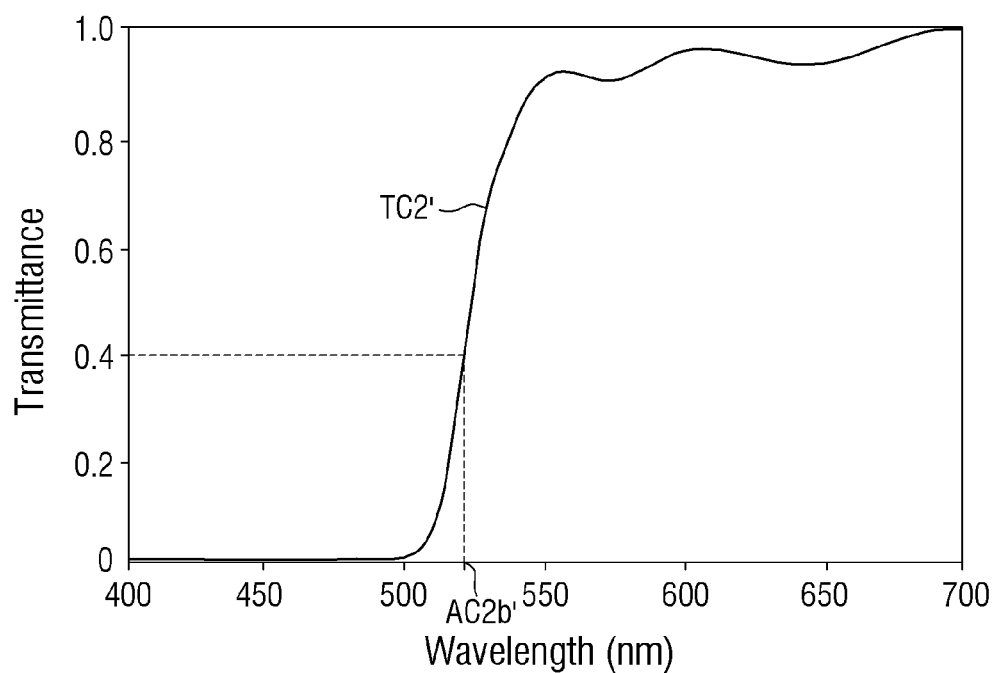
FIG. 25 illustrates an embodiment of light absorption spectrum of the second light absorbing colorant included in the second color filter illustrated in FIG. 19.

FIG. 22 illustrates a light transmission spectrum TS2 of the colorant 235b of the third color included in the second color filter 235-1 illustrated in FIG. 19. FIG. 23 illustrates an absorption spectrum AS2 and an emission spectrum ES2 of the second wavelength conversion pattern 350 illustrated in FIG. 19. FIG. 24 illustrates an embodiment of light absorption spectrum TC2 of the second light absorbing colorant ca2 included in the second color filter 235-1 illustrated in FIG. 19. FIG. 25 illustrates an embodiment of light absorption spectrum TC2' of the second light absorbing colorant ca2 included in the second color filter 235-1 illustrated in FIG. 19.

The following description will be given with reference to FIGS. 22 through 25 in addition to FIGS. 19 through 21.

The light transmission spectrum TS2 illustrated in FIG. 22 shows light transmitting characteristics or light absorbing characteristics of the colorant 235b of the third color included in the second color filter 235-1, more specifically, shows relative transmittance for each wavelength.

The colorant 235b of the third color may transmit light in a green wavelength band and absorb light in other wavelength bands. The colorant 235b of the third color may also transmit a component of a short wavelength region, for example, a component of a cyan light region among the light in the green wavelength band. In some embodiments, the colorant 235b of the third color may transmit light having a wavelength equal to or greater than a first transmission initiation wavelength TW2a and equal to or less than a first transmission termination wavelength TW2b and absorb light having a wavelength less than the first transmission initiation wavelength TW2a and light having a wavelength greater than the first transmission termination wavelength TW2b. In some embodiments, the first transmission initiation wavelength TW2a may be between about 450 nm and about 500 nm, and the first transmission termination wavelength TW2b may be between about 600 nm and about 650 nm.

In some embodiments, the first transmission initiation wavelength TW2a may be about 470 nm to about 490 nm, and the first transmission termination wavelength TW2b may be about 610 nm to about 630 nm.

FIG. 23 illustrates the emission spectrum ES2 and the light absorption spectrum AS2 of the second wavelength conversion pattern 350 or a second wavelength shifter 355.

The light absorption spectrum AS2 shows light absorbing characteristics of the second wavelength conversion pattern 350 or the second wavelength shifter 355, more specifically, shows a relative light absorption rate for each wavelength. According to the light absorption spectrum AS2, the second wavelength conversion pattern 350 or the second wavelength shifter 355 may absorb light in a wavelength band shorter than a third absorption termination wavelength AW2 and convert the light into light having a relatively long wavelength. The third absorption termination wavelength AW2 may be longer than the first transmission initiation wavelength TW2a of the colorant 235b of the third color and shorter than the first transmission termination wavelength TW2b. That is, when external light is provided to the display device 1a, light having a wavelength range between the first transmission initiation wavelength TW2a of the colorant 235b of the third color and the third absorption termination wavelength AW2 of the second wavelength shifter 355 may be transmitted through the second color filter 235-1 and then provided to the second wavelength conversion pattern 350, and a portion of the light transmitted through the second color filter 235-1 may be absorbed by the second wavelength conversion pattern 350 or the second wavelength shifter 355. In addition, the second wavelength conversion pattern 350 or the second wavelength shifter 355 may convert the absorbed light into light having a relatively long wavelength, and the wavelength of the converted light may be a wavelength between a second emission initiation wavelength EW2a and a second emission termination wavelength EW2b of the emission spectrum ES2.

In other words, light in a third overlapping wavelength range OW2 in which the light absorption spectrum AS2 of the second wavelength conversion pattern 350 or the second wavelength shifter 355 overlaps the light transmission spectrum TS2 of the second color filter 235-1 may be transmitted through the second color filter 235-1 and absorbed by the second wavelength conversion pattern 350, and the absorbed light may be used for light emission of the second wavelength conversion pattern 350. In an embodiment, as for light transmitted without being absorbed by the colorant 235b of the third color, that is, the light absorption spectrum AS2 in a range equal to or greater than the first transmission initiation wavelength TW2a, the light absorption spectrum AS2 may have maximum light absorbing characteristics in the range of about 490 nm to less than about 530 nm.

The emission spectrum ES2 shows emission characteristics of the second wavelength conversion pattern 350 or the second wavelength shifter 355, more specifically, shows relative light intensity for each wavelength. According to the emission spectrum ES2, the second wavelength conversion pattern 350 or the second wavelength shifter 355 may convert incident light into light having a longer wavelength than the incident light and emit the light having the longer wavelength. In some embodiments, the second wavelength conversion pattern 350 or the second wavelength shifter 355 may emit green light having the greatest intensity, i.e., green light having a second peak wavelength PW2, and the second peak wavelength PW2 may be about 530 nm to about 570 nm as described above. In addition, the second wavelength conversion pattern 350 or the second wavelength shifter 355 may emit light between the second emission initiation wavelength EW2a and the second emission termination wavelength EW2b among light having wavelengths excluding the range of the second peak wavelength PW2. In some embodiments, the second emission initiation wavelength EW2a may be a wavelength in the range of about 450 nm to about 470 nm. In some embodiments, the second emission initiation wavelength EW2a may be a wavelength in the range of about 450 nm to less than the first transmission initiation wavelength TW2a. In some embodiments, the second emission termination wavelength EW2b may be equal to or greater than the first transmission termination wavelength TW2b.

Of light in the third overlapping wavelength range OW2 in which the light absorption spectrum AS2 of the second wavelength shifter 355 overlaps the light transmission spectrum TS2 of the second color filter 235-1, light in a range less than the second peak wavelength PW2 of the emission spectrum ES2 may be referred to as light in a fourth overlapping wavelength range OW2a. The light in the fourth overlapping wavelength range OW2a may be converted into light having a relatively long wavelength by the second wavelength conversion pattern 350 or the second wavelength shifter 355, and the converted light may have the second peak wavelength PW2.

That is, of external light, light in the fourth overlapping wavelength range OW2a which is equal to or greater than the first transmission initiation wavelength TW2a of the colorant 235b of the third color and less than the second peak wavelength PW2 of the second wavelength shifter 355 may be provided to the second wavelength conversion pattern 350 through the second color filter 235-1. Of the external light, the light provided to the second wavelength conversion pattern 350 may be absorbed by the second wavelength conversion pattern 350. In addition, the light absorbed by the second wavelength conversion pattern 350 may be wavelength-converted by the second wavelength shifter 355 into light having the second peak wavelength PW2 which has the greatest intensity and then may be emitted. That is, unintended light may be emitted from the second wavelength conversion pattern 350 due to the external light, which may be perceived by a user as reflection of the external light. Accordingly, display quality may be reduced.

In some embodiments, a wavelength range in which the light absorption spectrum AS2 has the maximum light absorbing characteristics in the range equal to or greater than the first transmission initiation wavelength TW2a may be included in the fourth overlapping wavelength range OW2a.

In some embodiments, the fourth overlapping wavelength range OW2a may be from about 470 nm to less than about 550 nm or may be from about 490 nm to less than about 530 nm.

FIG. 24 illustrates the embodiment of light absorption spectrum TC2 of the second light absorbing colorant ca2 included in the second color filter 235-1, more specifically, illustrates the light absorption spectrum when the second light absorbing colorant ca2 is implemented as a dye.

In an embodiment, the second light absorbing colorant ca2 may absorb about 60% or more of light having a wavelength equal to or greater than a fourth wavelength AC2a and less than a fifth wavelength AC2b, and a maximum absorption wavelength of the second light absorbing colorant ca2 may be included in a wavelength range between the fourth wavelength AC2a and the fifth wavelength AC2b.

In some embodiments, the wavelength range between the fourth wavelength AC2a and the fifth wavelength AC2b may be included in the fourth overlapping wavelength range OW2a or may be substantially the same as the fourth overlapping wavelength range OW2a.

In some embodiments, light in the wavelength range between the fourth wavelength AC2a and the fifth wavelength AC2b may be a short wavelength component of green light or may be cyan light.

The second light absorbing colorant ca2 may absorb light having a wavelength included in the fourth overlapping wavelength range OW2a among external light. Therefore, it is possible to prevent or suppress light emission of the second wavelength conversion pattern 350 due to the light in the fourth overlapping wavelength range OW2a among the external light. In some embodiments, the fourth wavelength AC2a may be about 490 nm. In some embodiments, the fifth wavelength AC2b may be substantially the same as the second peak wavelength PW2, for example, may be about 530 nm. That is, in some embodiments, the second light absorbing colorant ca2 may absorb light having a wavelength of about 490 nm to less than about 530 nm.

FIG. 25 illustrates an embodiment of the light absorption spectrum TC2' of the second light absorbing colorant ca2 included in the second color filter 235-1, more specifically, illustrates the light absorption spectrum when the second light absorbing colorant ca2 is implemented as a pigment.

In an embodiment, the second light absorbing colorant ca2 may absorb about 60% or more of light having a wavelength shorter than a sixth wavelength AC2b' and may absorb about 90% or more of light having a wavelength of about 500 nm or less. In some embodiments, the sixth wavelength AC2b' may be substantially the same as the second peak wavelength PW2 and may be, for example, about 530 nm. That is, in some embodiments, the second light absorbing colorant ca2 may absorb or block light having a wavelength of less than about 530 nm.

In some embodiments, the fourth overlapping wavelength range OW2a may be included in a wavelength range less than the sixth wavelength AC2b'.

In some embodiments, the second light absorbing colorant ca2 may be a yellow colorant such as a yellow pigment or a yellow dye as described above.

Figure 26:
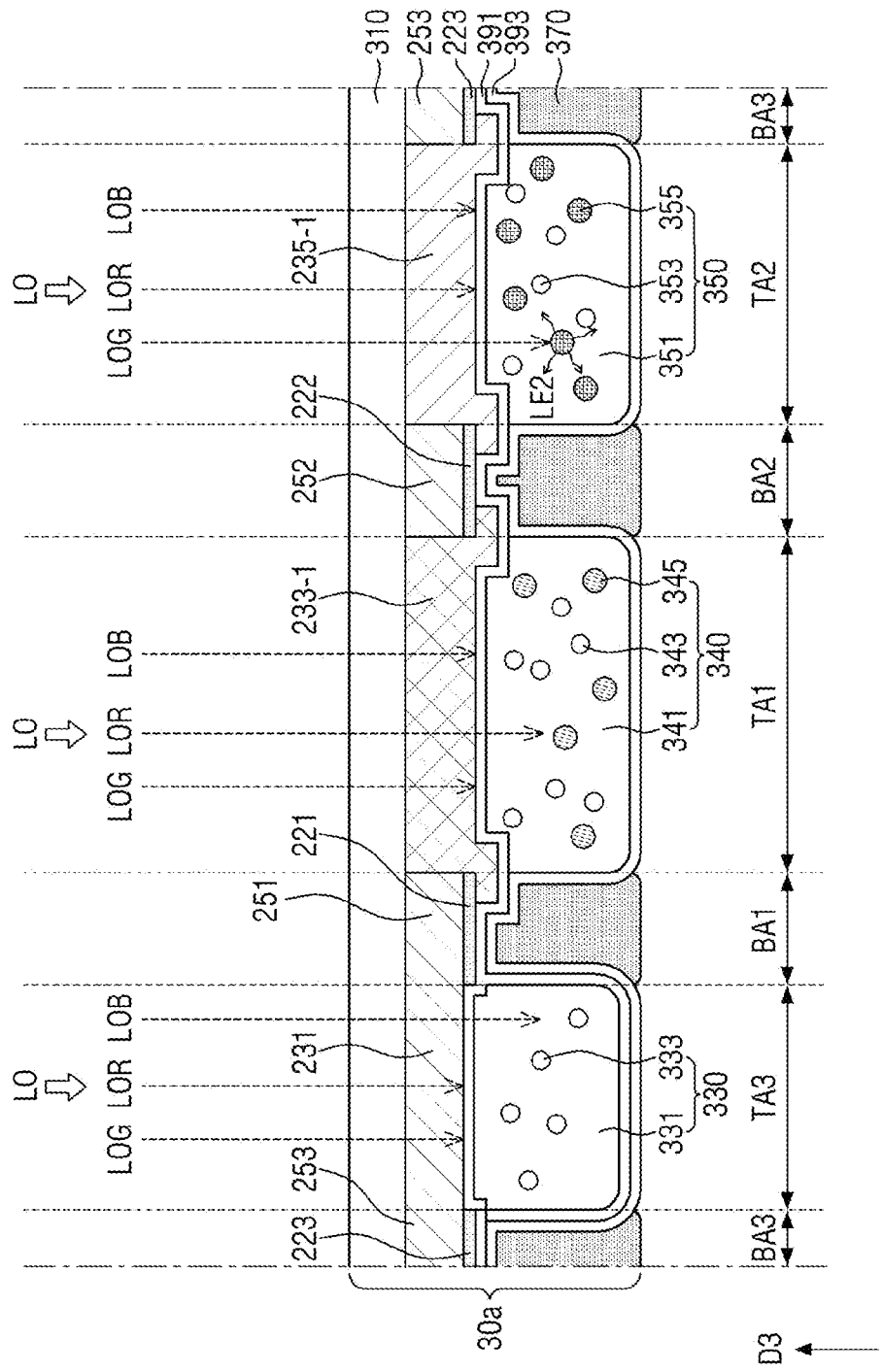
FIG. 26 is a view for explaining an embodiment of a function of the second light absorbing colorant in the display device of FIG. 19.

FIG. 26 is a view for explaining an embodiment of a function of the second light absorbing colorant ca2 in the display device 1a.

Referring to FIG. 26 in addition to FIGS. 19 through 25, external light LO may be provided to the color conversion substrate 30a as described above and may include a red light component LOR, a green light component LOG and a blue light component LOB.

Of the external light LO incident on a third light transmitting region TA3, the red light component LOR and the green light component LOG may be blocked by a third color filter 231. Of the external light LO incident on the third light transmitting region TA3, the blue light component LOB may pass through the third color filter 231 and enter a light transmission pattern 330.

Of the external light LO incident on a first light transmitting region TA1, the green light component LOG and the blue light component LOB may be blocked by the first color filter 233-1. Of the external light LO incident on the first light transmitting region TA1, the red light component LOR may pass through the first color filter 233-1 and enter a first wavelength conversion pattern 340.

Of the external light LO incident on a second light transmitting region TA2, the red light component LOR and the blue light component LOB may be blocked by the second color filter 235-1. Of the external light LO incident on the second light transmitting region TA2, the green light component LOG may pass through the second color filter 235-1 and enter the second wavelength conversion pattern 350.

As described above, a short wavelength band component of the green light component LOG or a cyan light region component of the green light component LOG may be transmitted through the second color filter 235-1 without being absorbed by the colorant 235b (refer to FIG. 21) of the third color of the second color filter 235-1. In addition, the green light component LOG provided to the second wavelength conversion pattern 350 without being absorbed by the colorant 235b (refer to FIG. 21) of the third color may be absorbed by the second wavelength conversion pattern 350 and used for light emission of the second wavelength shifter 355.

Of the green light component LOG incident on the second wavelength shifter 355, a wavelength component shorter than the second peak wavelength PW2 of the second wavelength shifter 355 may be wavelength-converted by the second wavelength shifter 355. Accordingly, unwanted light LE2 may be generated and emitted to the outside through the second light transmitting region TA2. When the unwanted light LE2 has the second peak wavelength PW2, the unwanted light LE2 may be easily perceived by a user.

Therefore, the user may see not only reflected light of external light but also the light LE2 emitted to the outside through the second light transmitting region TA2. Consequently, display quality perceived by the user may be reduced due to reflection of the external light. Furthermore, the light LE2 emitted to the outside through the second light transmitting region TA2 is mixed with light emitted from other light transmitting regions to display an image. Therefore, the color quality of the displayed image may be reduced due to the color mixing.

In the illustrated embodiment, the second color filter 235-1 includes the second light absorbing colorant ca2 (refer to FIG. 21) in addition to the colorant 235b (refer to FIG. 21) of the third color. As described above, the second light absorbing colorant ca2 (refer to FIG. 21) may absorb or block light having a wavelength band absorbed by the second wavelength conversion pattern 350 and having a wavelength shorter than the second peak wavelength PW2 of the second wavelength shifter 355 among light transmitted through the colorant 235b (refer to FIG. 21) of the third color. In particular, the second light absorbing colorant ca2 (refer to FIG. 21) may absorb or block light in a wavelength band absorbed to the maximum by the second wavelength conversion pattern 350 among the light transmitted through the colorant 235b (refer to FIG. 21) of the third color. Accordingly, it is possible to prevent or suppress generation of the unwanted light LE2 in the second wavelength shifter 355 due to external light, consequently improving the display quality of the display device 1a.

Furthermore, of light into which output light L1 (refer to FIG. 19) provided by a second light emitting element ED2 (refer to FIG. 19) has been converted by the second wavelength shifter 355, light having the second peak wavelength PW2 or greater may be provided to the outside without being absorbed by the colorant 235b (refer to FIG. 21) of the third color and the second light absorbing colorant ca2 (refer to FIG. 21) of the second color filter 235-1. Therefore, even when the second color filter 235-1 further includes the second light absorbing colorant ca2 (refer to FIG. 21), an image of desired quality may be displayed.

Figure 27:
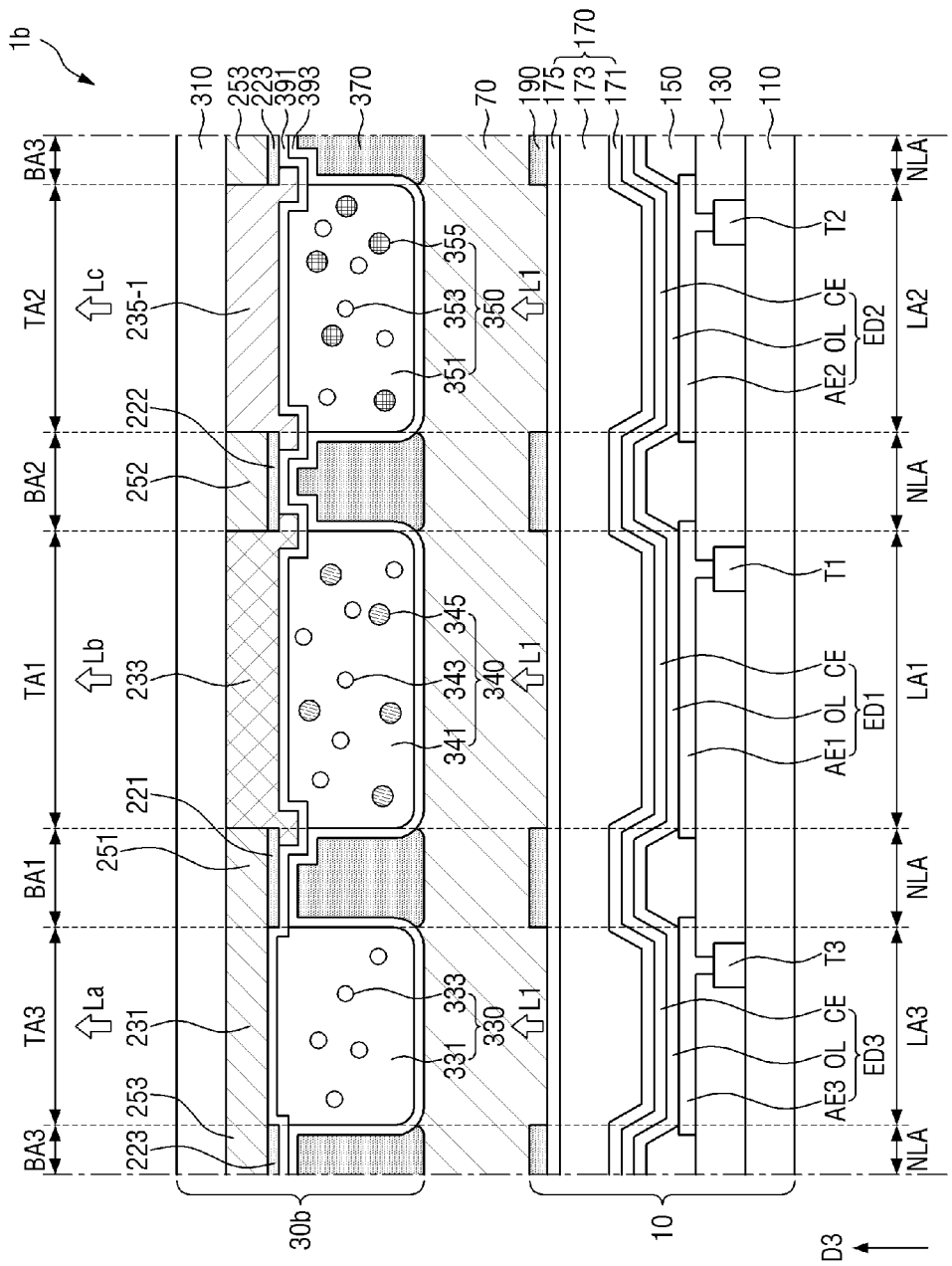
FIG. 27 is a cross-sectional view of an embodiment of a display device in an embodiment, taken along line X1-X1' of FIGS. 3 and 4.
Figure 28:
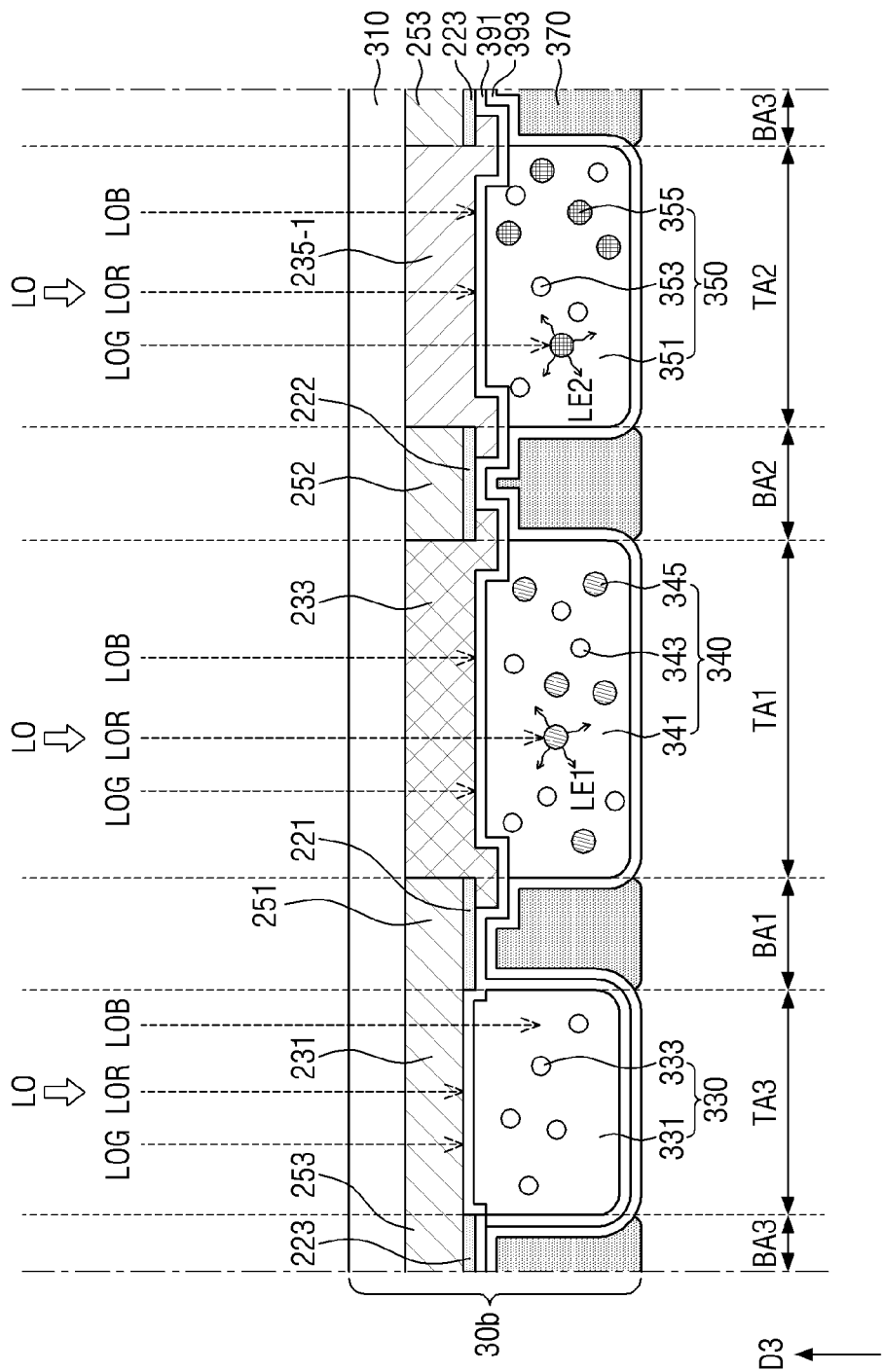
FIG. 28 is a view for explaining an embodiment of functions of a first light absorbing colorant and a second light absorbing colorant in the display device of FIG. 27.

FIG. 27 is a cross-sectional view of an embodiment of a display device 1b, taken along line X1-X1' of FIGS. 3 and 4. FIG. 28 is a view for explaining functions of a first light absorbing colorant ca1 and a second light absorbing colorant ca2 in the display device 1b.

Referring to FIGS. 27 and 28, the display device 1b in the illustrated embodiment includes a display substrate 10, a color conversion substrate 30b, and a filler 70. The display device 1b is substantially the same or similar to the embodiment of FIGS. 5 through 13 except for the configuration of the color conversion substrate 30b, in particular, except that the color conversion substrate 30b includes a first color filter 233 and a second color filter 235-1.

The first color filter 233 is substantially the same as that described above in FIGS. 5 through 17, and the second color filter 235-1 is substantially the same as that described above in FIGS. 19 through 25.

Other elements of the display device 1b are substantially the same as those described above in FIGS. 5 through 13, and thus a detailed description thereof will be omitted.

Referring to FIG. 28, in the color conversion substrate 30b in the illustrated embodiment, the first color filter 233 includes not only a base resin 233a (refer to FIG. 8) and a colorant 233b (refer to FIG. 8) of the second color but also the first light absorbing colorant ca1 (refer to FIG. 8). In addition, the second color filter 235-1 includes not only a base resin 235a (refer to FIG. 21) and a colorant 235b (refer to FIG. 21) of the third color but also the second light absorbing colorant ca2 (refer to FIG. 21).

Therefore, it is possible to prevent or suppress a first wavelength shifter 345 from emitting unwanted light LE1 in a first light transmitting region TA1 due to a red light component LOR of external light LO. In addition, it is possible to prevent or suppress a second wavelength shifter 355 from emitting unwanted light LE2 in a second light transmitting region TA2 due to a green light component LOG of the external light LO. Accordingly, display quality of the display device 1b may be further improved.

Figure 29:
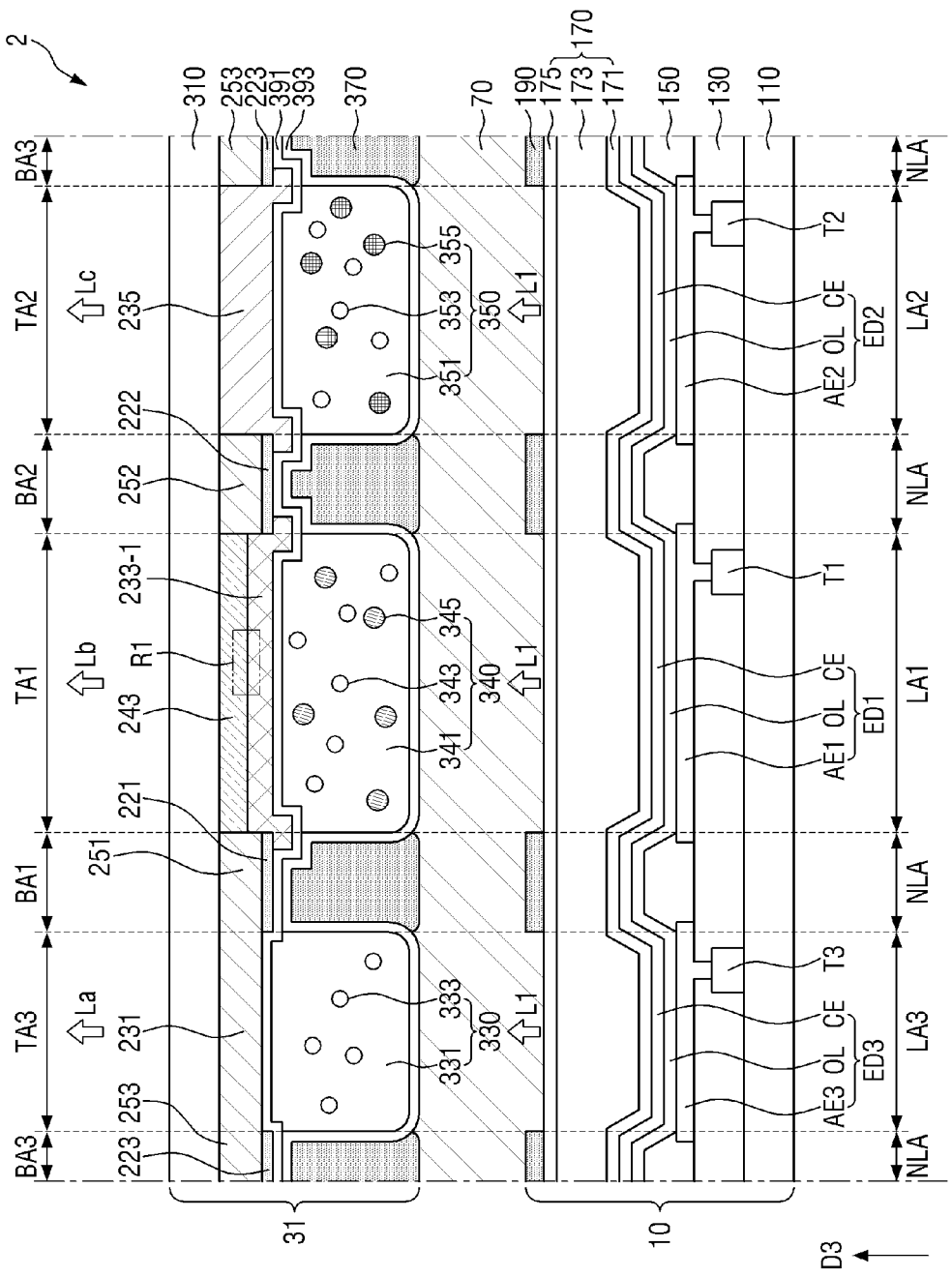
FIG. 29 is a cross-sectional view of an embodiment of a display device, taken along line X1-X1' of FIGS. 3 and 4.
Figure 30:
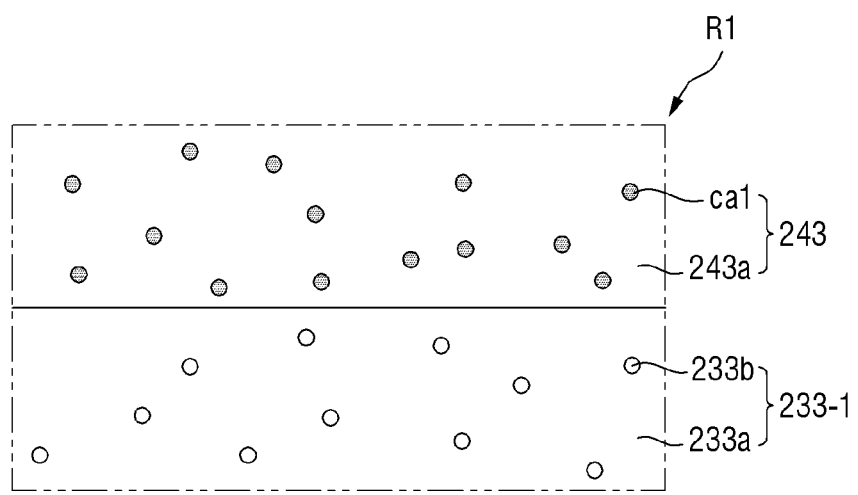
FIG. 30 is an enlarged cross-sectional view of part R1 of FIG. 29.

FIG. 29 is a cross-sectional view of an embodiment of a display device 2, taken along line X1-X1' of FIGS. 3 and 4. FIG. 30 is an enlarged cross-sectional view of part R1 of FIG. 29.

Referring to FIGS. 29 and 30, the display device 2 in the illustrated embodiment includes a display substrate 10, a color conversion substrate 31, and a filler 70. The display device 2 is substantially the same or similar to the embodiment of FIGS. 5 through 13 except for the configuration of the color conversion substrate 31, in particular, except that the color conversion substrate 31 includes a first color filter 233-1 and a first light absorbing layer 243. Therefore, a redundant description will be omitted, and differences will be mainly described.

The first color filter 233-1 may include a base resin 233a and a colorant 233b of the second color. The first color filter 233-1 is the same as that described above in FIGS. 5 through 13, and thus a more detailed description thereof is omitted.

The first light absorbing layer 243 may be disposed on a surface of a second base 310. In some embodiments, the first light absorbing layer 243 may overlap a first light transmitting region TA1 or a first light emitting region LA1 and may be disposed between the second base 310 and the first color filter 233-1. That is, the first color filter 233-1 may be disposed between a first wavelength conversion pattern 340 and the first light absorbing layer 243.

The first light absorbing layer 243 may include a base resin 243a and a first light absorbing colorant ca1 disposed in the base resin 243a.

In some embodiments, the base resin 243a may be an organic material and may be a photocurable resin. In some embodiments, the base resin 243a may be an organic material having light transmitting properties.

The first light absorbing colorant ca1 may be uniformly dispersed in the base resin 243a. The first light absorbing colorant ca1 may absorb or block a short wavelength component of red light that may be transmitted through the colorant 233b of the second color.

In some embodiments, the first light absorbing colorant ca1 may be a magenta colorant such as a magenta dye or a magenta pigment. The first light absorbing colorant ca1 may block or absorb a component of external light which may cause a first wavelength shifter 345 to emit light without being absorbed by the colorant 233b of the second color and the first wavelength conversion pattern 340. Accordingly, it is possible to prevent or suppress the first wavelength shifter 345 from emitting light in the first light transmitting region TA1 due to the external light.

Other details of the first light absorbing colorant ca1 are substantially the same or similar to those described above in FIGS. 5 through 18, and thus a description thereof is omitted.

Figure 31:
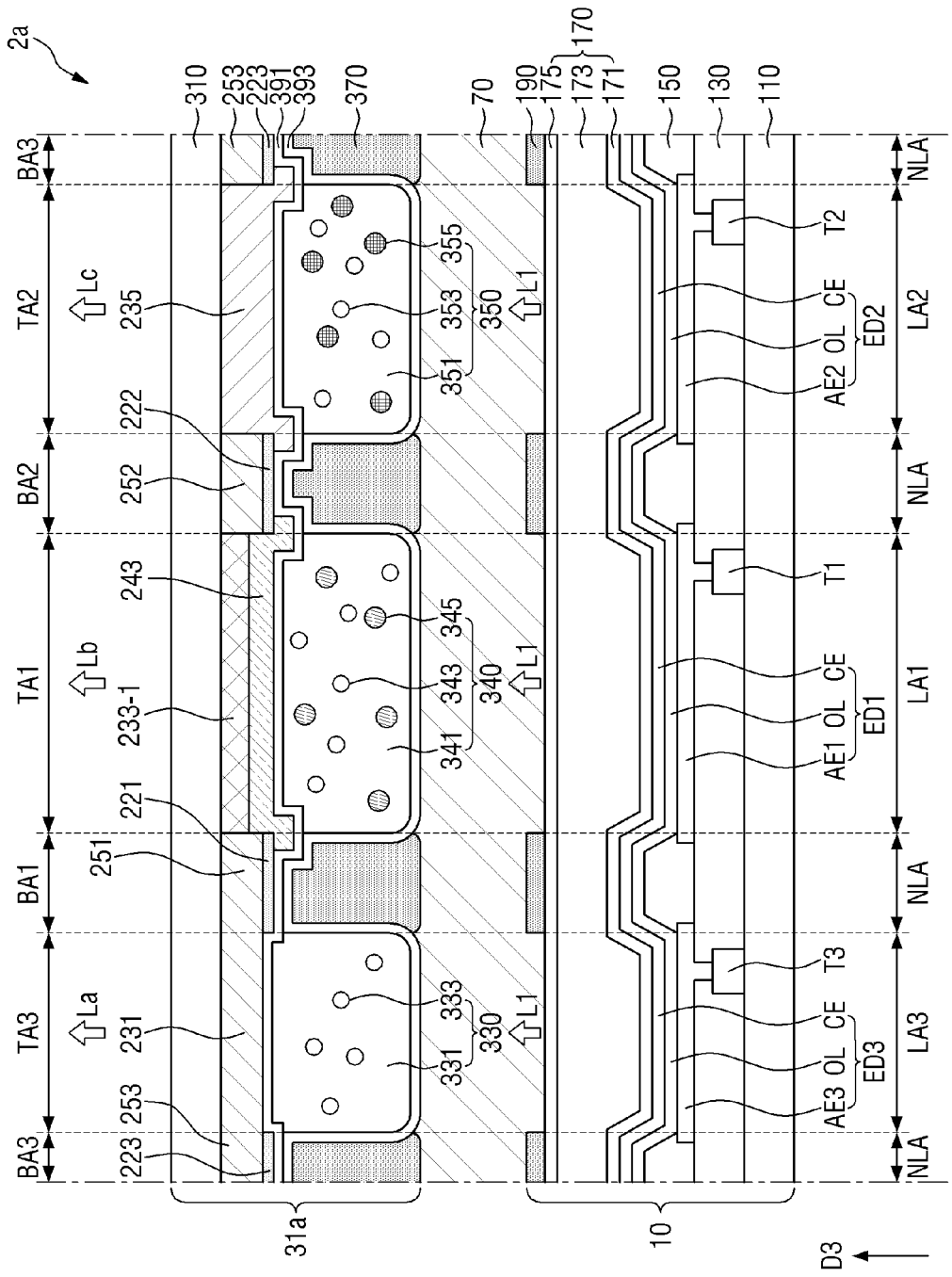
FIGS. 31 through 34 are respectively cross-sectional views of an embodiment of display device, taken along line X1-X1' of FIGS. 3 and 4.

FIG. 31 is a cross-sectional view of an embodiment of a display device 2a, taken along line X1-X1' of FIGS. 3 and 4.

Referring to FIG. 31, the display device 2a in the illustrated embodiment includes a display substrate 10, a color conversion substrate 31a, and a filler 70. The display device 2a is substantially the same or similar to the embodiment of FIGS. 29 and 30 except for the configuration of the color conversion substrate 31a, in particular, except that a first color filter 233-1 of the color conversion substrate 31a is disposed between a first light absorbing layer 243 and a second base 310, that the first light absorbing layer 243 is disposed between the first color filter 233-1 and a first wavelength conversion pattern 340, and that a portion of the first light absorbing layer 243 may overlap a first light blocking region BA1 and a second light blocking region BA2. Therefore, a detailed description is omitted.

Figure 32:
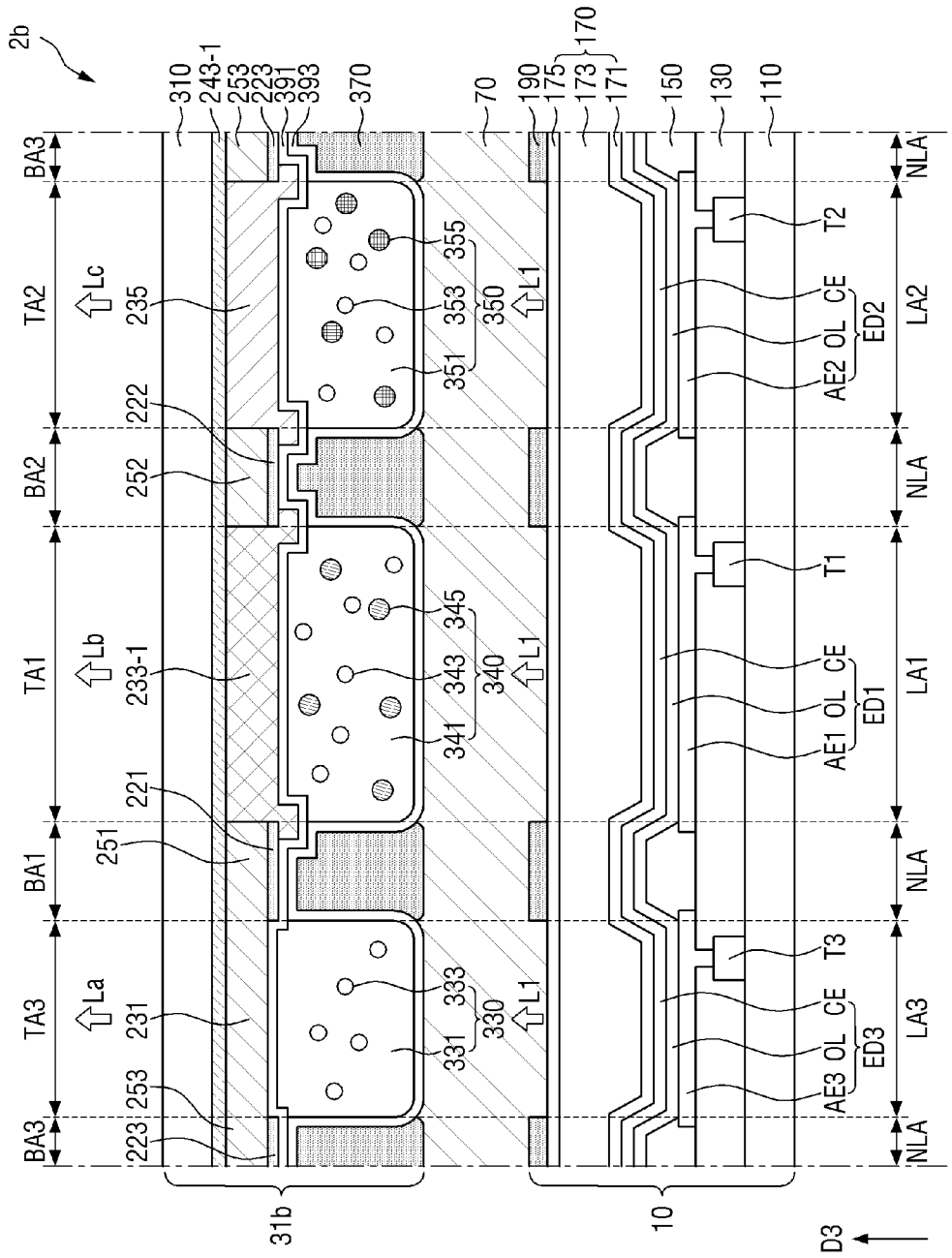

FIG. 32 is a cross-sectional view of a display device 2b in an embodiment, taken along line X1-X1' of FIGS. 3 and 4.

Referring to FIG. 32, the display device 2b in the illustrated embodiment includes a display substrate 10, a color conversion substrate 31b, and a filler 70. The display device 2b is substantially the same or similar to the embodiment of FIGS. 29 and 30 except for the configuration of the color conversion substrate 31b, in particular, except that a first light absorbing layer 243-1 of the color conversion substrate 31b is disposed over the whole of a surface of a second base 310. Therefore, a detailed description will be omitted, and differences will be mainly described.

The first light absorbing layer 243-1 may be disposed over the whole of the surface of the second base 310. That is, the first light absorbing layer 243-1 may be further disposed between a third color filter 231 and the second base 310 in a third light transmitting region TA3 and may be further disposed between a second color filter 235 and the second base 310 in a second light transmitting region TA2. That is, the third color filter 231 may be disposed between a light transmission pattern 330 and the first light absorbing layer 243-1 in the third light transmitting region TA3, and the second color filter 235 may be disposed between a second wavelength conversion pattern 350 and the first light absorbing layer 243-1 in the second light transmitting region TA2.

The first light absorbing layer 243-1 may be further disposed between a first color pattern 251 and the second base 310 in a first light blocking region BA1, may be further disposed between a second color pattern 252 and the second base 310 in a second light blocking region BA2, and may be further disposed between a third color pattern 253 and the second base 310 in a third light blocking region BA3.

The first light absorbing layer 243-1 includes a base resin 243a (refer to FIG. 30) and a first light absorbing colorant ca1 (refer to FIG. 30) as described above in the embodiment of FIGS. 29 and 30.

In some embodiments, the first light absorbing colorant ca1 (refer to FIG. 30) included in the first light absorbing layer 243-1 may be a dye, more specifically, a magenta dye.

When the first light absorbing colorant ca1 (refer to FIG. 30) included in the first light absorbing layer 243-1 is a magenta dye, it may have the light absorption spectrum TC1 (refer to FIG. 16) described above in FIG. 16 and may transmit light in a green wavelength band and light in a blue wavelength band.

Therefore, even when the first light absorbing layer 243-1 is disposed not only in a first light transmitting region TA1 but also in the second light transmitting region TA2 and the third light transmitting region TA3, green light which is third light Lc may be provided to the outside in the second light transmitting region TA2, and blue light which is first light La may be provided to the outside in the third light transmitting region TA3.

Figure 33:
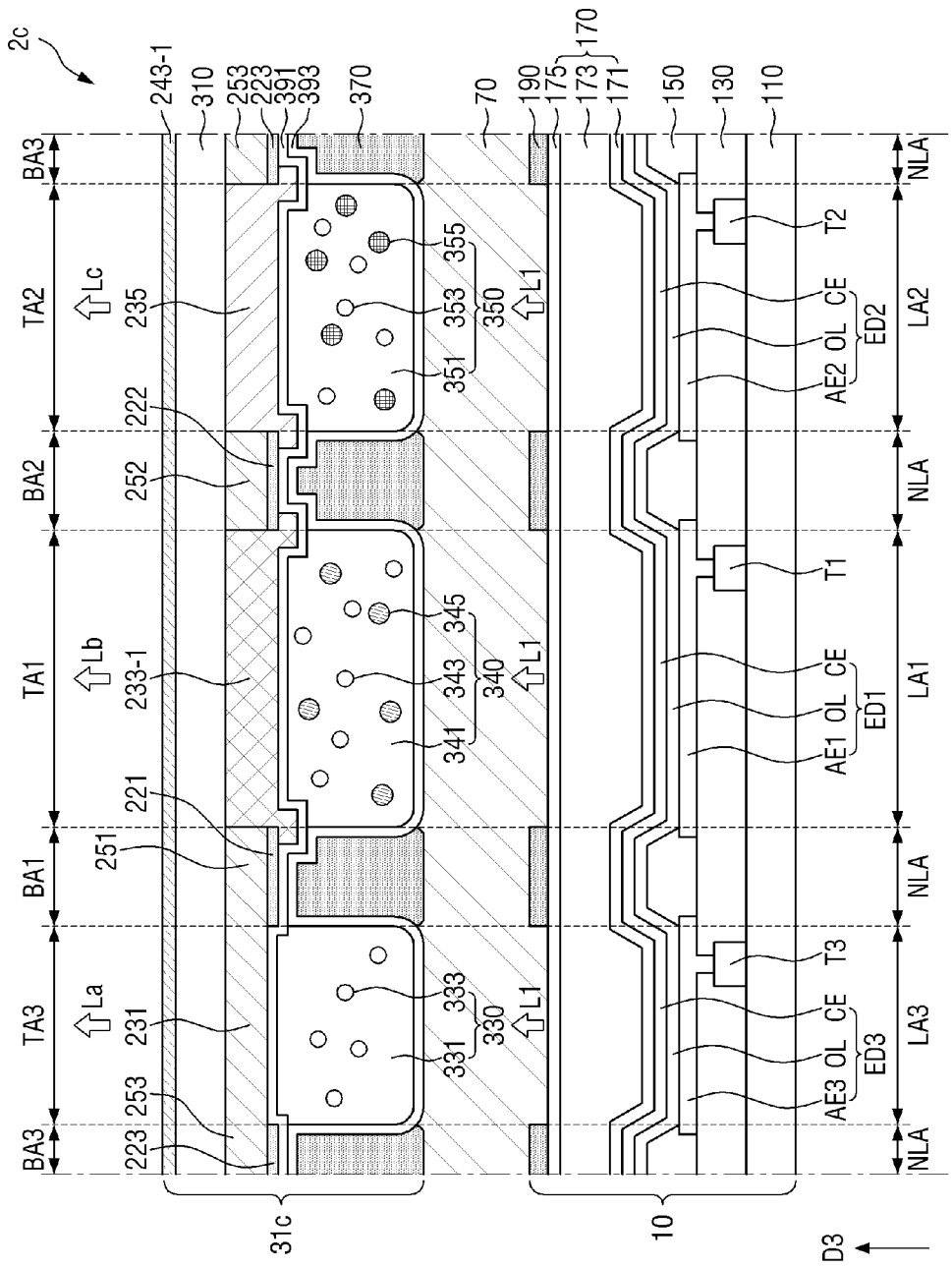

FIG. 33 is a cross-sectional view of an embodiment of a display device 2c, taken along line X1-X1' of FIGS. 3 and 4.

Referring to FIG. 33, the display device 2c in the illustrated embodiment includes a display substrate 10, a color conversion substrate 31c, and a filler 70. The display device 2c is different from the embodiment of FIG. 32 in the configuration of the color conversion substrate 31c, in particular, in that a first light absorbing layer 243-1 of the color conversion substrate 31c is disposed over the whole of the other surface of a second base 310. Here, the other surface of the second base 310 denotes a surface opposite a surface of the second base 310 on which a first color filter 233-1 is disposed. A description of each element of the display device 2c, in particular, a detailed description of the first light absorbing layer 243-1 is the same as the description given above in the embodiment of FIG. 32 and thus omitted.

Figure 34:
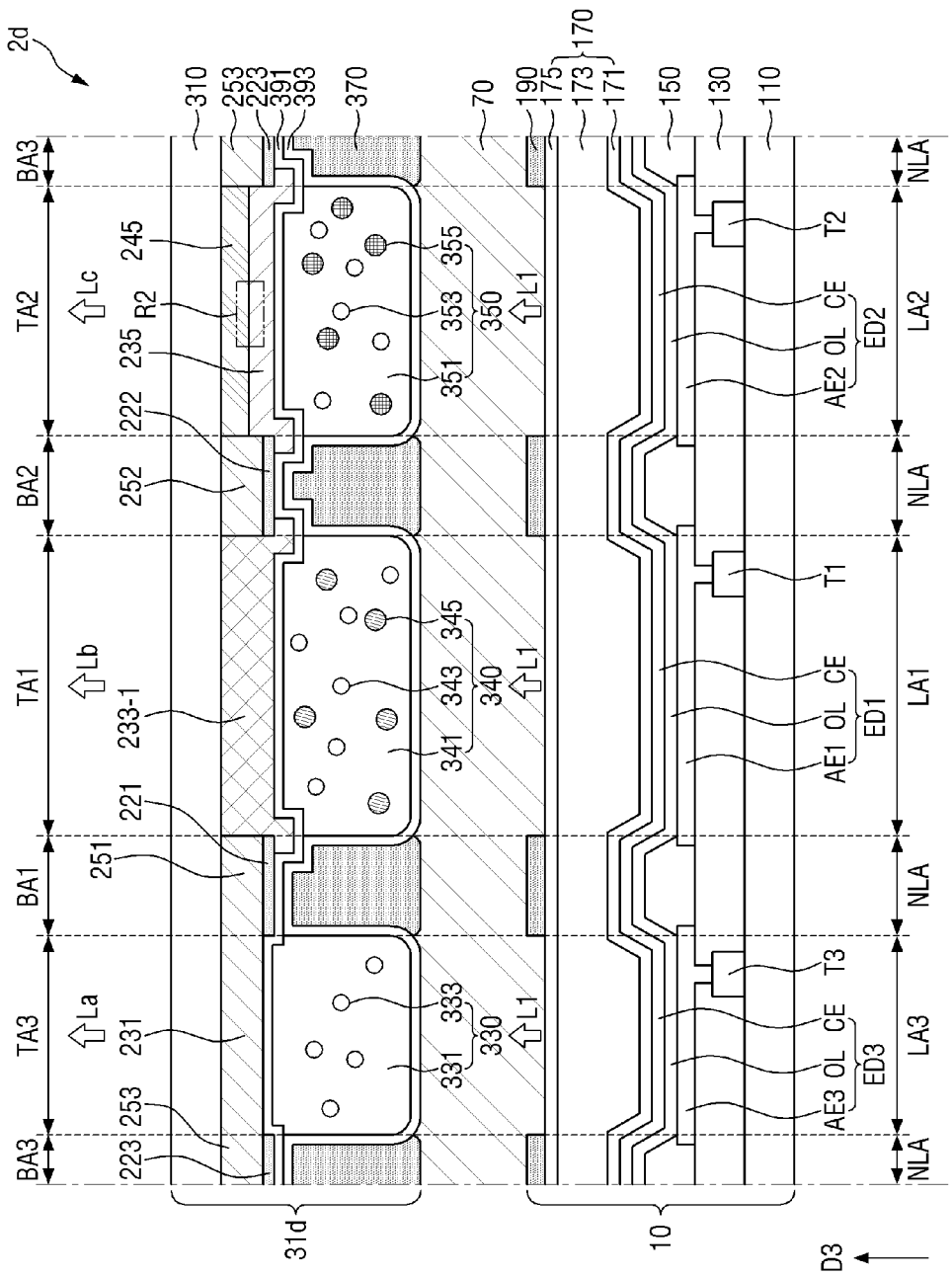
Figure 35:
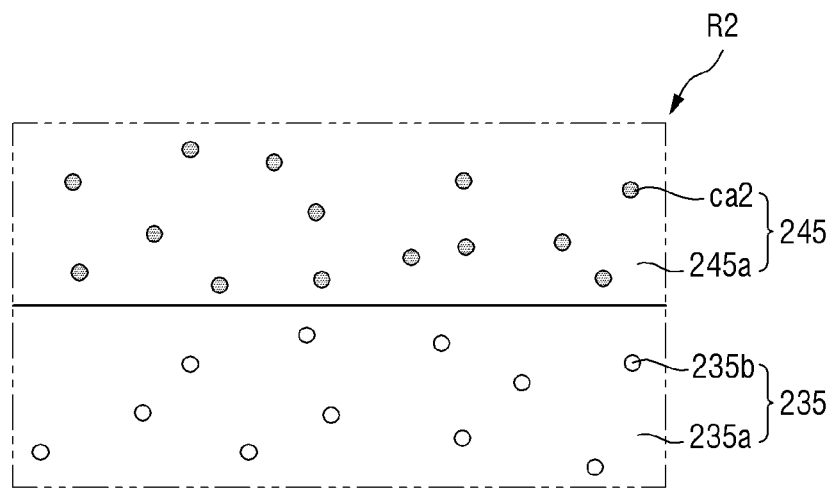
FIG. 35 is an enlarged cross-sectional view of part R2 of FIG. 34.

FIG. 34 is a cross-sectional view of an embodiment of a display device 2d, taken along line X1-X1' of FIGS. 3 and 4. FIG. 35 is an enlarged cross-sectional view of part R2 of FIG. 34.

Referring to FIGS. 34 and 35, the display device 2d in the illustrated embodiment includes a display substrate 10, a color conversion substrate 31d, and a filler 70. The display device 2d is substantially the same or similar to the embodiment of FIGS. 19 through 26 except for the configuration of the color conversion substrate 31d, in particular, except that the color conversion substrate 31d includes a second color filter 235 and a second light absorbing layer 245. Therefore, a redundant description will be omitted, and differences will be mainly described.

The second color filter 235 may include a base resin 235a and a colorant 235b of the third color. The second color filter 235 is the same as that described above in FIGS. 19 through 26, and thus a more detailed description thereof is omitted.

The second light absorbing layer 245 may be disposed on a surface of a second base 310. In some embodiments, the second light absorbing layer 245 may overlap a second light transmitting region TA2 or a second light emitting region LA2 and may be disposed between the second base 310 and the second color filter 235.

The second light absorbing layer 245 may include a base resin 245a and a second light absorbing colorant ca2 disposed in the base resin 245a.

In some embodiments, the base resin 245a may be an organic material and may be a photocurable resin. In some embodiments, the base resin 245a may be an organic material having light transmitting properties.

The second light absorbing colorant ca2 may be uniformly dispersed in the base resin 245a. The second light absorbing colorant ca2 may absorb or block a short wavelength component of red light that may be transmitted through the colorant 235b of the third color.

In some embodiments, the second light absorbing colorant ca2 may be a yellow colorant such as a yellow dye or a yellow pigment. The second light absorbing colorant ca2 may block or absorb a component of external light which may cause a second wavelength shifter 355 to emit light without being absorbed by the colorant 235b of the third color and a second wavelength conversion pattern 350. Accordingly, it is possible to prevent or suppress the second wavelength shifter 355 from emitting light in the second light transmitting region TA2 due to the external light.

Other details of the second light absorbing colorant ca2 and the function of the second light absorbing colorant ca2 are substantially the same or similar to those described above in FIGS. 19 through 26, and thus a description thereof is omitted.

Figure 36:
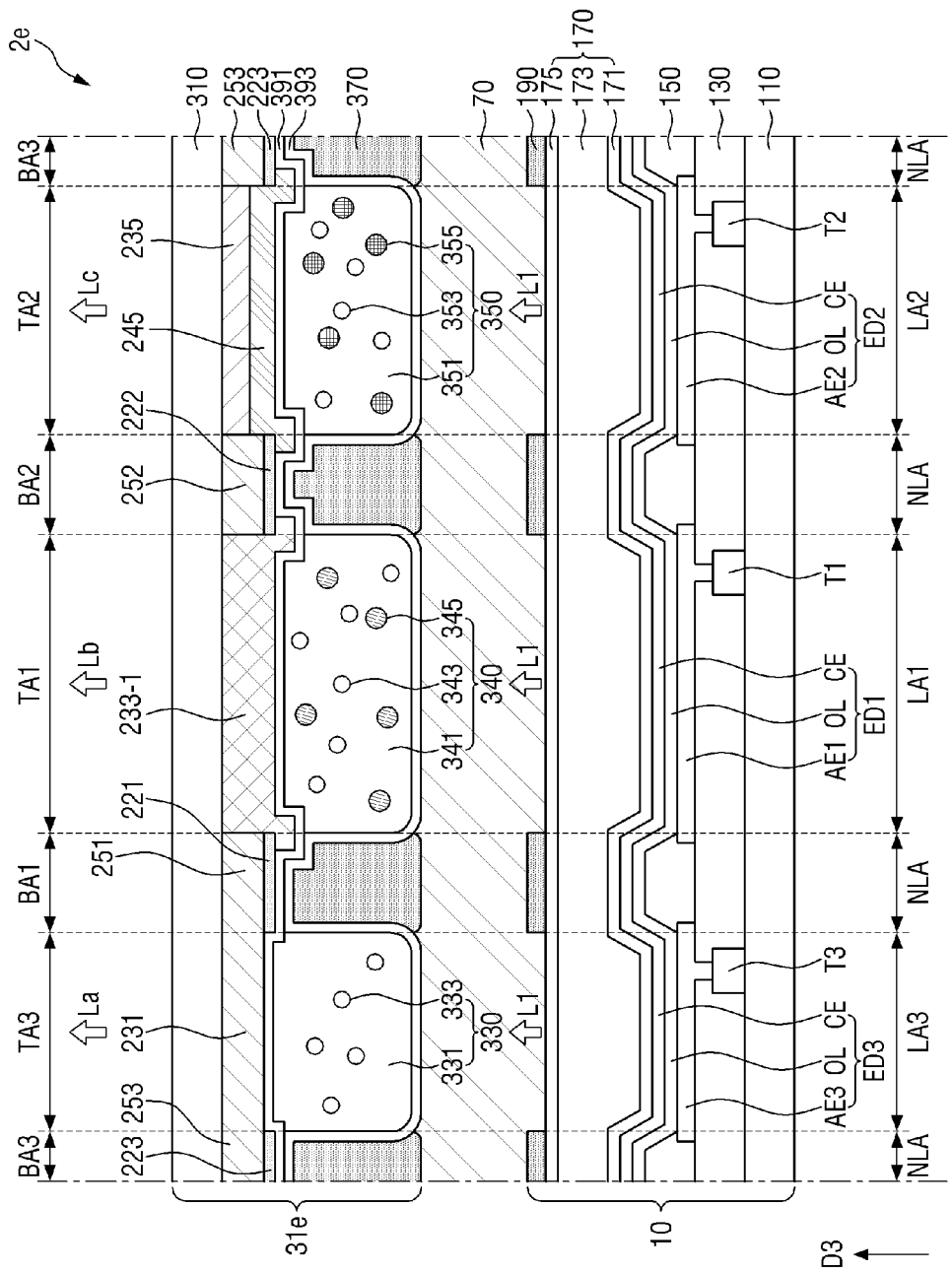
FIGS. 36 through 40 are respectively cross-sectional views of embodiments of display devices, taken along line X1-X1' of FIGS. 3 and 4.

FIG. 36 is a cross-sectional view of an embodiment of a display device 2e, taken along line X1-X1' of FIGS. 3 and 4.

Referring to FIG. 36, the display device 2e in the illustrated embodiment includes a display substrate 10, a color conversion substrate 31e, and a filler 70. The display device 2e is substantially the same or similar to the embodiment of FIGS. 34 and 35 except for the configuration of the color conversion substrate 31e, in particular, except that a second color filter 235 of the color conversion substrate 31e is disposed between a second light absorbing layer 245 and a second base 310 and that a portion of the second light absorbing layer 245 may overlap a second light blocking region BA2 and a third light blocking region BA3. Therefore, a detailed description is omitted.

Figure 37:
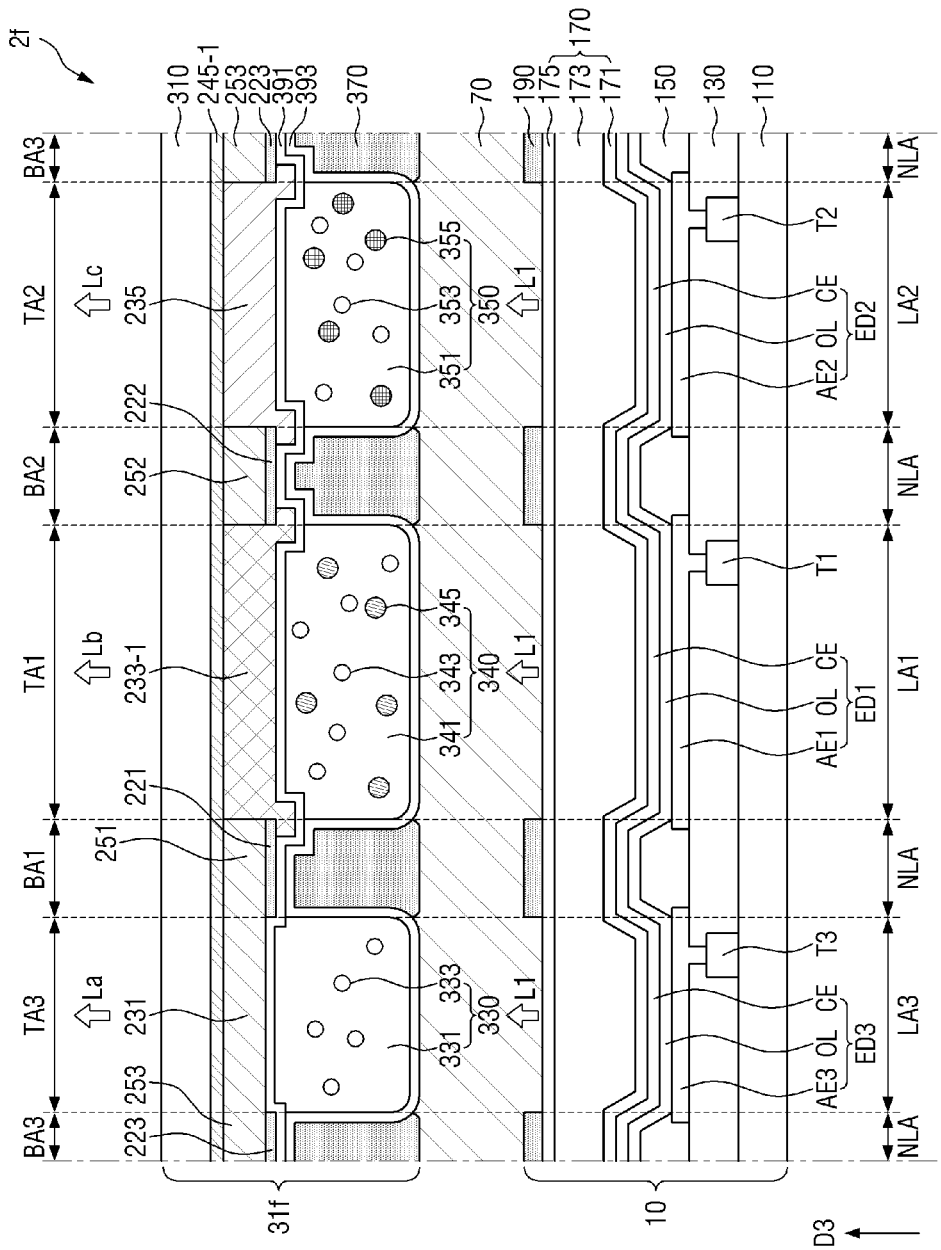

FIG. 37 is a cross-sectional view of a display device 2f in an embodiment, taken along line X1-X1' of FIGS. 3 and 4.

Referring to FIG. 37, the display device 2f in the illustrated embodiment includes a display substrate 10, a color conversion substrate 31f, and a filler 70. The display device 2f is substantially the same or similar to the embodiment of FIGS. 34 and 35 except for the configuration of the color conversion substrate 31f, in particular, except that a second light absorbing layer 245-1 of the color conversion substrate 31f is disposed over the whole of a surface of a second base 310. Therefore, a detailed description will be omitted, and differences will be mainly described.

The second light absorbing layer 245-1 may be disposed over the whole of the surface of the second base 310. That is, the second light absorbing layer 245-1 may be further disposed between a third color filter 231 and the second base 310 in a third light transmitting region TA3 and may be further disposed between a first color filter 233-1 and the second base 310 in a first light transmitting region TA1. In addition, the second light absorbing layer 245-1 may be further disposed between a first color pattern 251 and the second base 310 in a first light blocking region BA1, may be further disposed between a second color pattern 252 and the second base 310 in a second light blocking region BA2, and may be further disposed between a third color pattern 253 and the second base 310 in a third light blocking region BA3.

The second light absorbing layer 245-1 includes a base resin 245a (refer to FIG. 35) and a second light absorbing colorant ca2 (refer to FIG. 35) as described above in the embodiment of FIGS. 34 and 35.

In some embodiments, the second light absorbing colorant ca2 (refer to FIG. 35) included in the second light absorbing layer 245-1 may be a dye, more specifically, a yellow dye.

When the second light absorbing colorant ca2 (refer to FIG. 35) included in the second light absorbing layer 245-1 is a yellow dye, it may have the light absorption spectrum TC2 (refer to FIG. 24) described above in FIG. 24 and may transmit light in a red wavelength band and light in a blue wavelength band.

Therefore, even when the second light absorbing layer 245-1 is disposed not only in a second light transmitting region TA2 but also in the first light transmitting region TA1 and the third light transmitting region TA3, red light which is second light Lb may be provided to the outside in the first light transmitting region TA1, and blue light which is first light La may be provided to the outside in the third light transmitting region TA3.

Figure 38:
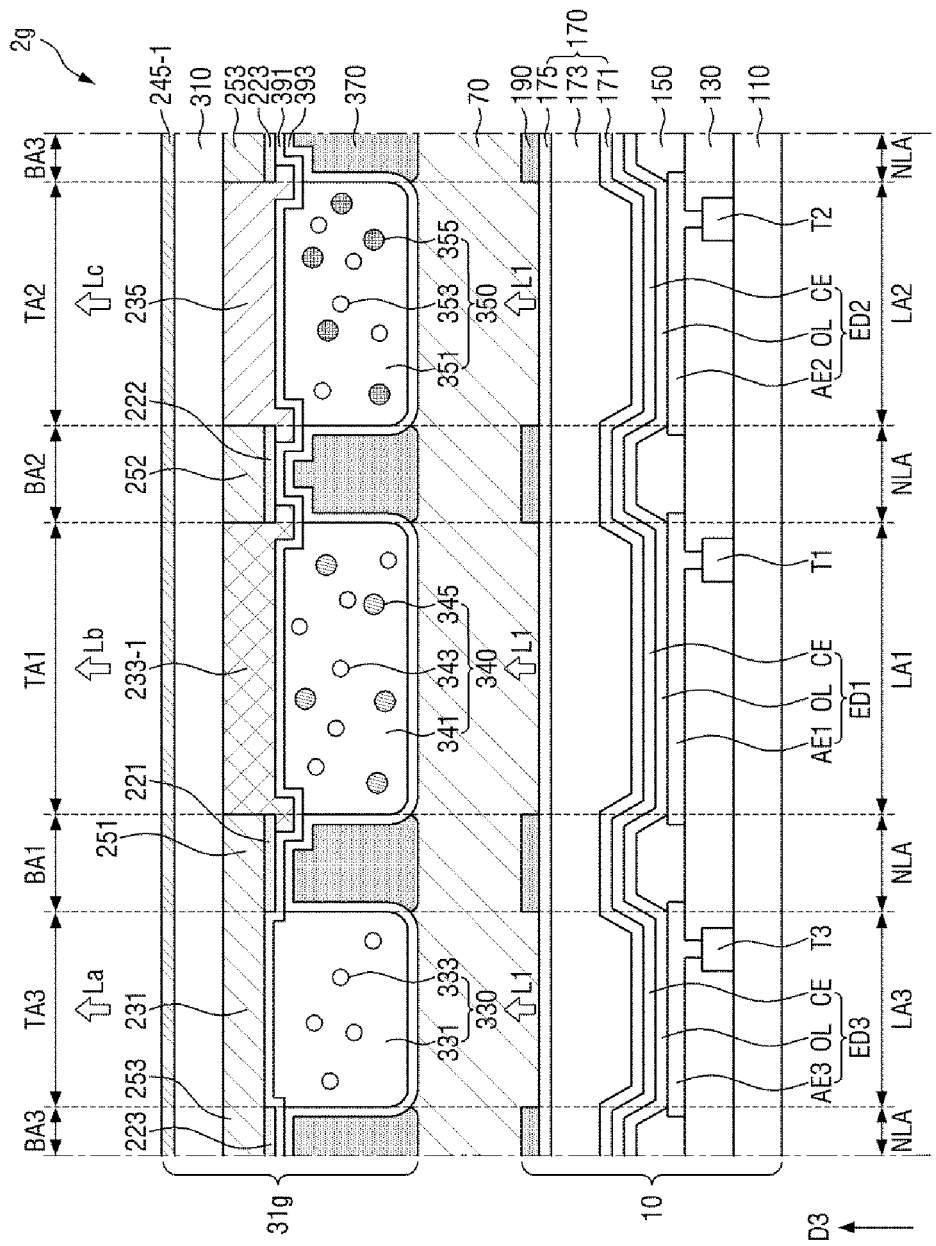

FIG. 38 is a cross-sectional view of an embodiment of a display device 2g, taken along line X1-X1' of FIGS. 3 and 4.

Referring to FIG. 38, the display device 2g in the illustrated embodiment includes a display substrate 10, a color conversion substrate 31g, and a filler 70. The display device 2g is different from the embodiment of FIG. 37 in the configuration of the color conversion substrate 31g, in particular, in that a second light absorbing layer 245-1 of the color conversion substrate 31g is disposed over the whole of the other surface of a second base 310. Here, the other surface of the second base 310 denotes a surface opposite a surface of the second base 310 on which a second color filter 235 is disposed. A description of each element of the display device 2g, in particular, a detailed description of the second light absorbing layer 245-1 is the same as the description given above in the embodiment of FIG. 37 and thus omitted.

Figure 39:
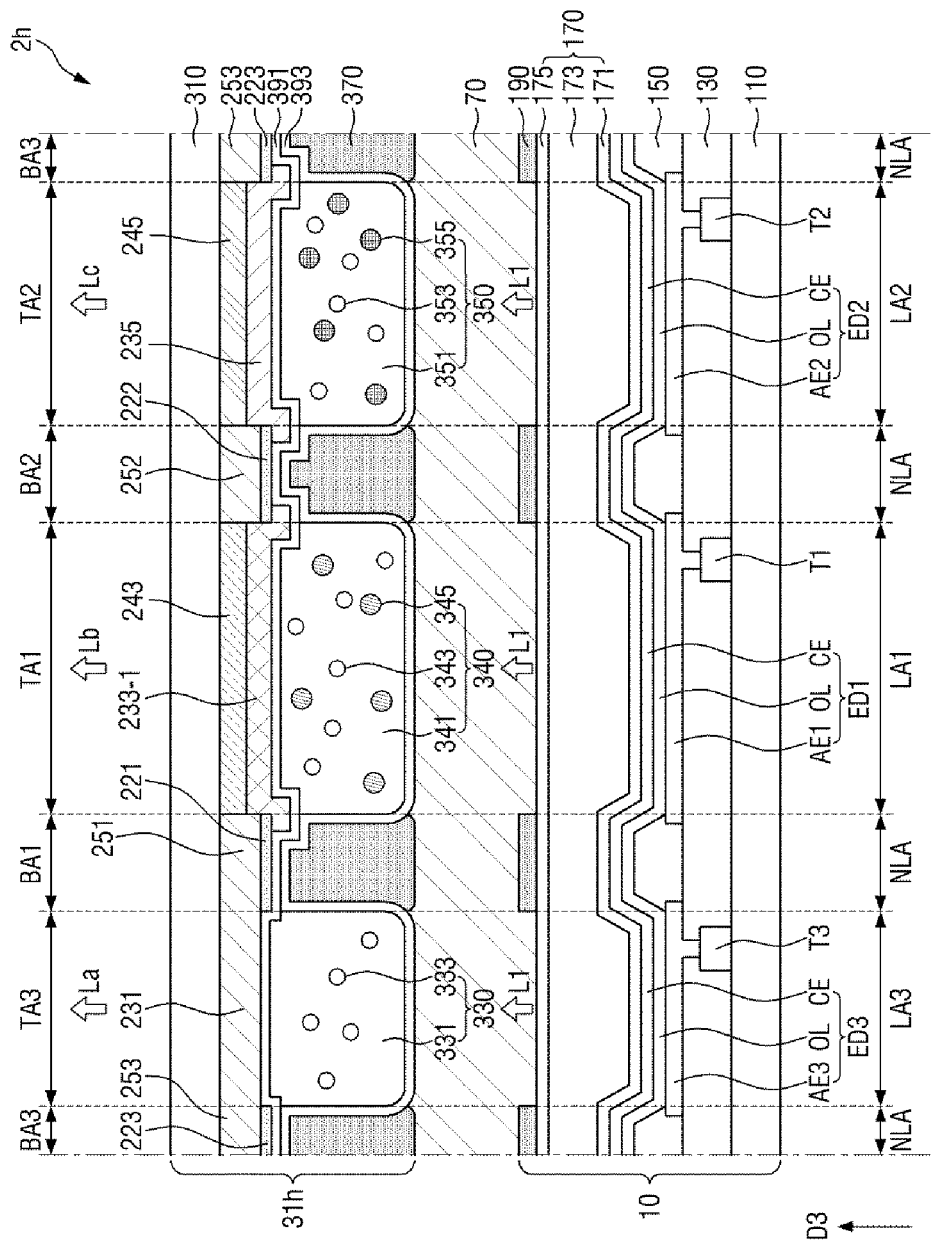

FIG. 39 is a cross-sectional view of a display device 2h, taken along line X1-X1' of FIGS. 3 and 4.

Referring to FIG. 39, the display device 2h in the illustrated embodiment includes a display substrate 10, a color conversion substrate 31h, and a filler 70. The display device 2h is substantially the same or similar to the embodiment of FIGS. 29 and 30 except for the configuration of the color conversion substrate 31h, in particular, except that the color conversion substrate 31h includes a second light absorbing layer 245 disposed between a second base 310 and a second color filter 235. In addition, the second light absorbing layer 245 is substantially the same as that described above in FIGS. 34 and 35. Therefore, a redundant description is omitted.

Figure 40:
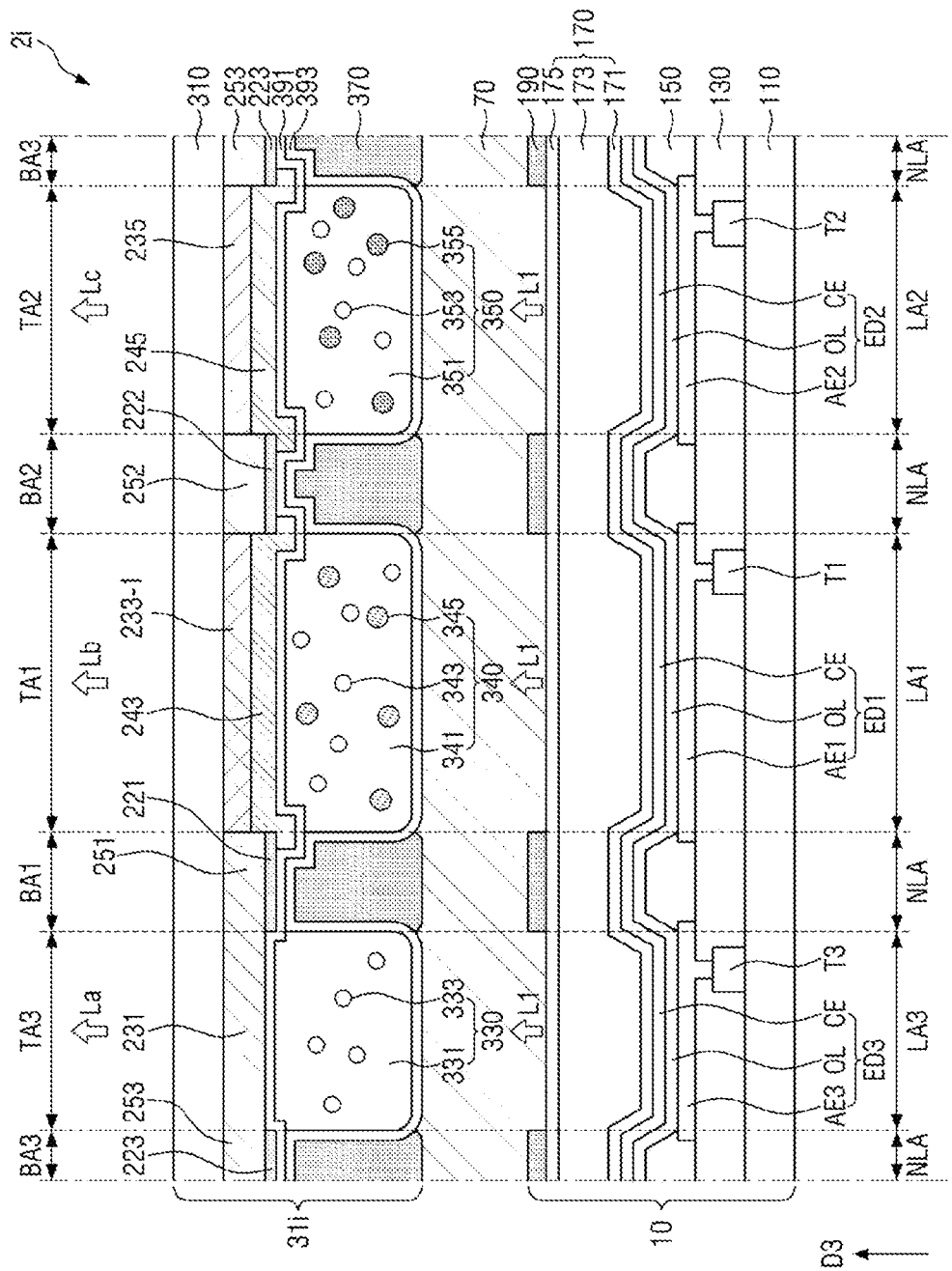

FIG. 40 is a cross-sectional view of a display device 2i in an embodiment, taken along line X1-X1' of FIGS. 3 and 4.

Referring to FIG. 40, the display device 2i in the illustrated embodiment includes a display substrate 10, a color conversion substrate 31i, and a filler 70. The display device 2i is substantially the same or similar to the embodiment of FIG. 31 except for the configuration of the color conversion substrate 31i, in particular, except that the color conversion substrate 31i further includes a second light absorbing layer 245 and that a second color filter 235 is disposed between a second base 310 and the second light absorbing layer 245. In addition, the second light absorbing layer 245 is substantially the same as that described above in FIG. 36. Therefore, a redundant description is omitted.

The display devices according to the above-described embodiments may reduce detection of reflected light due to external light, reduce color distortion, and improve display quality.

By embodiments of the invention, it is possible to provide a display device having improved display quality.

However, the effects of the embodiments are not restricted to the one set forth herein. The above and other effects of the embodiments will become more apparent to one of daily skill in the art to which the embodiments pertain by referencing the claims.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
a base which comprises a first light emitting region;
a first light emitting element which is disposed on the base, overlaps the first light emitting region, and emits light of a first color;
a first wavelength conversion pattern which is disposed on the first light emitting element, overlaps the first light emitting element, and wavelength-converts the light of the first color into light of a second color; and
a first color filter which is disposed on the first wavelength conversion pattern, overlaps the first wavelength conversion pattern, and comprises a first light absorbing colorant and a colorant of the second color,
wherein the colorant of the second color blocks transmission of the light of the first color and transmits the light of the second color,
wherein the colorant of the second color transmits light in a first overlapping wavelength range in which a first emission spectrum of the first wavelength conversion pattern overlaps a first light absorption spectrum of the first wavelength conversion pattern, and,
wherein the first light absorbing colorant absorbs the light in the first overlapping wavelength range.

2. The display device of claim 1, wherein the first light absorbing colorant absorbs light having a wavelength shorter than a first peak wavelength of the first emission spectrum, and
wherein the first light absorbing colorant transmits light having a wavelength equal to or greater than the first peak wavelength among the light having wavelengths in the first overlapping wavelength range.

3. The display device of claim 2, wherein the first light absorbing colorant transmits light having a wavelength shorter than the first overlapping wavelength range.

4. The display device of claim 2, wherein the first light absorbing colorant further absorbs light having a wavelength shorter than the first overlapping wavelength range.

5. The display device of claim 1, wherein:
the light of the first color is blue light,
the light of the second color is red light,
the colorant of the second color is a red colorant which blocks the blue light and green light and transmits the red light, and
the first light absorbing colorant absorbs yellow light.

6. The display device of claim 5, wherein the first light absorbing colorant is a magenta colorant.

7. The display device of claim 5, wherein the first light absorbing colorant absorbs light having a wavelength of about 590 nanometers to less than about 610 nanometers.

8. The display device of claim 1, wherein:
the light of the first color is blue light,
the light of the second color is green light,
the colorant of the second color is a green colorant which blocks the blue light and red light and transmits the green light, and
the first light absorbing colorant absorbs cyan light.

9. The display device of claim 8, wherein the first light absorbing colorant is a yellow colorant.

10. The display device of claim 8, wherein the first light absorbing colorant absorbs light having a wavelength of about 490 nanometers to less than about 530 nanometers.

11. The display device of claim 1, wherein the base further comprises a second light emitting region, and further comprising:
a second light emitting element which is disposed on the base, overlaps the second light emitting region, and emits the light of the first color;
a second wavelength conversion pattern which is disposed on the second light emitting element, overlaps the second light emitting element, and comprises a second wavelength shifter wavelength-converting the light of the first color into light of a third color; and a second color filter which is disposed on the second wavelength conversion pattern, overlaps the second wavelength conversion pattern, and comprises a second light absorbing colorant and a colorant of the third color, wherein the colorant of the third color blocks transmission of the light of the first color and the light of the second color, and transmits the light of the third color, wherein the colorant of the third color transmits light in a second overlapping wavelength range in which a second emission spectrum of the second wavelength conversion pattern overlaps a second light absorption spectrum of the second wavelength conversion pattern, and the second light absorbing colorant absorbs the light in the second overlapping wavelength range.

12. The display device of claim 11, wherein the second light absorbing colorant absorbs light having a wavelength shorter than a second peak wavelength of the second emission spectrum, and wherein the second light absorbing colorant transmits light having a wavelength equal to or greater than the second peak wavelength among the light in the second overlapping wavelength range.

13. The display device of claim 11, wherein:
the light of the first color is blue light,
the light of the second color is red light,
the light of the third color is green light,
the colorant of the second color is a red colorant which blocks the blue light and the green light and transmits the red light,
the colorant of the third color is a green colorant which blocks the blue light and the red light and transmits the green light,
the first light absorbing colorant absorbs yellow light, and
the second light absorbing colorant absorbs cyan light.

14. The display device of claim 13, wherein the first light absorbing colorant absorbs light in a range of about 590 nanometers to less than about 610 nanometers, and the second light absorbing colorant absorbs light in a range of about 490 nanometers to less than about 530 nanometers.

15. The display device of claim 13, wherein the first light absorbing colorant is a magenta colorant, and the second light absorbing colorant is a yellow colorant.

16. The display device of claim 11, wherein the base further comprises a third light emitting region, and further comprising:
a third light emitting element which is disposed on the base, overlaps the third light emitting region, and emits the light of the first color;
a light transmission pattern which is disposed on the third light emitting element; and
a third color filter which is disposed on the light transmission pattern,
wherein the third color filter comprises a colorant of the first color which transmits the light of the first color and blocks the light of the second color and the light of the third color.

17. A display device comprising:
a base which comprises a first light emitting region;
a first light emitting element which is disposed on the base, overlaps the first light emitting region, and emits light of a first color;
a first wavelength conversion pattern which is disposed on the first light emitting element, overlaps the first light emitting element, and comprises a first wavelength shifter wavelength-converting the light of the first color into light of a second color;

a first color filter which is disposed on the first wavelength conversion pattern, overlaps the first wavelength conversion pattern and comprises a colorant of the second color blocking transmission of the light of the first color and transmitting the light of the second color; and a first light absorbing layer which is disposed on the first wavelength conversion pattern, overlaps the first color filter, and comprises a first light absorbing colorant, wherein the colorant of the second color transmits light in a first overlapping wavelength range in which a first emission spectrum of the first wavelength conversion pattern overlaps a first light absorption spectrum of the first wavelength conversion pattern, and wherein the first light absorbing colorant absorbs the light in the first overlapping wavelength range.

18. The display device of claim 17, wherein the first light absorbing colorant absorbs light having a wavelength shorter than a first peak wavelength of the first emission spectrum, and wherein the first light absorbing colorant transmits light having a wavelength equal to or greater than the first peak wavelength among the light in the first overlapping wavelength range.

19. The display device of claim 17, wherein the first light absorbing layer is disposed between the first wavelength conversion pattern and the first color filter.

20. The display device of claim 17, wherein the first color filter is disposed between the first wavelength conversion pattern and the first light absorbing layer.

21. The display device of claim 20, wherein the base further comprises a second light emitting region, and further comprising:
a second light emitting element which is disposed on the base, overlaps the second light emitting region, and emits the light of the first color;
a second wavelength conversion pattern which is disposed on the second light emitting element, overlaps the second light emitting element, and comprises a second wavelength shifter wavelength-converting the light of the first color into light of a third color; and
a second color filter which is disposed on the second wavelength conversion pattern, overlaps the second wavelength conversion pattern and comprises a colorant of the third color,
wherein the first light absorbing layer further overlaps the second light emitting region,
wherein the second color filter is disposed between the second wavelength conversion pattern and the first light absorbing layer in the second light emitting region, and
wherein the first light absorbing colorant transmits the light of the first color and the light of the third color.

22. The display device of claim 21, wherein the base further comprises a third light emitting region, and further comprising:
a third light emitting element which is disposed on the base, overlaps the third light emitting region, and emits the light of the first color;
a light transmission pattern which is disposed on the third light emitting element; and
a third color filter which is disposed on the light transmission pattern, wherein the third color filter comprises a colorant of the first color which transmits the light of the first color and blocks the light of the second color and the light of the third color, wherein the first light absorbing layer further overlaps the third light emitting region, and wherein the third color filter is disposed between the light transmission pattern and the first light absorbing layer in the third light emitting region.

23. The display device of claim 17, wherein the base further comprises a second light emitting region, and further comprising:
- a second light emitting element which is disposed on the base, overlaps the second light emitting region, and emits the light of the first color;
- a second wavelength conversion pattern which is disposed on the second light emitting element, overlaps the second light emitting element, and comprises a second wavelength shifter wavelength-converting the light of the first color into light of a third color;
- a second color filter which is disposed on the second wavelength conversion pattern, overlaps the second wavelength conversion pattern and comprises a colorant of the third color blocking transmission of the light of the first color and the light of the second color and transmitting the light of the third color; and
- a second light absorbing layer which is disposed on the second wavelength conversion pattern, overlaps the second color filter and comprises a second light absorbing colorant, wherein the colorant of the third color transmits light in a second overlapping wavelength range in which a second emission spectrum of the second wavelength conversion pattern overlaps a second light absorption spectrum of the second wavelength conversion pattern, and wherein the second light absorbing colorant absorbs the light in the second overlapping wavelength range.

24. The display device of claim 23, wherein:
the light of the first color is blue light,
the light of the second color is red light,
the light of the third color is green light,
the colorant of the second color is a red colorant which blocks the blue light and the green light and transmits the red light,
the colorant of the third color is a green colorant which blocks the blue light and the red light and transmits the green light,
the first light absorbing colorant absorbs yellow light, and
the second light absorbing colorant absorbs cyan light.

25. The display device of claim 24, wherein the first light absorbing colorant absorbs light in a range of about 590 nanometers to less than about 610 nanometers, and
wherein the second light absorbing colorant absorbs light in a range of about 490 nanometers to less than about 530 nanometers.

26. The display device of claim 24, wherein the first light absorbing colorant is a magenta colorant, and
wherein the second light absorbing colorant is a yellow colorant.

* * * * *